(12) United States Patent
Jiang et al.

(10) Patent No.: US 10,804,446 B2
(45) Date of Patent: Oct. 13, 2020

(54) LED LIGHT BULB WITH SPECTRAL DISTRIBUTION OF NATURAL LIGHT

(71) Applicant: JIAXING SUPER LIGHTING ELECTRIC APPLIANCE CO., LTD, Jiaxing (CN)

(72) Inventors: Tao Jiang, Jiaxing (CN); Weihong Xu, Jiaxing (CN); Yukihiro Saito, Jiaxing (CN); Hayato Unagiike, Jiaxing (CN); Aiming Xiong, Jiaxing (CN); Junfeng Xu, Jiaxing (CN); Yiching Chen, Taichung (TW)

(73) Assignee: JIAXING SUPER LIGHTING ELECTRIC APPLIANCE CO., LTD, Jiaxing (CN)

(*) Notice: Subject to any disclaimer, the term of this patent is extended or adjusted under 35 U.S.C. 154(b) by 0 days.

(21) Appl. No.: 16/695,223

(22) Filed: Nov. 26, 2019

(65) Prior Publication Data
US 2020/0098955 A1    Mar. 26, 2020

Related U.S. Application Data

(63) Continuation of application No. 16/479,220, filed as application No. PCT/CN2018/123818 on Dec. 26, 2018.

(30) Foreign Application Priority Data

Dec. 26, 2017  (CN) .......................... 2017 1 1434993
Dec. 29, 2017  (CN) .......................... 2017 1 1477767
(Continued)

(51) Int. Cl.
*H01L 33/50*     (2010.01)
*H01L 25/075*    (2006.01)
(Continued)

(52) U.S. Cl.
CPC ............ *H01L 33/508* (2013.01); *F21K 9/237* (2016.08); *H01L 25/0753* (2013.01); *H01L 33/501* (2013.01); *H01L 33/62* (2013.01)

(58) Field of Classification Search
CPC ..... H01L 33/508; H01L 33/501; H01L 33/62; H01L 25/0753; F21K 9/237
See application file for complete search history.

(56) References Cited

U.S. PATENT DOCUMENTS 6,586,882 B1 ‡  7/2003  Harbers ................. H01L 25/13
                                                         313/63
7,399,429 B2     7/2008  Liu et al.
(Continued)

FOREIGN PATENT DOCUMENTS

CN         201163628 Y  ‡  12/2008
CN         201448620 U  ‡  5/2010
(Continued)

*Primary Examiner* — Joseph L Williams
(74) *Attorney, Agent, or Firm* — Simon Kuang Lu

(57) ABSTRACT

An LED light bulb, comprising: a lamp housing, a bulb base, connected with the lamp housing; a stem with a stand extending to the center of the lamp housing, disposed in the lamp housing; a single flexible LED filament, disposed in the lamp housing, a spectral distribution of the light bulb is between wavelength range of about 400 nm to 800 nm, and three peak wavelengths P1, P2, P3 are appeared in the wavelength ranges corresponding to light emitted by the light bulb, the wavelength of the peak P1 is between 430 nm and 480 nm, the wavelength of the peak P2 is between 580 nm and 620 nm, and the wavelength of the peak P3 is between 680 nm and 750 nm, wherein a light intensity of the peak P1 is less than that of the peak P2, and the light intensity of the peak P2 is less than that of the peak P3.

20 Claims, 16 Drawing Sheets

(30) Foreign Application Priority Data

| Jan. 12, 2018 | (CN) | 2018 1 0031786 |
| --- | --- | --- |
| Jan. 23, 2018 | (CN) | 2018 1 0065369 |
| Apr. 17, 2018 | (CN) | 2018 1 0343825 |
| Apr. 17, 2018 | (CN) | 2018 1 0344630 |
| May 23, 2018 | (CN) | 2018 1 0498980 |
| May 23, 2018 | (CN) | 2018 1 0501350 |
| Jun. 6, 2018 | (CN) | 2018 1 0573314 |
| Jul. 26, 2018 | (CN) | 2018 1 0836433 |
| Aug. 17, 2018 | (CN) | 2018 1 0943054 |
| Aug. 30, 2018 | (CN) | 2018 1 1005145 |
| Aug. 30, 2018 | (CN) | 2018 1 1005536 |
| Sep. 17, 2018 | (CN) | 2018 1 1079889 |
| Oct. 30, 2018 | (CN) | 2018 1 1277980 |
| Oct. 31, 2018 | (CN) | 2018 1 1285657 |
| Nov. 19, 2018 | (CN) | 2018 1 1378173 |
| Nov. 19, 2018 | (CN) | 2018 1 1378189 |
| Dec. 18, 2018 | (CN) | 2018 1 1549205 |

(51) Int. Cl.
*F21K 9/237* (2016.01)
*H01L 33/62* (2010.01)

(56) References Cited

U.S. PATENT DOCUMENTS

| 7,482,059 | B2 | 1/2009 | Peng et al. | |
| --- | --- | --- | --- | --- |
| 8,025,816 | B2 ‡ | 9/2011 | Murase | C03C 14/00 252/30 |
| 8,455,895 | B2 ‡ | 6/2013 | Chai | H01L 25/0753 257/98 |
| 8,933,619 | B1 ‡ | 1/2015 | Ou | F21K 9/232 313/31 |
| 9,016,900 | B2 ‡ | 4/2015 | Takeuchi | F21K 9/232 362/24 |
| 9,360,188 | B2 ‡ | 6/2016 | Kircher | F21K 9/64 |
| 9,488,767 | B2 ‡ | 11/2016 | Nava | F21K 9/232 |
| 9,761,765 | B2 ‡ | 9/2017 | Basin | H01L 24/97 |
| 9,982,854 | B2 ‡ | 5/2018 | Ma | H01L 25/075 |
| 10,066,791 | B2 ‡ | 9/2018 | Zhang | H01L 33/62 |
| 10,330,297 | B2 ‡ | 6/2019 | Kwisthout | F21K 9/238 |
| 2004/0008525 | A1 ‡ | 1/2004 | Shibata | F21K 9/232 313/27 |
| 2007/0267976 | A1 ‡ | 11/2007 | Bohler | F21K 9/23 315/11 |
| 2008/0137360 | A1 ‡ | 6/2008 | Van Jijswick | F21K 9/232 362/55 |
| 2009/0184618 | A1 ‡ | 7/2009 | Hakata | F21K 9/232 313/1 |
| 2010/0135009 | A1 ‡ | 6/2010 | Duncan | F21V 3/04 362/23 |
| 2011/0025205 | A1 ‡ | 2/2011 | Van Rijswick | G02B 6/001 315/32 |
| 2011/0050073 | A1 ‡ | 3/2011 | Huang | F21V 29/70 313/46 |
| 2012/0119647 | A1 | 5/2012 | Hsu | |
| 2012/0162965 | A1 | 6/2012 | Takeuchi et al. | |
| 2012/0175667 | A1 ‡ | 7/2012 | Golle | H01L 33/20 257/99 |
| 2012/0256238 | A1 ‡ | 10/2012 | Ning | H01L 29/808 257/28 |
| 2012/0281411 | A1 ‡ | 11/2012 | Kajiya | H05K 1/028 362/24 |
| 2013/0003346 | A1 | 1/2013 | Letoquin et al. | |
| 2013/0058080 | A1 ‡ | 3/2013 | Ge | F21V 3/00 362/23 |
| 2013/0058580 | A1 ‡ | 3/2013 | Wakazono | G06T 11/00 382/20 |
| 2013/0099271 | A1 ‡ | 4/2013 | Hakata | F21K 9/232 257/98 |
| 2013/0147348 | A1 ‡ | 6/2013 | Motoya | H05B 33/12 313/51 |
| 2013/0215625 | A1 ‡ | 8/2013 | Takeuchi | F21K 9/232 362/36 |
| 2013/0235592 | A1 ‡ | 9/2013 | Takeuchi | F21V 23/001 362/36 |
| 2013/0265796 | A1 ‡ | 10/2013 | Kwisthout | F21K 9/61 362/55 |
| 2013/0293098 | A1 ‡ | 11/2013 | Li | F21V 5/043 313/51 |
| 2014/0022788 | A1 ‡ | 1/2014 | Dan | F21V 3/02 362/24 |
| 2014/0152177 | A1 ‡ | 6/2014 | Matsuda | F21K 9/232 315/32 |
| 2014/0185269 | A1 | 7/2014 | Li | |
| 2014/0218892 | A1 | 8/2014 | Edwards et al. | |
| 2014/0268779 | A1 | 9/2014 | Sorensen et al. | |
| 2014/0369036 | A1 ‡ | 12/2014 | Feng | F21K 9/23 362/22 |
| 2015/0022114 | A1 | 1/2015 | Kim | |
| 2015/0069442 | A1 ‡ | 3/2015 | Liu | H01L 33/504 257/98 |
| 2015/0070871 | A1 ‡ | 3/2015 | Chen | F21K 9/27 362/84 |
| 2015/0211723 | A1 ‡ | 7/2015 | Athalye | F21V 29/77 362/29 |
| 2015/0255440 | A1 ‡ | 9/2015 | Hsieh | H01L 25/0753 257/88 |
| 2016/0238199 | A1 ‡ | 8/2016 | Yeung | G09F 23/00 |
| 2016/0369952 | A1 ‡ | 12/2016 | Weekamp | F21V 9/32 |
| 2016/0377237 | A1 ‡ | 12/2016 | Zhang | H01L 33/62 362/31 |
| 2017/0012177 | A1 ‡ | 1/2017 | Trottier | F21K 9/00 |
| 2017/0016582 | A1 ‡ | 1/2017 | Yang | F21K 9/232 |
| 2017/0122499 | A1 ‡ | 5/2017 | Lin | F21V 23/003 |
| 2017/0138542 | A1 ‡ | 5/2017 | Gielen | F21V 17/10 |
| 2017/0167663 | A1 ‡ | 6/2017 | Hsiao | F21K 9/237 |
| 2017/0167711 | A1 ‡ | 6/2017 | Kadijk | F21K 9/90 |
| 2017/0299125 | A1 ‡ | 10/2017 | Takeuchi | F21K 9/66 |
| 2017/0299126 | A1 ‡ | 10/2017 | Takeuchi | F21V 19/005 |
| 2019/0137047 | A1 | 5/2019 | Hu | |
| 2019/0219232 | A1 ‡ | 7/2019 | Takeuchi | F21K 9/238 |
| 2019/0277484 | A1 | 9/2019 | Kwisthout | |

FOREIGN PATENT DOCUMENTS

| CN | 101826588 | A ‡ | 9/2010 | F21V 19/04 |
| --- | --- | --- | --- | --- |
| CN | 102121576 | A ‡ | 7/2011 | |
| CN | 102209625 | A ‡ | 10/2011 | B32B 27/20 |
| CN | 202209551 | U | 5/2012 | |
| CN | 202209551 | U ‡ | 5/2012 | |
| CN | 202252991 | U ‡ | 5/2012 | F21K 9/232 |
| CN | 202253168 | U ‡ | 5/2012 | |
| CN | 102751274 | A ‡ | 10/2012 | H01L 33/50 |
| CN | 202473919 | U ‡ | 10/2012 | |
| CN | 202719450 | U | 2/2013 | |
| CN | 202719450 | U ‡ | 2/2013 | |
| CN | 101968181 | B ‡ | 3/2013 | F21K 9/233 |
| CN | 101968181 | B | 3/2013 | |
| CN | 102958984 | A ‡ | 3/2013 | B32B 17/04 |
| CN | 102969320 | A ‡ | 3/2013 | H01L 27/1218 |
| CN | 202834823 | U | 3/2013 | |
| CN | 202834823 | U ‡ | 3/2013 | |
| CN | 103123949 | A | 5/2013 | |
| CN | 103123949 | A ‡ | 5/2013 | |
| CN | 203367275 | U ‡ | 12/2013 | |
| CN | 203367275 | U | 12/2013 | |
| CN | 203367375 | U ‡ | 12/2013 | |
| CN | 103560128 | A | 2/2014 | |
| CN | 103560128 | A ‡ | 2/2014 | |
| CN | 103682042 | A | 3/2014 | |
| CN | 103682042 | A ‡ | 3/2014 | |
| CN | 203477967 | U ‡ | 3/2014 | |
| CN | 203477967 | U | 3/2014 | |
| CN | 103890481 | A ‡ | 6/2014 | H01L 33/62 |
| CN | 103890481 | A | 6/2014 | |
| CN | 203628311 | U | 6/2014 | |
| CN | 203628391 | U ‡ | 6/2014 | F21K 9/232 |

(56) References Cited

FOREIGN PATENT DOCUMENTS

| | | | | |
|---|---|---|---|---|
| CN | 203628391 U | | 6/2014 | |
| CN | 203628400 U | | 6/2014 | |
| CN | 203628400 U | ‡ | 6/2014 | |
| CN | 203656627 U | ‡ | 6/2014 | ............. F21K 9/90 |
| CN | 203656627 U | | 6/2014 | |
| CN | 203671312 U | ‡ | 6/2014 | |
| CN | 103939758 A | ‡ | 7/2014 | ............. F21K 9/232 |
| CN | 103939758 A | | 7/2014 | |
| CN | 103956421 A | ‡ | 7/2014 | |
| CN | 103972364 A | ‡ | 8/2014 | |
| CN | 103994349 A | ‡ | 8/2014 | |
| CN | 203771136 U | | 8/2014 | |
| CN | 203771136 U | ‡ | 8/2014 | |
| CN | 203857313 U | ‡ | 10/2014 | |
| CN | 203857313 U | | 10/2014 | |
| CN | 203880468 U | ‡ | 10/2014 | |
| CN | 203907265 U | ‡ | 10/2014 | ............. F21K 9/232 |
| CN | 203910792 U | | 10/2014 | |
| CN | 203910792 U | ‡ | 10/2014 | |
| CN | 203932049 U | ‡ | 11/2014 | |
| CN | 203932049 U | | 11/2014 | |
| CN | 204062539 U | | 12/2014 | |
| CN | 204062539 U | ‡ | 12/2014 | |
| CN | 104295945 A | ‡ | 1/2015 | ............. F21K 9/232 |
| CN | 104295945 A | | 1/2015 | |
| CN | 104319345 A | ‡ | 1/2015 | |
| CN | 104319345 A | | 1/2015 | |
| CN | 204083941 U | ‡ | 1/2015 | |
| CN | 204083941 U | | 1/2015 | |
| CN | 204088366 U | ‡ | 1/2015 | |
| CN | 204153513 U | ‡ | 2/2015 | |
| CN | 204153513 U | | 2/2015 | |
| CN | 104456165 A | ‡ | 3/2015 | |
| CN | 104456165 A | | 3/2015 | |
| CN | 204289439 U | | 4/2015 | |
| CN | 204289439 U | ‡ | 4/2015 | |
| CN | 104600174 A | ‡ | 5/2015 | |
| CN | 104600174 A | | 5/2015 | |
| CN | 104600181 A | ‡ | 5/2015 | |
| CN | 204328550 U | ‡ | 5/2015 | |
| CN | 104716247 A | | 6/2015 | |
| CN | 104716247 A | ‡ | 6/2015 | ............. H01L 33/486 |
| CN | 204387765 U | ‡ | 6/2015 | |
| CN | 104913217 A | | 9/2015 | |
| CN | 104913217 A | ‡ | 9/2015 | ............. F21K 9/232 |
| CN | 104979455 A | | 10/2015 | |
| CN | 104979455 A | ‡ | 10/2015 | |
| CN | 105042354 A | ‡ | 11/2015 | |
| CN | 105090789 A | ‡ | 11/2015 | |
| CN | 105090789 A | | 11/2015 | |
| CN | 105098032 A | ‡ | 11/2015 | ............. F21K 9/232 |
| CN | 105098032 A | | 11/2015 | |
| CN | 105140381 A | ‡ | 12/2015 | |
| CN | 105140381 A | | 12/2015 | |
| CN | 105161608 A | ‡ | 12/2015 | |
| CN | 204986570 U | | 1/2016 | |
| CN | 204986570 U | ‡ | 1/2016 | |
| CN | 105371243 A | ‡ | 3/2016 | |
| CN | 205081145 U | ‡ | 3/2016 | |
| CN | 105609621 A | ‡ | 5/2016 | |
| CN | 106468405 A | | 3/2017 | |
| CN | 106468405 A | ‡ | 3/2017 | ............. F21K 9/232 |
| CN | 106898681 A | | 6/2017 | |
| CN | 106898681 A | ‡ | 6/2017 | ............. F21K 9/232 |
| CN | 107123641 A | ‡ | 9/2017 | ......... H01L 25/0753 |
| CN | 107123641 A | | 9/2017 | |
| CN | 107170733 A | ‡ | 9/2017 | ......... H01L 25/0753 |
| CN | 206563190 U | ‡ | 10/2017 | ......... H01L 25/0753 |
| CN | 107314258 A | ‡ | 11/2017 | |
| CN | 107314258 A | | 11/2017 | |
| CN | 206973307 U | | 2/2018 | |
| CN | 206973307 U | ‡ | 2/2018 | |
| CN | 207034659 U | ‡ | 2/2018 | ............. F21K 9/232 |
| CN | 108039402 A | ‡ | 5/2018 | |
| CN | 105090782 B | | 7/2018 | |
| CN | 105090782 B | ‡ | 7/2018 | ............. F21K 9/232 |
| CN | 207849021 U | ‡ | 9/2018 | |
| CN | 207849021 U | | 9/2018 | |
| CN | 209354987 U | ‡ | 9/2019 | |
| EP | 2535640 A1 | ‡ | 12/2012 | ........... F21V 19/0035 |
| EP | 2535640 A1 | | 12/2012 | |
| EP | 2760057 A1 | ‡ | 7/2014 | ......... H01L 25/0753 |
| EP | 2567145 B1 | ‡ | 4/2016 | ......... H01L 25/0753 |
| EP | 2567145 B1 | | 4/2016 | |
| GB | 2547085 A | ‡ | 8/2017 | ............. F21K 9/232 |
| GB | 2547085 A | | 8/2017 | |
| JP | 3075689 U | ‡ | 2/2001 | ............. F21K 9/232 |
| JP | 2001126510 A | ‡ | 5/2001 | ............ F21V 19/003 |
| JP | 2001126510 A | | 5/2001 | |
| JP | 2003037239 A | ‡ | 2/2003 | ............. H01L 24/97 |
| JP | 2003037239 A | | 2/2003 | |
| JP | 2006202500 A | ‡ | 8/2006 | |
| JP | 2013225587 A | ‡ | 10/2013 | ............. F21K 9/232 |
| WO | WO-2012053134 A1 | ‡ | 4/2012 | ......... H01L 25/0753 |
| WO | WO-2014012346 A1 | ‡ | 1/2014 | ............. H01L 33/50 |
| WO | 2014167458 A1 | | 10/2014 | |
| WO | WO-2014167458 A1 | ‡ | 10/2014 | ........... H01L 33/644 |
| WO | 2017037010 A1 | | 3/2017 | |
| WO | WO-2017037010 A1 | ‡ | 3/2017 | ......... H01L 25/0753 |

‡ imported from a related application

LED LIGHT BULB WITH SPECTRAL DISTRIBUTION OF NATURAL LIGHT

CROSS-REFERENCE TO RELATED APPLICATIONS

This application is a continuation application of U.S. application Ser. No. 16/479,220 filed on Jul. 19, 2019 which claims priority to Chinese Patent Applications No. 201711434993.3 filed on Dec. 26, 2017; No. 201711477767.3 filed on Dec. 29, 2017; No. 201810031786.1 filed on Jan. 12, 2018; No. 201810065369.9 filed on Jan. 23, 2018; No. 201810343825.1 filed on Apr. 17, 2018; No. 201810344630.9 filed on Apr. 17, 2018; No. 201810501350.4 filed on May 23, 2018; No. 201810498980.0 filed on May 23, 2018; No. 201810573314.9 filed on Jun. 6, 2018; No. 201810836433.9 filed on Jul. 26, 2018; No. 201810943054.X filed on Aug. 17, 2018; No. 201811005536.7 filed on Aug. 30, 2018; No. 201811005145.5 filed on Aug. 30, 2018; No. 201811079889.1 filed on Sep. 17, 2018; No. 201811277980.4 filed on Oct. 30, 2018; No. 201811285657.1 filed on Oct. 31, 2018; No. 201811378173.1 filed on Nov. 19, 2018; No. 201811378189.2 filed on Nov. 19, 2018; No. 201811549205.X filed on Dec. 18, 2018, each of which is hereby incorporated by reference in its entirety.

TECHNICAL FIELD

The present disclosure relates to a lighting field, and more particularly to an LED light bulb with spectral distribution of natural light.

RELATED ART

Incandescent bulbs have been widely used for homes or commercial lighting for decades. However, incandescent bulbs are generally with lower efficiency in terms of energy application, and about 90% of energy input can be converted into a heat form to dissipate. In addition, because the incandescent bulb has a very limited lifespan (about 1,000 hours), it needs to be frequently replaced. These traditional incandescent bulbs are gradually replaced by other more efficient lighting devices, such as fluorescent lights, high-intensity discharge lamps, light-emitting diodes (LEDs) lights and the like. In these electric lamps, the LED light lamp attracts widespread attention in its lighting technology. The LED light lamp has the advantages of long lifespan, small in size, environmental protection and the like, therefore the application of the LED light lamp continuously grows.

In recent years, LED light bulbs with LED filaments have been provided on the market. At present, LED light bulbs using LED filaments as illumination sources still have the following problems to be improved.

Firstly, an LED hard filament is provided with a substrate (for example, a glass substrate) and a plurality of LED chips disposed on the substrate. However, the illumination appearance of the LED light bulbs relies on multiple combinations of the LED hard filaments to produce the better illumination appearances. The illumination appearance of the single LED hard filament cannot meet the general needs in the market. A traditional incandescent light bulb is provided with a tungsten filament, the uniform light emitting can be generated due to the natural bendable property of the tungsten filament. In contrast, the LED hard filament is difficult to achieve such uniform illumination appearances. There are many reasons why LED hard filaments are difficult to achieve the uniform illumination appearance. In addition to the aforementioned lower bendable property, one of the reasons is that the substrate blocks the light emitted by the LED chip, and furthermore the light generated by the LED chip is displayed similar to a point light source which causes the light showing concentrated illumination and with poor illumination uniformity. In other words, a uniform distribution of the light emitted from LED chip produces a uniform illumination appearance of the LED filament. On the other hand, the light ray distribution similar to a point light source may results in uneven and concentrated illumination.

Secondly, there is one kind of LED soft filament, which is similar to the structure of the above-mentioned LED hard filament and is employed a flexible printed circuit substrate (hereinafter referred to FPC) instead of the glass substrate to enable the LED filament having a certain degree of bending. However, by utilizing the LED soft filament made of the FPC, the FPC has a thermal expansion coefficient different from that of the silicon gel coated covering the LED soft filament, and the long-term use causes the displacement or even degumming of the LED chips. Moreover, the FPC may not beneficial to flexible adjustment of the process conditions and the like. Besides, during bending the LED soft filament it has a challenge in the stability of the metal wire bonded between LED chips. When the arrangement of the LED chips in the LED soft filament is dense, if the adjacent LED chips are connected by means of metal wire bonding, it is easy to cause the stress to be concentrated on a specific part of the LED soft filament when the LED soft filament is bent, thereby the metal wire bonding between the LED chips are damaged and even broken.

In addition, the LED filament is generally disposed inside the LED light bulb, and in order to present the aesthetic appearance and also to make the illumination of the LED filament more uniform and widespread, the LED filament is bent to exhibit a plurality of curves. Since the LED chips are arranged in the LED filaments, and the LED chips are relatively hard objects, it is difficult for the LED filaments to be bent into a desired shape. Moreover, the LED filament is also prone to cracks due to stress concentration during bending.

In order to increase the aesthetic appearance and make the illumination appearance more uniform, an LED light bulb has a plurality of LED filaments, which are disposed with different placement or angles. However, since the plurality of LED filaments need to be installed in a single LED light bulb, and these LED filaments need to be fixed individually, the assembly process will be more complicated and the production cost will be increased.

Patent No. CN202252991U discloses the light lamp employing with a flexible PCB board instead of the aluminum heat dissipation component to improve heat dissipation. Wherein, the phosphor is coated on the upper and lower sides of the LED chip or on the periphery thereof, and the LED chip is fixed on the flexible PCB board and sealed by an insulating adhesive. The insulating adhesive is epoxy resin, and the electrodes of the LED chip are connected to the circuitry on the flexible PCB board by gold wires. The flexible PCB board is transparent or translucent, and the flexible PCB board is made by printing the circuitry on a polyimide or polyester film substrate. Patent No. CN105161608A discloses an LED filament light-emitting strip and a preparation method thereof. Wherein the LED chips are disposed without overlapped, and the light-emitting surfaces of the LED chips are correspondingly arranged, so that the light emitting uniformity and heat dissipation is improved accordingly. Patent No. CN103939758A discloses that a transparent and thermally conductive heat dissipation layer is formed between the interface of the carrier and the LED chip for heat exchange with the LED chip. According to the aforementioned patents, which respectively use a PCB board, adjust the chips arrangement or form a heat dissipation layer, the heat dissipation of the filament of the lamp can be improved to a certain extent correspondingly; however, the heat is easy to accumulate due to the low efficiency in heat dissipation. The last one, Publication No. CN204289439U discloses an LED filament with omnidirectional light comprising a substrate mixed with phosphors, at least one electrode disposed on the substrate, at least one LED chip mounted on the substrate, and the encapsulant coated on the LED chip. The substrate formed by the silicone resin contained with phosphors eliminates the cost of glass or sapphire as a substrate, and the LED filament equipping with this kind of substrate avoids the influence of glass or sapphire on the light emitting of the LED chip. The 360-degree light emitting is realized, and the illumination uniformity and the light efficiency are greatly improved. However, due to the fact that the substrate is formed by silicon resin, the defect of poor heat resistance is a disadvantage.

SUMMARY

It is noted that the present disclosure includes one or more inventive solutions currently claimed or not claimed, and in order to avoid confusion between the illustration of these embodiments in the specification, a number of possible inventive aspects herein may be collectively referred to as "present/the invention."

A number of embodiments are described herein with respect to "the invention." However, the word "the invention" is used merely to describe certain embodiments disclosed in this specification, whether or not in the claims, is not a complete description of all possible embodiments. Some embodiments of various features or aspects described below as "the invention" may be combined in various ways to form an LED light bulb or a portion thereof.

In accordance with another embodiment of the present invention, an LED filament comprises at least one LED section, a conductive section, at least two conductive electrodes and a light conversion layer. The conductive section is located between two adjacent LED sections. The two conductive electrodes are disposed on the LED filament correspondingly and electrically connected to each of the LED sections. The adjacent two LED sections are electrically connected to each other through the conductive section. Each of the LED sections includes at least two LED chips, and the LED chips are electrically connected to each other by at least one wire. The light conversion layer covers the LED sections, the conductive sections and the conductive electrodes, and a part of each of the two electrodes is exposed respectively.

In accordance with an embodiment of the present invention, the conductive section includes a conductor connecting with the LED section, and the length of the wire connecting between the LED chips is less than the length of the conductor.

In accordance with an embodiment of the present invention, the light conversion layer includes at least one top layer and one base layer.

In accordance with another embodiment of the present invention, an LED filament comprises at least one LED section, a conductive section, at least two conductive electrodes and a light conversion layer. The conductive section is located between two adjacent LED sections. The two conductive electrodes are electrically connected to the LED sections. The adjacent two LED sections are electrically connected to each other through the conductive section. Each of the conductive sections is electrically connected to the LED section by at least one wire.

In accordance with an embodiment of the present invention, each of the LED sections includes at least two LED chips, and the LED chips are electrically connected to each other by the wire.

In accordance with an embodiment of the present invention, an LED filament comprises a plurality of LED chip units, a plurality of conductors, and at least two conductive electrodes. Wherein each of the conductors is located between two adjacent LED chip units, the LED chip units are disposed at different heights, and the conductive electrodes are disposed corresponding to the LED chip units configuration and electrically connected to the LED chip unit by the wire. The adjacent two LED chip units are electrically connected to each other through a conductor, and the angle between the conductor and the extending direction of length of the LED filament is in a range of about 30° to 120°.

In accordance with another embodiment of the present invention provides a composition which is suitable for use as a filament substrate or a light conversion layer, wherein the composition comprises at least a main material, a modifier and an additive. The main material is an organosilicon-modified polyimide; the modifier is a thermal curing agent; and the additives comprise microparticles added into the main material, which may comprise phosphor particles, heat dispersing particles. The additive also comprises a coupling agent.

The present disclosure provides a composition which is suitable for use as a filament substrate or a light-conversion layer, wherein the main material in the composition is an organosilicon-modified polyimide, i.e. a polyimide comprising a siloxane moiety, wherein the organosilicon-modified polyimide comprises a repeating unit represented by general Formula (I):

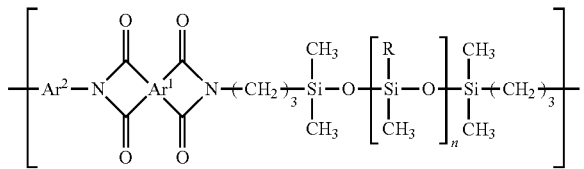

Formula (I)

In general Formula (I), $Ar^1$ is a tetra-valent organic group having a benzene ring or an alicyclic hydrocarbon structure, $Ar^2$ is a di-valent organic group, R is each independently methyl or phenyl, and n is 1~5.

According to an embodiment of the present disclosure, $Ar^1$ is a tetra-valent organic group having a monocyclic alicyclic hydrocarbon structure or a bridged-ring alicyclic hydrocarbon structure.

According to another embodiment of the present disclosure, $Ar^2$ is a di-valent organic group having a monocyclic alicyclic hydrocarbon structure.

It is another object of the claimed invention to provide an LED light bulb, an LED light bulb includes a lamp housing, a lamp cap, two conductive brackets, a stem, and an LED filament. The lamp cap is electrically connected to the lamp housing, the two conductive brackets are disposed in the lamp housing, the stem extends from the lamp cap into the lamp housing, and the LED filament comprises a plurality of LED chips and two conductive electrodes. The LED chips are arranged in an array along the extending direction of the LED filaments, and the two conductive electrodes are respectively disposed at two ends of the LED filament and electrically connected to the LED chips, and the two conductive electrodes are respectively electrically connected to two conductive brackets. Wherein the LED filament is curled to satisfy symmetry characteristics in which: while a top view of the LED light bulb is presented in two dimensional coordinate system defining four quadrants with a X-axis crossing the stem, an Y-axis crossing the stem, and an origin, a brightness presented by a portion of the LED filament in the first quadrant in the top view is symmetric to a brightness presented by a portion of the LED filament in the second quadrant in the top view with respect to the Y-axis and/or is symmetric to a brightness presented by a portion of the LED filament in the third quadrant in the top view with respect to the origin; and while a side view of the LED light bulb is presented in two dimensional coordinate system defining four quadrants with a Y'-axis aligned with the stem, an X'-axis crossing the Y'-axis, and an origin, a brightness presented by a portion of the LED filament in the first quadrant in the side view is symmetric to a brightness presented by a portion of the LED filament in the second quadrant in the side view with respect to the Y'-axis.

In accordance with an embodiment of the present invention, an LED light bulb includes a lamp housing, a lamp caps, two conductive brackets, a stem and an LED filament. Wherein, the lamp cap is electrically connected to the lamp housing, the two conductive brackets are disposed in the lamp housing, and the stem extends from the lamp cap into the lamp housing. Moreover, the LED filament comprises a plurality of LED chips and two conductive electrodes. The LED chips are arranged in an array along the extending direction of the LED filaments, and the two conductive electrodes are respectively disposed at two ends of the LED filament and connected to the LED chips, and the two conductive electrodes are respectively connected two conductive brackets. Wherein the LED filament is curled to satisfy symmetry while a top view of the LED light bulb is presented in two dimensional coordinate system defining four quadrants with a X-axis crossing the stem, an Y-axis crossing the stem, and an origin, a structure of a portion of the LED filament in the first quadrant in the top view is symmetric to a structure of a portion of the LED filament in the second quadrant in the top view with respect to the Y-axis and/or is symmetric to a structure of a portion of the LED filament in the third quadrant in the top view with respect to the origin; and while a side view of the LED light bulb is presented in two dimensional coordinate system defining four quadrants with a Y'-axis aligned with the stem, an X'-axis crossing the Y'-axis, and an origin, a structure of a portion of the LED filament in the first quadrant in the side view is symmetric to a structure of a portion of the LED filament in the second quadrant in the side view with respect to the Y'-axis.

In accordance with an embodiment of the present invention, an LED light bulb includes a lamp housing, a lamp caps, two conductive brackets, stems and LED filaments. Wherein the lamp cap is electrically connected to the lamp housing, the two conductive brackets are disposed in the lamp housing, and the stem extends from the lamp cap into the lamp housing. Moreover, the LED filament comprises a plurality of LED chips and two conductive electrodes. The LED chips are arranged in an array along the extending direction of the LED filaments, and the two conductive electrodes are respectively disposed at two ends of the LED filament and connected to the LED chips, and the two conductive electrodes are respectively connected two conductive brackets. Wherein the LED filament is curled to satisfy symmetry while a top view of the LED light bulb is presented in two dimensional coordinate system defining four quadrants with a X-axis crossing the stem, an Y-axis crossing the stem, and an origin, a length of a portion of the LED filament in the first quadrant in the top view is substantially equal to that of a portion of the LED filament in the second quadrant in the top view and/or is substantially equal to that of a portion of the LED filament in the third quadrant in the top view; and while a side view of the LED light bulb is presented in two dimensional coordinate system defining four quadrants with a Y'-axis aligned with the stem, an X'-axis crossing the Y'-axis, and an origin, a length of a portion of the LED filament in the first quadrant in the side view is substantially equal to that of a portion of the LED filament in the second quadrant in the side view.

In accordance with an embodiment of the present invention, a perspective diagram of the light emission spectrum of an LED light bulb is provided. The LED light bulb may be any LED light bulb disclosed in the previous embodiments, the spectral distribution of the LED light bulb is mainly between the wavelength range of about 400 nm to 800 nm. Moreover, there are three peak wavelengths P1, P2, P3 in wavelength ranges corresponding to the light emitted by the LED light bulb. The wavelength of the peak value P1 is between about 430 nm and 480 nm, the wavelength of the peak value P2 is between about 580 nm and 620 nm, and the wavelength of the peak value peak P3 is between about 680 nm and 750 nm. The light intensity of the peak P1 is less than that of the peak P2, and the light intensity of the peak P2 is less than the light intensity of the peak P3.

To make the above and other objects, features, and advantages of the present invention clearer and easier to understand, the following embodiments will be described in detail with reference to the accompanying drawings.

BRIEF DESCRIPTION OF THE DRAWINGS

The present invention will become more readily apparent to those ordinarily skilled in the art after reviewing the following detailed description and accompanying drawings, in which.

DETAILED DESCRIPTION

Figure 1:
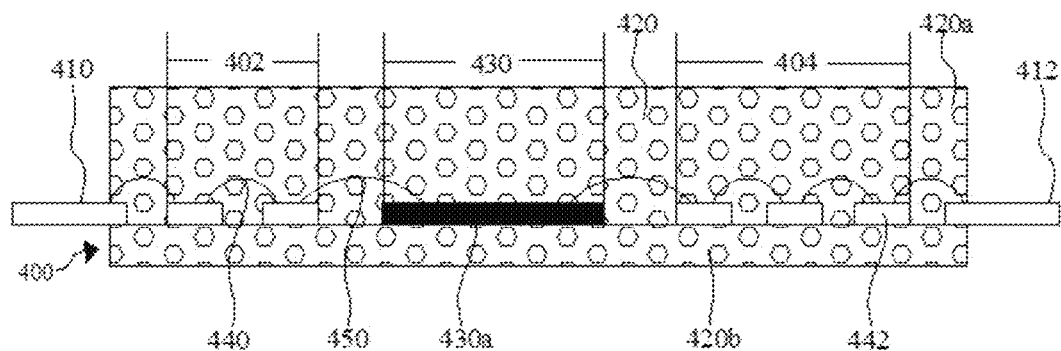
FIG. 1 is a cross sectional view of an LED filament in accordance with an embodiment of the present invention.

The present disclosure provides a novel LED filament and its application the LED light bulb. The present disclosure will now be described in the following embodiments with reference to the drawings. The following descriptions of various implementations are presented herein for purpose of illustration and giving examples only. This invention is not intended to be exhaustive or to be limited to the precise form disclosed. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of components may be exaggerated for clarity. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers, or steps, these elements, components, regions, layers, and/or steps should not be limited by these terms. Unless the context indicates otherwise, these terms are only used to distinguish one element, component, region, layer, or step from another element, component, region, or step, for example as a naming convention. Thus, a first element, component, region, layer, or step discussed below in one section of the specification could be termed a second element, component, region, layer, or step in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled," or "immediately connected" or "immediately coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to a direct connection (i.e., touching) unless the context indicates otherwise.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, position, shapes, sizes, amounts, or other measures do not necessarily mean an exactly identical orientation, layout, location, position, shape, size, amount, or other measure, but are intended to encompass nearly identical orientation, layout, location, position, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

The LED chip units 102, 104, or named with the LED section 102, 104, may be composed of a single LED chip, or two LED chips. Of course, it may also include multiple LED chips, that is, equal to or greater than three LED chips.

The connection mode between the conductor in the conductive section and the light conversion layer is described as follows. Referring to FIG. 1, in the LED filament structure shown in FIG. 1, the LED filament 400 has a light conversion layer 420, the LED sections 402, 404, the conductive electrodes 410, 412, and at least one conductive section 430. The conductive section 430 is located between adjacent LED sections 402 and 404. The LED sections 402 and 404 include at least two LED chips 442 electrically connected to each other through the wires 440. In the present embodiment, the conductive section 430 includes a conductor 430a. The conductive section 430 and the LED sections 402, 404 are electrically connected by wires 450, that is, two LED chips respectively located in the adjacent two LED sections 402, 404 and closest to the conductive section 430 are electrically connected to each other through the wires 450 connecting with the conductor 430a in the conductive section 430. The length of the conductive section 430 is greater than the distance between two adjacent LED chips in one single LED sections 402, 404, and the length of the wire 440 is less than the length of the conductor 430a. The light conversion layer 420 is disposed on at least one side of the LED chip 442 and the conductive electrode 410, 412, and a part of the two conductive electrodes is exposed from the light conversion layer. The light conversion layer 420 includes at least a top layer 420a and a base layer 420b. In the present embodiment, the LED sections 402, 404, the conductive electrodes 410, 412, and the conductive section 430 are all attached to the base layer 420b.

The conductor 430a can be a copper foil or other electrically conductive material, and the conductor 430a has opening. The upper surface of the conductor 430a may further have a silver plating layer, and subsequently, the LED chip 442 may be attached to the base layer 420b by means of die bond paste or the like. Thereafter, a phosphor glue or phosphor film is applied to coat over the LED chip 442, the wires 440, 450, and a portion of the conductive electrodes 410, 412 to form a light conversion layer 420. The width or/and the length of the opening of the conductor 430a are respectively larger than the width or/and the length of the LED chip 442 and defining the position of the LED chip 442. At least two of the six faces of the LED chip, generally five faces in the present embodiment, being covered by the phosphor glue. The wires 440, 450 may be gold wires. Besides, the silver plating layer has an effect of increasing light reflection in addition to good electrical conductivity.

Figure 2:
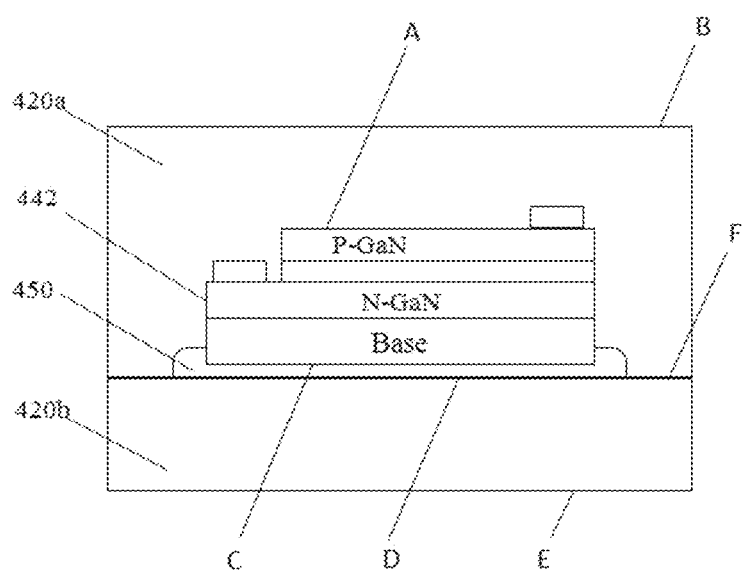
FIG. 2 is a schematic view showing the interfaces passing through by the light emitted by the LED chip in accordance with the present invention.

When the LED filament is illuminated in an LED light bulb encapsulation with the inert gas, as shown in FIG. 2, the light emitted by the LED chip 442 passes through the interfaces A, B, C, D, E and F respectively, wherein the interface A is the interface between the p-GaN gate and the top layer 420a in the LED chip 442. The interface B is the interface between the top layer 420a and the inert gas, the interface C is the interface between the substrate and the paste 450 (e.g., die bond paste) in the LED chip 442, the D interface is the interface between the paste 450 and the base layer 420b, the interface E is the interface between the base layer 420b and the inert gas, and the interface F is the interface between the base layer 420b and the top layer 420a. When light passes through the interfaces A, B, C, D, E and F respectively, the refractive index of the two substances in any interface is n1 and n2 respectively, then $|n1-n2|<1.0$, preferably $|n1-n2|<0.5$, more preferably $|n1-n2|<0.2$. In one embodiment, the refractive index of two substances in any one of the four interfaces of B, E, D and F is n1 and n2 respectively, and then $|n1-n2|<1.0$, preferably $|n1-n2|<0.5$, More preferably $|n1-n2|<0.2$. In one embodiment, the refractive index of two substances in any interface of D and F two interfaces is n1 and n2 respectively, then $|n1-n2|<1.0$, preferably $|n1-n2|<0.5$, preferably $|n1-n2|<0.2$. The absolute value of the difference in refractive index of the two substances in each interface is smaller, the light emitting efficiency is higher. For example, when the light emitted by the LED chip 442 passes from the base layer 420b to the top layer 420a, the incident angle is θ1, the refraction angle is θ2, and the refractive index of the base layer 420b is n1, and the refractive index of the top layer 420a is n2, according to the equation $\sin θ1/\sin θ2 = n2/n1$, when the absolute value of the difference between n1 and n2 is smaller, the incident angle closer to the refraction angle, and then the light-emitting efficiency of the LED filament is higher.

Figure 3A:
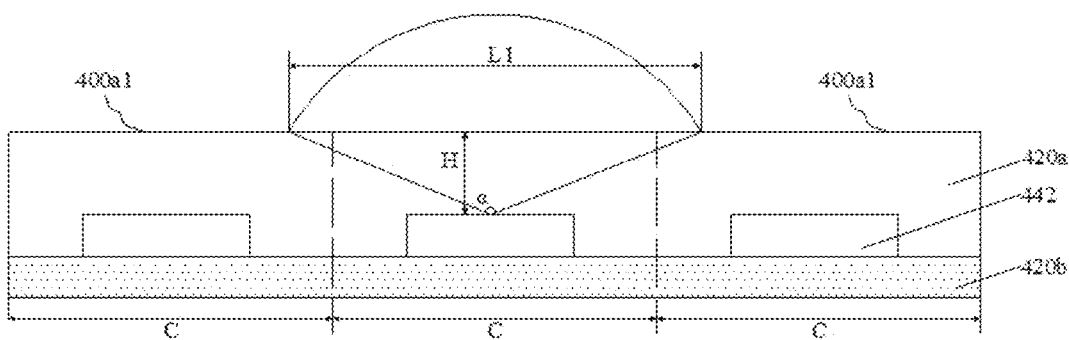
FIG. 3A is a cross sectional view showing the LED filament in the axial direction of the LED filament.
Figure 3B:
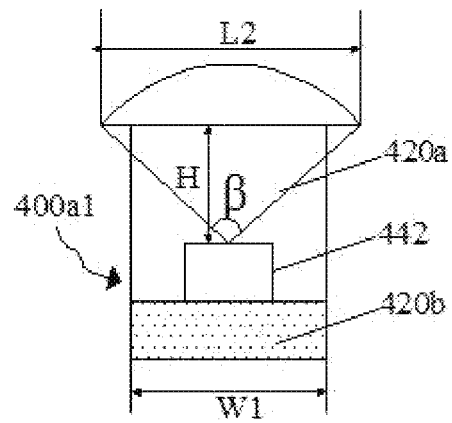
FIG. 3B is a cross-sectional view showing the LED filament in the radial direction of the LED filament.

Referring to FIG. 3A, FIG. 3A shows the cross sectional view of a portion of the LED filament 400 in the longitudinal direction of the LED filament 400, FIG. 3A shows three LED filament units 400a1 and each LED filament unit 400a1 includes a single LED chip 442. FIG. 3B is a cross sectional view of the LED filament unit 400a1 in the short axial direction of the LED filament. As shown in FIGS. 3A and 3B, the illumination angle of the LED chip 442 in the longitudinal direction of the LED filament is α, the illumination angle of the LED chip 442 in the short axial direction of the LED filament is β, and the surface of the LED chip 442 away from the base layer 420b is defined by the upper surface of the LED chip 442, the distance from the upper surface of the LED chip 442 to the outer surface of the top layer is H, and the length of the LED filament unit 400a1 in the longitudinal direction of the LED filament is C, and the light emitting area of an LED chip 442 in the LED filament in the longitudinal direction of the LED filament is the illumination coverage of the illumination angle α, the LED chip emits the light along with the illumination angle α and it projects on the outer surface of the top layer 420a with a length of the linear distance L1. The light emitting area of an LED chip 442 in the LED filament in the short axial direction of the LED filament is the illumination coverage of the illumination angle β, the LED chip emits the light along with the illumination angle β and it projects on the outer surface of the top layer 420a with a length of the linear distance L2. It is considered that the LED filament has ideal light emitting area, better bending property, thermal dissipation performance, avoiding to occur obvious dark areas of LED filament and reducing material waste, etc. at the same time, the L1 value can be designed by the equation as 0.5C≤L1≤10C, preferably C≤L1≤2C. Further, under the equation L2≥W1, if the L1 value is smaller than the C value, the light emitting areas of the adjacent LED chips 442 in the longitudinal direction cannot be intersected, therefore the LED filament may have a dark area in the longitudinal direction. Moreover, when the L2 value is smaller than the W1 value, it represents the width of the LED chip 442 in the short axial direction of the filament is too large, and it is also possible to cause the top layer 420a having dark areas on both sides in the short axial direction. The dark areas not only affect the overall light illumination efficiency of the LED filament, but also indirectly cause waste of material use. The specific values of α, β depend on the type or specification of the LED chip 442.

In one embodiment, in the longitudinal direction of the LED filament:

H=L1/2 tan 0.5α, 0.5C≤L1≤10C, then 0.5C/2 tan 0.5α≤H≤10C/2 tan 0.5α;

in the short axial direction of the LED:

H=L2/2 tan 0.5α, L2≥W1, then H≥W1/2 tan 0.5β;

therefore, Hmax=10C/2 tan 0.5α, Hmin=a; setting a is the maximum value in both 0.5C/2 tan 0.5α and W1/2 tan 0.5β, and setting A is the maximum value in both C/2 tan 0.5α and W1/2 tan 0.5β.

Thus, the equation between the distance H and the setting value a and A respectively as a≤H≤10C/2 tan 0.5α, preferably A≤H≤2C/2 tan 0.5α. When the type of the LED chip 442, the spacing between adjacent LED chips, and the width of the filament are known, the distance H from the light emitting surface of the LED chip 442 to the outer surface of the top layer can be determined, so that the LED filament has a superior light emitting area in both the short axial and longitudinal direction of the LED filament.

Most LED chips have an illumination angle of 120° in both the short axial and longitudinal direction of the LED filament. The setting b is the maximum of 0.14C and 0.28W1, and B is the maximum of 0.28C and 0.28W1, then the equation between the distance H and the setting value b and B respectively as b≤H≤2.9C and preferably B≤H≤0.58C.

In one embodiment, in the longitudinal direction of the LED filament:

H=L1/2 tan 0.5α, 0.5C≤L1≤10C;

in the short axial direction of the LED filament:

H=L2/2 tan 0.5β, L2≥W1; then W1≥2H tan 0.5β;

then 0.5C tan 0.5β/tan 0.5α≤L2≤10C tan 0.5β/tan 0.5α, L2≥W1;

therefore, W1≤10C tan 0.5β/tan 0.5α, thus W1 max=min (10C tan 0.5β/tan 0.5α, 2H tan 0.5β).

The relationship between the LED chip width W2 and the base layer width W1 is set to W1:W2=1:0.8 to 0.9, so that the minimum of W1 as W1 min=W2/0.9 can be known.

Setting d is the minimum of 10C tan 0.5β/tan 0.5α and 2H tan 0.5β, and D is the minimum of 2C tan 0.5β/tan 0.5α and 2H tan 0.5β, then the equation between the base layer width W1, the LED chip width W2, and the setting value d and D respectively is W2/0.9≤W1≤d, preferably W2/0.9≤W1≤D.

When the type of the LED chip 442, the distance between the adjacent two LED chips in the LED filament, and the H value are known, the range of the width W of the LED filament can be calculated, so that the LED filament can be ensured in the short axial direction and the longitudinal direction of the LED filament both have superior light emitting areas.

Most of the LED chips have an illumination angle of 120° in the short axial and in the longitudinal direction of the LED filament, the e is set to a minimum value of 10C and 3.46H, and the E is set to a minimum value of 2C and 3.46H, in the case the equation between the width W1, W2 and the setting value e and E respectively as 1.1W2≤W1≤e, preferably 1.1W2≤W1≤E.

In one embodiment, in the longitudinal direction of the LED filament:

H=L1/2 tan 0.5α, 0.5C≤L1≤10C, then 0.2H tan 0.5α≤C≤4H tan 0.5α;

in the short axial direction of the LED filament:

H=L2/2 tan 0.5β, L2≥W1, then L1≥W1 tan 0.5α/tan 0.5β;

thus W1 tan 0.5α/tan 0.5β≤10C, and C≥0.1W1 tan 0.5α/tan 0.5β;

then Cmax=4H tan 0.5α.

Setting f is the maximum value of both 0.2H tan 0.5α and 0.1W1 tan 0.5α/tan 0.5β, and setting F is the maximum value of both H tan 0.5α and 0.1W1 tan 0.5α/tan 0.5β, therefore f≤C≤4H tan 0.5α, preferably F≤C≤2H tan 0.5α.

When the width W, the H value, and type of the LED chip 442 of the LED filament are determined, the range of the width C of the LED filament can be known, so that the LED filament has superior light emitting area in both the short axial direction and the longitudinal direction of the LED filament.

Most LED chips have an illumination angle of 120° in the short axial direction and in the longitudinal direction of the LED filament of the LED filament. The setting g is the maximum value of 0.34H and 0.1W1, and setting G is the maximum value of 1.73H and 0.1W1, thereby the equation between the value C, H and the setting value g and G respectively as g≤C≤6.92H, preferably G≤C≤3.46H.

In the above embodiment, since the thickness of the LED chip 442 is small relative to the thickness of the top layer 420a, it is negligible in most cases, that is, the H value may also represent the actual thickness of the top layer 420a.

Figure 4:
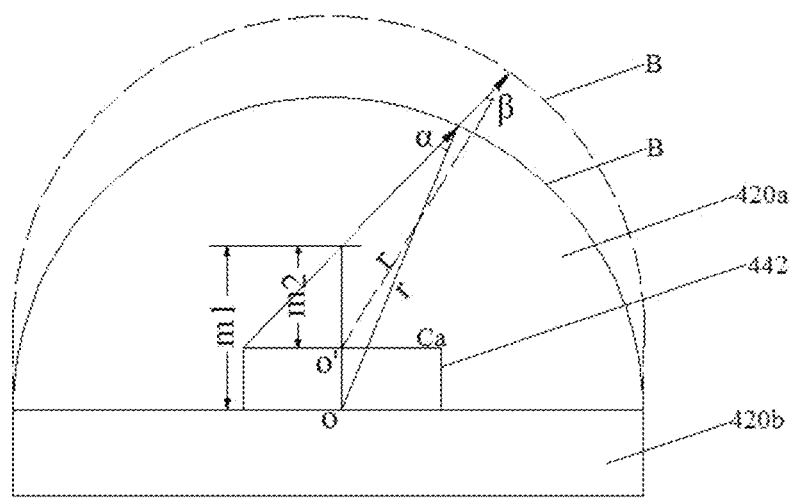
FIG. 4 is a cross sectional view showing another embodiment of the LED filament in accordance with the present invention.

As shown in FIG. 4, the center O of the top layer 420a indicated by the solid line does not overlap with the light emitting surface Ca of the LED chip, and the center O' of the top layer 420a indicated by the dashed line overlaps with the light emitting surface of the LED chip, and the radius of the semicircle with the center of O and the radius of the semicircle of O' is equal. As shown in the figure, tan α=m1/r and tan β=m2/r, m1 is greater than m2, and thus α is greater than β, so that when the light emitting surface overlaps with the center of the top layer 420a, that is the distance from the center point to the outer surface of the top layer is substantially the same, the light emitting efficiency is better.

The LED chip used in the aforementioned embodiments can be replaced by a back plated chip, and the plated metal is silver or gold alloy. When the back plated chip is used, the specular reflection can be enhanced, and the luminous flux of the light emitted from the light emitting surface A of the LED chip can be increased.

Figure 5A:
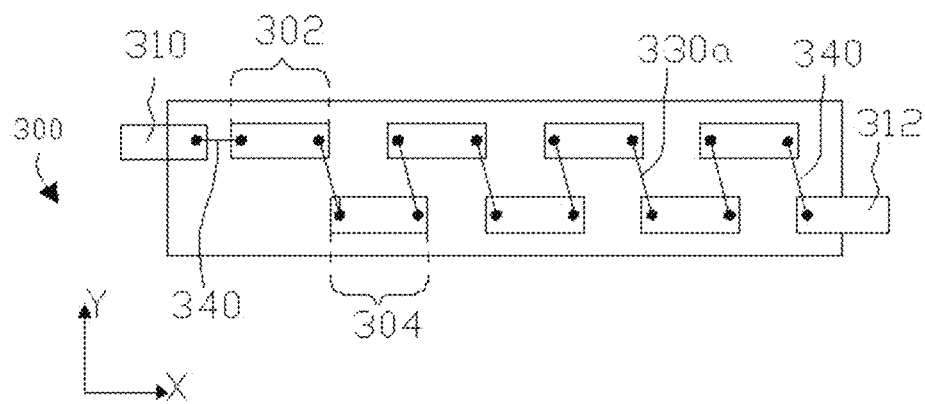
FIGS. 5A to 5I are schematic top views of a plurality of embodiments in accordance with the present invention.

Next, a chip bonding design relating to an LED filament will be described. The FIG. 5A is a top view of an embodiment of the LED filament 300 in an unbent state in accordance with the present invention. The LED filament 300 includes a plurality of LED chip units 302, 304, a conductor 330a, and at least two conductive electrodes 310, 312. The LED chip units 302 and 304 may be a single LED chip, or may include a plurality of LED chips, that is, equal to or greater than two LED chips.

The conductor 330a is located between the adjacent two LED chip units 302, 304, the LED chip units 302, 304 are at different positions in the Y direction, and the conductive electrodes 310, 312 are disposed corresponding to the LED chip units 302, 304 and electrically connected to the LED chip units 302 and 304 through the wires 340. The adjacent two LED chip units 302 and 304 are electrically connected to each other through the conductor 330a. The angle between the conductor 330a and the LED filament in the longitudinal direction (X direction) is 30° to 120°, preferably 60° to 120°. In the related art, the direction of the conductor 330a is parallel to the X direction, and the internal stress acting on the cross sectional area of the conductor is large when the filament is bent at the conductor. Therefore, the conductor 330a is disposed at a certain angle with the X direction and it can effectively reduce the internal stress thereof. The wire 340 is at an angle, parallel, vertical or any combination with the X direction. In the embodiment, the LED filament 300 includes two wires 340, one wire 340 is parallel to the X direction, and the other wire 340 has an angle of 30° to 120° with respect to the X direction. The LED filament 300 emits light after its conductive electrodes 310, 312 are powered with voltage source or current source.

Figure 5B:
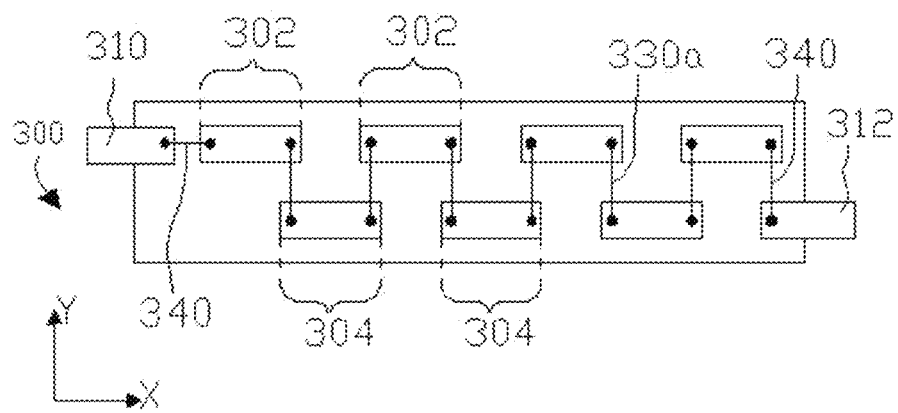
Figure 5C:
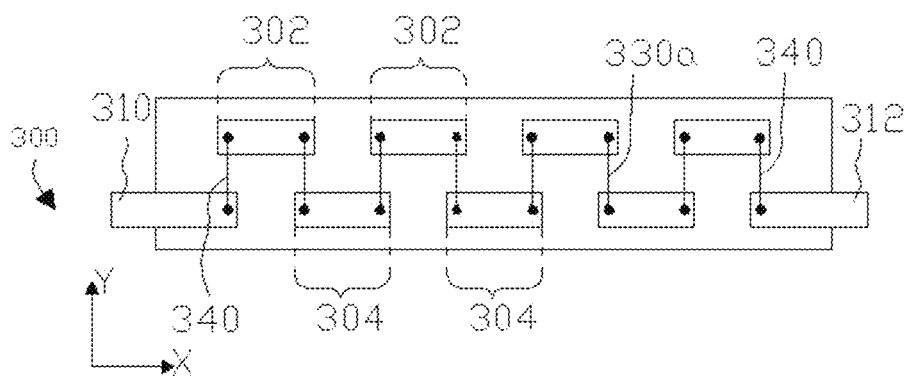
Figure 5D:
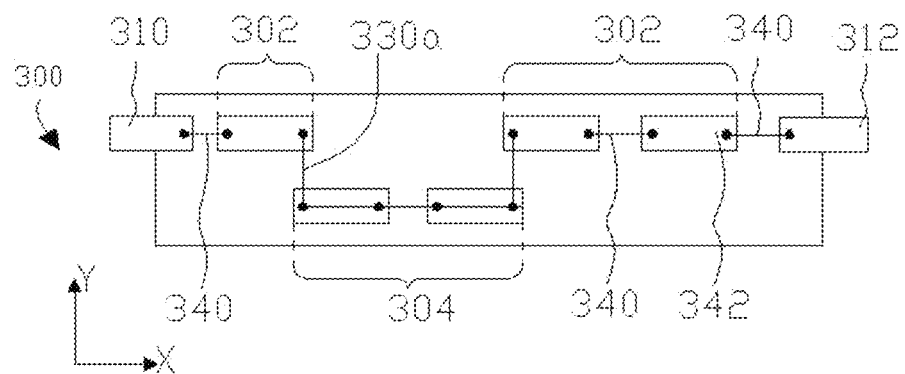

FIGS. 5B to 5D show the case where the conductor 330a is 90° with respect to the X direction, that is, the conductor 330a is perpendicular to the X direction, which can reduce the internal stress on the conductor cross sectional area when the filament is bent. In some embodiment the wire 340 both in parallel and vertically with respect to the X direction are combined in an LED filament, as shown in FIG. 5B, the LED filament 300 includes two wires 340, one wire 340 being parallel to the X direction and the other wire 340 being perpendicular to the X direction.

As shown in FIG. 5C, the difference from the embodiment shown in FIG. 5B is that the wire 340 is perpendicular to the X direction, and the bendability duration between the conductive electrodes 310, 312 and the LED chip units 302, 304 is improved. Further, since the conductor 330a and the wire 340 are simultaneously arranged to be perpendicular to the X direction, the LED filament can have good bendability at any position.

Figure 5E:
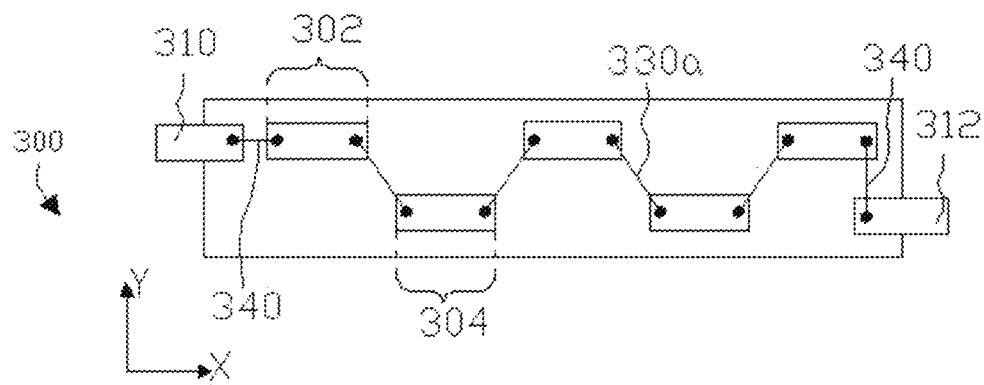

FIG. 5E is a top view of the LED filament 300 in an unbent state in accordance with one embodiment of the present invention. FIG. 5E differs from the embodiment shown in FIG. 5C is that, in the X direction, the LED chip unit 304 is between two adjacent LED chip units 302, and no overlap with the LED chip unit 302 in the projection in the Y direction, so that when the LED filament is bent at the conductor 330a, the LED chip is not damaged, thereby improving the stability of the LED light bulb product quality.

Figure 5F:
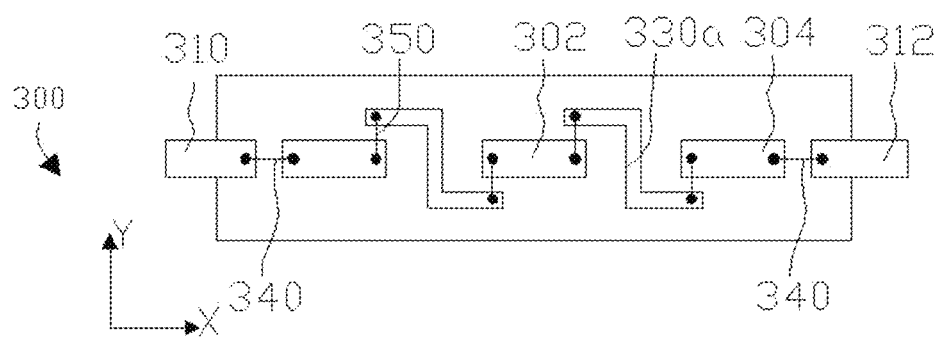

As shown in FIG. 5F, the LED filament 300 includes a plurality of LED chip units 302, 304, a conductor 330a, and at least two conductive electrodes 310, 312. The conductor 330a is located between adjacent LED chip units 302, 304, and the LED chip units 302, 304 are disposed at substantially the same position in the Y direction, so that the overall width of the LED filament 300 is smaller, thereby shortening the thermal dissipation path of the LED chip and improving the thermal dissipation effect. The conductive electrodes 310, 312 are correspondingly arranged to the LED chip units 302, 304, and are electrically connected to the LED chip units 302, 304 through the wires 340. The LED chip units 302/304 are electrically connected to the conductors 330a through the wires 350, and the conductors 330a are in the font shape like deformed Z letter. The aforesaid shape can increase the mechanical strength of the region where the conductor and the LED chip are located in, and can avoid the damage of the wire connecting the LED chip and the conductor when the LED filament 300 is bent. At the same time, the wire 340 is disposed in a parallel with the X direction.

Figure 5G:
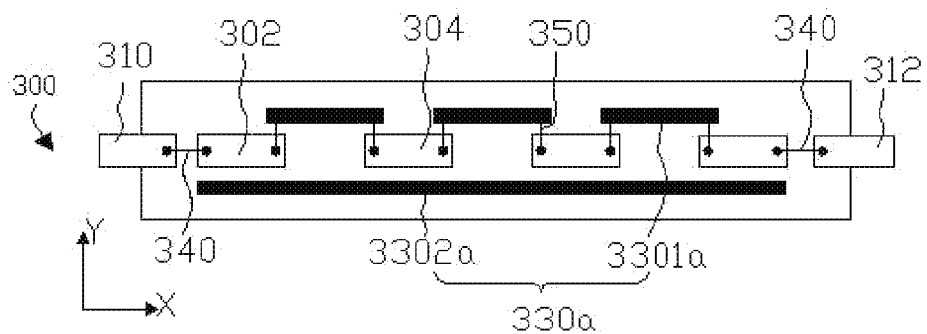

As shown in FIG. 5G, the LED filament 300 includes a plurality of LED chip units 302, 304, at least one conductor 330a, and at least two conductive electrodes 310, 312. The LED chip units 302, 304 are in the same position in the Y direction, and the conductor 330a parallel to the X direction, the conductor 330a includes a first conductor 3301a and a second conductor 3302a, respectively located on opposite sides of the LED chip unit 302/304, and the first conductor 3301a is located between adjacent LED chip units 302, 304 and electrically connected to the LED chip unit 302/304 through the wire 350. The wire 350 is perpendicular to the X direction, and reduces the internal stress on the cross sectional area of the wire when the LED filament 300 is bent, thereby improving the bendability of the wire. The second conductor 3302a is not electrically connected to the LED chip units 302, 304, and the second conductor 3302a extends along the X direction to the one end of each wire 340 adjacent to the electrode. When the LED filament 300 is suffered external force, it can play the role of stress buffering, protect the LED chip, improve product stability, and secondly make the force balance on both sides of the LED chip. The conductive electrodes 310, 312 are configured corresponding to the LED chip units 302, 304, and are electrically connected to the LED chip units 302, 304 through wires 340.

Figure 5H:
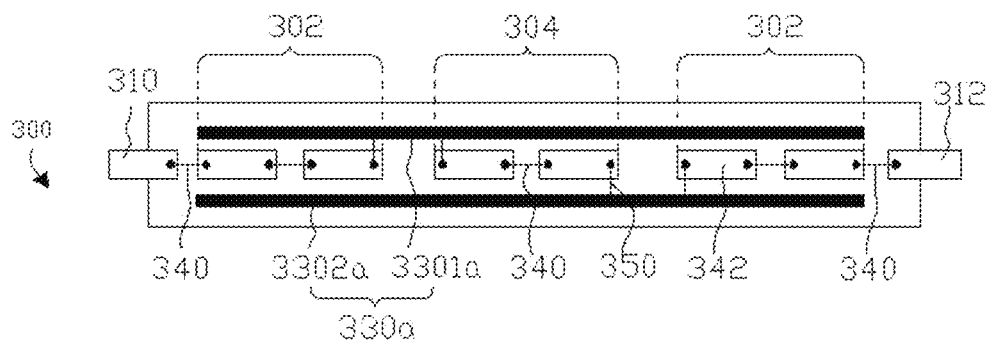

As shown in FIG. 5H, the difference from the embodiment shown in FIG. 5G is that the first conductor 3301a and the second conductor 3302a extends along the X direction to the one end of each wire 340 adjacent to the electrode, and the first conductor 3301a and the second conductor 3302a are electrically connected to both the LED chip unit 302 and the LED chip unit 304 by wires 350. In other embodiments, for example, the first conductor 3301a is electrically connected to the LED chip unit 302 and the LED chip unit 304 through the wire 350, and the second conductor 3302a may not be electrically connected to the LED chip unit 302/304. By setting conductors on both sides of the LED chip, when the LED filament 300 is bent, it can not only increase the strength of the LED filament 300 but also disperse the heat generated by the LED chips during illumination.

Figure 5I:
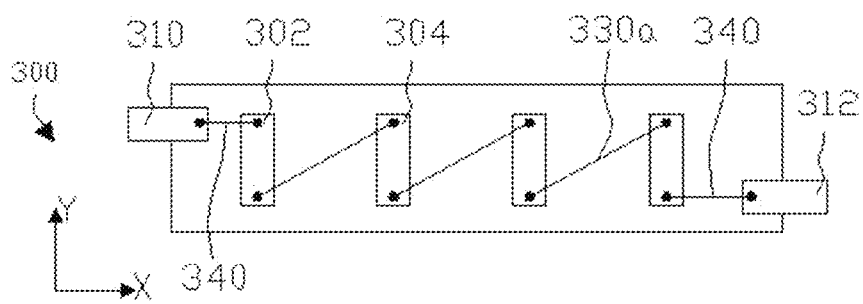

FIG. 5I is a top view showing an embodiment of the LED filament 300 in an unbent state. In the present embodiment, the LED chip units 302 and 304 are single LED chips, and the width of the LED chip units 302 and 304 is parallel to the X direction. Preferably, the LED chip units 302 and 304 are at substantially the same position in the Y direction, so that the overall width of the LED filament 300 is smaller, thereby shortening the heat dissipation path of the LED chip and improving the thermal dissipation effect. The adjacent two LED chip units 302 and 304 are connected by a conductor 330a, and the angle between the conductor 330a and the X direction is 30° to 120°, which reduces the internal stress on the cross sectional area of the wire and also improves the bendability of the wire when the LED filament 300 is bent. In other embodiments, the LED chip unit longitudinally may have an angle with the X direction as the conductor 330a, which may further reduce the overall width of the LED filament 300.

The next part will describe the material of the filament of the present invention. The material suitable for manufacturing a filament substrate or a light-conversion layer for LED should have properties such as excellent light transmission, good heat resistance, excellent thermal conductivity, appropriate refraction rate, excellent mechanical properties and good warpage resistance. All the above properties can be achieved by adjusting the type and the content of the main material, the modifier and the additive contained in the organosilicon-modified polyimide composition. The present disclosure provides a filament substrate or a light-conversion layer formed from a composition comprising an organosilicon-modified polyimide. The composition can meet the requirements on the above properties. In addition, the type and the content of one or more of the main material, the modifier (thermal curing agent) and the additive in the composition can be modified to adjust the properties of the filament substrate or the light-conversion layer, so as to meet special environmental requirements. The modification of each property is described herein below.

Adjustment of the Organosilicon-Modified Polyimide

The organosilicon-modified polyimide provided herein comprises a repeating unit represented by the following general Formula (I):

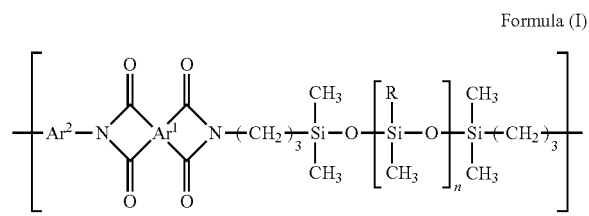

Formula (I)

In general Formula (I), $Ar^1$ is a tetra-valent organic group. The organic group has a benzene ring or an alicyclic hydrocarbon structure. The alicyclic hydrocarbon structure may be monocyclic alicyclic hydrocarbon structure or a bridged-ring alicyclic hydrocarbon structure, which may be a dicyclic alicyclic hydrocarbon structure or a tricyclic alicyclic hydrocarbon structure. The organic group may also be a benzene ring or an alicyclic hydrocarbon structure comprising a functional group having active hydrogen, wherein the functional group having active hydrogen is one or more of hydroxyl, amino, carboxy, amido and mercapto.

$Ar^2$ is a di-valent organic group, which organic group may have for example a monocyclic alicyclic hydrocarbon structure or a di-valent organic group comprising a functional group having active hydrogen, wherein the functional group having active hydrogen is one or more of hydroxyl, amino, carboxy, amido and mercapto.

R is each independently methyl or phenyl.

n is 1~5, preferably 1, 2, 3 or 5.

The polymer of general Formula (I) has a number average molecular weight of 5000~100000, preferably 10000~60000, more preferably 20000~40000. The number average molecular weight is determined by gel permeation chromatography (GPC) and calculated based on a calibration curve obtained by using standard polystyrene. When the number average molecular weight is below 5000, a good mechanical property is hard to be obtained after curing, especially the elongation tends to decrease. On the other hand, when it exceeds 100000, the viscosity becomes too high and the resin is hard to be formed.

$Ar^1$ is a component derived from a dianhydride, which may be an aromatic anhydride or an aliphatic anhydride. The aromatic anhydride includes an aromatic anhydride comprising only a benzene ring, a fluorinated aromatic anhydride, an aromatic anhydride comprising amido group, an aromatic anhydride comprising ester group, an aromatic anhydride comprising ether group, an aromatic anhydride comprising sulfide group, an aromatic anhydride comprising sulfonyl group, and an aromatic anhydride comprising carbonyl group.

Examples of the aromatic anhydride comprising only a benzene ring include pyromellitic dianhydride (PMDA), 2,3,3',4'-biphenyl tetracarboxylic dianhydride (aBPDA), 3,3',4,4'-biphenyl tetracarboxylic dianhydride (sBPDA), and 4-(2,5-dioxotetrahydrofuran-3-yl)-1,2,3,4-tetrahydro naphthalene-1,2-dicarboxylic anhydride (TDA). Examples of the fluorinated aromatic anhydride include 4,4'-(hexafluoroisopropylidene)diphthalic anhydride which is referred to as 6FDA. Examples of the aromatic anhydride comprising amido group include N,N'-(5,5'-(perfluoropropane-2,2-diyl) bis(2-hydroxy-5,1-phenylene))bis(1,3-dioxo-1,3-dihydroisobenzofuran)-5-arboxamide) (6FAP-ATA), and N,N'-(9H-fluoren-9-ylidenedi-4,1-phenylene)bis[1,3-dihydro-1, 3-dioxo-5-isobenzofuran carboxamide] (FDA-ATA). Examples of the aromatic anhydride comprising ester group include p-phenylene bis(trimellitate) dianhydride (TAHQ). Examples of the aromatic anhydride comprising ether group include 4,4'-(4,4'-isopropylidenediphenoxy)bis(phthalic anhydride) (BPADA), 4,4'-oxydiphthalic dianhydride (sODPA), 2,3,3',4'-diphenyl ether tetracarboxylic dianhydride (aODPA), and 4,4'-(4,4'-isopropylidenediphenoxy)bis (phthalic anhydride)(BPADA). Examples of the aromatic anhydride comprising sulfide group include 4,4'-bis(phthalic anhydride)sulfide (TPDA). Examples of the aromatic anhydride comprising sulfonyl group include 3,3',4,4'-diphenylsulfonetetracarboxylic dianhydride (DSDA). Examples of the aromatic anhydride comprising carbonyl group include 3,3',4,4'-benzophenonetetracarboxylic dianhydride(BTDA).

The alicyclic anhydride includes 1,2,4,5-cyclohexanetetracarboxylic acid dianhydride which is referred to as HPMDA, 1,2,3,4-butanetetracarboxylic dianhydride (BDA), tetrahydro-1H-5,9-methanopyrano[3,4-d]oxepine-1,3,6,8(4H)-tetrone (TCA), hexahydro-4,8-ethano-1H,3H-benzo [1,2-C:4,5-C']difuran-1,3,5,7-tetrone (BODA), cyclobutane-1,2,3,4-tetracarboxylic dianhydride(CBDA), and 1,2,3,4-cyclopentanetetracarboxylic dianhydride (CpDA); or alicyclic anhydride comprising an olefin structure, such as bicyclo[2.2.2]oct-7-ene-2,3,5,6-tetracarboxylic dianhydride (COeDA). When an anhydride comprising ethynyl such as 4,4'-(ethyne-1,2-diyl)diphthalic anhydride (EBPA) is used, the mechanical strength of the light-conversion layer can be further ensured by post-curing.

Considering the solubility, 4,4'-oxydiphthalic anhydride (sODPA), 3,3',4,4'-benzophenonetetracarboxylic dianhydride (BTDA), cyclobutanetetracarboxylic dianhydride (CBDA) and 4,4'-(hexafluoroisopropylidene)diphthalic anhydride (6FDA) are preferred. The above dianhydride can be used alone or in combination.

$A^2$ is derived from diamine which may be an aromatic diamine or an aliphatic diamine. The aromatic diamine includes an aromatic diamine comprising only a benzene ring, a fluorinated aromatic diamine, an aromatic diamine comprising ester group, an aromatic diamine comprising ether group, an aromatic diamine comprising amido group, an aromatic diamine comprising carbonyl group, an aromatic diamine comprising hydroxyl group, an aromatic diamine comprising carboxy group, an aromatic diamine comprising sulfonyl group, and an aromatic diamine comprising sulfide group.

The aromatic diamine comprising only a benzene ring includes m-phenylenediamine, p-phenylenediamine, 2,4-diaminotoluene, 2,6-diamino-3,5-diethyltoluene, 3,3'-dimethylbiphenyl-4,4'-diamine 9,9-bis(4-aminophenyl)fluorene (FDA), 9,9-bis(4-amino-3-methylphenyl)fluorene, 2,2-bis(4-aminophenyl)propane, 2,2-bis(3-methyl-4-aminophenyl) propane, 4,4'-diamino-2,2'-dimethylbiphenyl(APB). The fluorinated aromatic diamine includes 2,2'-bis(trifluoromethyl)benzidine (TFMB), 2,2-bis(4-aminophenyl)hexafluoropropane (6FDAM), 2,2-bis[4-(4-aminophenoxy)phenyl] hexafluoropropane (HFBAPP), and 2,2-bis(3-amino-4-methylphenyl)hexafluoropropane (BIS-AF-AF). The aromatic diamine comprising ester group includes [4-(4-aminobenzoyl)oxyphenyl]4-aminobenzoate (ABHQ), bis(4-aminophenyl)terephthalate(BPTP), and 4-aminophenyl 4-aminobenzoate (APAB). The aromatic diamine comprising ether group includes 2,2-bis[4-(4-aminophenoxy)phenyl]propane)(BAPP), 2,2'-bis[4-(4-aminophenoxy)phenyl] propane (ET-BDM), 2,7-bis(4-aminophenoxy)-naphthalene (ET-2,7-Na), 1,3-bis(3-aminophenoxy)benzene (TPE-M), 4,4'-[1,4-phenyldi(oxy)]bis[3-(trifluoromethyl)aniline] (p-6FAPB), 3,4'-diaminodiphenyl ether, 4,4'-diaminodiphenyl ether (ODA), 1,3-bis(4-aminophenoxy)benzene (TPE-R), 1,4-bis(4-aminophenoxy)benzene (TPE-Q), and 4,4'-bis(4-aminophenoxy)biphenyl(BAPB). The aromatic diamine comprising amido group includes N,N'-bis(4-aminophenyl)benzene-1,4-dicarboxamide (BPTPA), 3,4'-diamino benzanilide (m-APABA), and 4,4'-diaminobenzanilide (DABA). The aromatic diamine comprising carbonyl group includes 4,4'-diaminobenzophenone (4,4'-DABP), and bis(4-amino-3-carboxyphenyl) methane (or referred to as 6,6'-diamino-3,3'-methylanediyl-dibenzoic acid). The aromatic diamine comprising hydroxyl group includes 3,3'-dihydroxybenzidine (HAB), and 2,2-bis(3-amino-4-hydroxyphenyl) hexafluoropropane (6FAP). The aromatic diamine comprising carboxy group includes 6,6'-diamino-3,3'-methylanediyl-dibenzoic acid (MBAA), and 3,5-diaminobenzoic acid (DBA). The aromatic diamine comprising sulfonyl group includes 3,3'-diaminodiphenyl sulfone (DDS),4,4'-diaminodiphenyl sulfone, bis[4-(4-aminophenoxy)phenyl]sulfone (BAPS) (or referred to as 4,4'-bis(4-aminophenoxy)diphenylsulfone), and 3,3'-diamino-4,4'-dihydroxydiphenyl sulfone (ABPS). The aromatic diamine comprising sulfide group includes 4,4'-diaminodiphenyl sulfide.

The aliphatic diamine is a diamine which does not comprise any aromatic structure (e.g., benzene ring). The aliphatic diamine includes monocyclic alicyclic amine and straight chain aliphatic diamine, wherein the straight chain aliphatic diamine include siloxane diamine, straight chain alkyl diamine and straight chain aliphatic diamine comprising ether group. The monocyclic alicyclic diamine includes 4,4'-diaminodicyclohexylmethane (PACM), and 3,3'-dimethyl-4,4-diaminodicyclohexylmethane (DMDC). The siloxane diamine (or referred to as amino-modified silicone) includes α,ω-(3-aminopropyl)polysiloxane (KF8010), X22-161A, X22-161B, NH15D, and 1,3-bis(3-aminopropyl)-1,1,3,3-tetramethyldisiloxane (PAME). The straight chain alkyl diamine has 6-12 carbon atoms, and is preferably unsubstituted straight chain alkyl diamine. The straight chain aliphatic diamine comprising ether group includes ethylene glycol di(3-aminopropyl) ether.

The diamine can also be a diamine comprising fluorenyl group. The fluorenyl group has a bulky free volume and rigid fused-ring structure, which renders the polyimide good heat resistance, thermal and oxidation stabilities, mechanical properties, optical transparency and good solubility in organic solvents. The diamine comprising fluorenyl group, such as 9,9-bis(3,5-difluoro-4-aminophenyl)fluorene, may be obtained through a reaction between 9-fluorenone and 2,6-dichloroaniline. The fluorinated diamine can be 1,4-bis (3'-amino-5'-trifluoromethylphenoxy)biphenyl, which is a meta-substituted fluorine-containing diamine having a rigid biphenyl structure. The meta-substituted structure can hinder the charge flow along the molecular chain and reduce the intermolecular conjugation, thereby reducing the absorption of visible lights. Using asymmetric diamine or anhydride can increase to some extent the transparency of the organosilicon-modified polyimide resin composition. The above diamines can be used alone or in combination.

Examples of diamines having active hydrogen include diamines comprising hydroxyl group, such as 3,3'-diamino-4,4'-dihydroxybiphenyl, 4,4'-diamino-3,3'-dihydroxy-1,1'-biphenyl (or referred to as 3,3'-dihydroxybenzidine) (HAB), 2,2-bis(3-amino-4-hydroxyphenyl)propane(BAP), 2,2-bis(3-amino-4-hydroxyphenyl)hexafluoropropane(6FAP), 1,3-bis(3-hydro-4-aminophenoxy) benzene, 1,4-bis(3-hydroxy-4-aminophenyl)benzene and 3,3'-diamino-4,4'-dihydroxydiphenyl sulfone (ABPS). Examples of diamines comprising carboxy group include 3,5-diaminobenzoic acid, bis(4-amino-3-carboxyphenyl)methane (or referred to as 6,6'-diamino-3,3'-methylenedibenzoic acid), 3,5-bis(4-aminophenoxy)benzoic acid, and 1,3-bis(4-amino-2-carboxyphenoxy)benzene. Examples of diamines comprising amino group include 4,4'-diaminobenzanilide (DABA), 2-(4-aminophenyl)-5-aminobenzoimidazole, diethylenetriamine, 3,3'-diaminodipropylamine, triethylenetetramine, and N,N'-bis(3-aminopropyl)ethylenediamine (or referred to as N,N-di(3-aminopropyl)ethylethylamine). Examples of diamines comprising thiol group include 3,4-diaminobenzenethiol. The above diamines can be used alone or in combination.

The organosilicon-modified polyimide can be synthesized by well-known synthesis methods. For example, it can be prepared from a dianhydride and a diamine which are dissolved in an organic solvent and subjected to imidation in the presence of a catalyst. Examples of the catalyst include acetic anhydride/triethylamine, and valerolactone/pyridine. Preferably, removal of water produced in the azeotropic process in the imidation is promoted by using a dehydrant such as toluene.

Polyimide can also be obtained by carrying out an equilibrium reaction to give a poly (amic acid) which is heated to dehydrate. In other embodiments, the polyimide backbone may have a small amount of amic acid. For example, the ratio of amic acid to imide in the polyimide molecule may be 1~3:100. Due to the interaction between amic acid and the epoxy resin, the substrate has superior properties. In other embodiments, a solid state material such as a thermal curing agent, inorganic heat dispersing particles and phosphor can also be added at the state of poly (amic acid) to give the substrate. In addition, solubilized polyimide can also be obtained by direct heating and dehydration after mixing of alicylic anhydride and diamine. Such solubilized polyimide, as an adhesive material, has a good light transmittance. In addition, it is liquid stateper se; therefore, other solid materials (such as the inorganic heat dispersing particles and the phosphor) can be dispersed in the adhesive material more sufficiently.

In one embodiment for preparing the organosilicon-modified polyimide, the organosilicon-modified polyimide can be produced by dissolving the polyimide obtained by heating and dehydration after mixing a diamine and an anhydride and a siloxane diamine in a solvent. In another embodiment, the amidic acid, before converting to polyimide, is reacted with the siloxane diamine.

In addition, the polyimide compound may be obtained by dehydration and ring-closing and condensation polymerization from an anhydride and a diamine, such as an anhydride and a diamine in a molar ratio of 1:1. In one embodiment, 200 micromole (mmol) of 4,4'-(hexafluoroisopropylidene) diphthalic anhydride(6FDA), 20 micromole (mmol) of 2,2-bis(3-amino-4-hydroxyphenyl)hexafluoropropane(6FAP), 50 micromole (mmol) of 2,2'-di(trifluoromethyl)diaminobiphenyl(TFMB) and 130 micromole (mmol) of aminopropyl-terminated poly(dimethylsiloxane) are used to give the PI synthesis solution.

The above methods can be used to produce amino-terminated polyimide compounds. However, other methods can be used to produce carboxy-terminated polyimide compounds. In addition, in the above reaction between anhydride and diamine, where the backbone of the anhydride comprises a carbon-carbon triple bond, the affinity of the carbon-carbon triple bond can promote the molecular structure. Alternatively, a diamine comprising vinyl siloxane structure can be used.

The molar ratio of dianhydride to diamine may be 1:1. The molar percentage of the diamine comprising a functional group having active hydrogen may be 5~25% of the total amount of diamine. The temperature under which the polyimide is synthesized is preferably 80~250° C., more preferably 100~200° C. The reaction time may vary depending on the size of the batch. For example, the reaction time for obtaining 10~30 g polyimide is 6~10 hours.

The organosilicon-modified polyimide can be classified as fluorinated aromatic organosilicon-modified polyimides and aliphatic organosilicon-modified polyimides. The fluorinated aromatic organosilicon-modified polyimides are synthesized from siloxane-type diamine, aromatic diamine comprising fluoro (F) group (or referred to as fluorinated aromatic diamine) and aromatic dianhydride comprising fluoro (F) group (or referred to as fluorinated aromatic anhydride). The aliphatic organosilicon-modified polyimides are synthesized from dianhydride, siloxane-type diamine and at least one diamine not comprising aromatic structure (e.g., benzene ring) (or referred to as aliphatic diamine), or from diamine (one of which is siloxane-type diamine) and at least one dianhydride not comprising aromatic structure (e.g., benzene ring) (or referred to as aliphatic anhydride). The aliphatic organosilicon-modified polyimide includes semi-aliphatic organosilicon-modified polyimide and fully aliphatic organosilicon-modified polyimide. The fully aliphatic organosilicon-modified polyimide is synthesized from at least one aliphatic dianhydride, siloxane-type diamine and at least one aliphatic diamine. The raw materials for synthesizing the semi-aliphatic organosilicon-modified polyimide include at least one aliphatic dianhydride or aliphatic diamine. The raw materials required for synthesizing the organosilicon-modified polyimide and the siloxane content in the organosilicon-modified polyimide would have certain effects on transparency, chromism, mechanical property, warpage extent and refractivity of the substrate.

The organosilicon-modified polyimide of the present disclosure has a siloxane content of 20~75 wt %, preferably 30~70 wt %, and a glass transition temperature of below 150° C. The glass transition temperature (Tg) is determined on TMA-60 manufactured by Shimadzu Corporation after adding a thermal curing agent to the organosilicon-modified polyimide. The determination conditions include: load: 5 gram; heating rate: 10° C./min; determination environment: nitrogen atmosphere; nitrogen flow rate: 20 ml/min; temperature range: −40 to 300° C. When the siloxane content is below 20%, the film prepared from the organosilicon-modified polyimide resin composition may become very hard and brittle due to the filling of the phosphor and thermal conductive fillers, and tend to warp after drying and curing, and therefore has a low processability. In addition, its resistance to thermochromism becomes lower. On the other hand, when the siloxane content is above 75%, the film prepared from the organosilicon-modified polyimide resin composition becomes opaque, and has reduced transparency and tensile strength. Here, the siloxane content is the weight ratio of siloxane-type diamine (having a structure shown in Formula (A)) to the organosilicon-modified polyimide, wherein the weight of the organosilicon-modified polyimide is the total weight of the diamine and the dianhydride used for synthesizing the organosilicon-modified polyimide subtracted by the weight of water produced during the synthesis.

Formula (A)

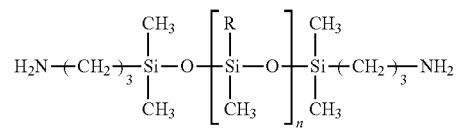

Wherein R is methyl or phenyl, preferably methyl, n is 1~5, preferably 1, 2, 3 or 5.

The only requirements on the organic solvent used for synthesizing the organosilicon-modified polyimide are to dissolve the organosilicon-modified polyimide and to ensure the affinity (wettability) to the phosphor or the fillers to be added. However, excessive residue of the solvent in the product should be avoided. Normally, the number of moles of the solvent is equal to that of water produced by the reaction between diamine and anhydride. For example, 1 mol diamine reacts with 1 mol anhydride to give 1 mol water; then the amount of solvent is 1 mol. In addition, the organic solvent used has a boiling point of above 80° C. and below 300° C., more preferably above 120° C. and below 250° C., under standard atmospheric pressure. Since drying and curing under a lower temperature are needed after coating, if the temperature is lower than 120° C., good coating cannot be achieved due to high drying speed during the coating process. If the boiling point of the organic solvent is higher than 250° C., the drying under a lower temperature may be deferred. Specifically, the organic solvent may be an ether-type organic solvent, an ester-type organic solvent, a dimethyl ether-type organic solvent, a ketone-type organic solvent, an alcohol-type organic solvent, an aromatic hydrocarbon solvent or other solvents. The ether-type organic solvent includes ethylene glycol monomethyl ether, ethylene glycol monoethyl ether, propylene glycol monomethyl ether, propylene glycol monoethyl ether, ethylene glycol dimethyl ether, ethylene glycol diethyl ether, ethylene glycol dibutyl ether, diethylene glycol dimethyl ether, diethylene glycol diethyl ether, diethylene glycol methyl ethyl ether, dipropylene glycol dimethyl ether or diethylene glycol dibutyl ether, and diethylene glycol butyl methyl ether. The ester-type organic solvent includes acetates, including ethylene glycol monoethyl ether acetate, diethylene glycol monobutyl ether acetate, propylene glycol monomethyl ether acetate, propyl acetate, propylene glycol diacetate, butyl acetate, isobutyl acetate, 3-methoxybutyl acetate, 3-methyl-3-methoxybutyl acetate, benzyl acetate and 2-(2-butoxyethoxy)ethyl acetate; and methyl lactate, ethyl lactate, n-butyl acetate, methyl benzoate and ethyl benzoate. The dimethyl ether-type solvent includes triethylene glycol dimethyl ether and tetraethylene glycol dimethyl ether. The ketone-type solvent includes acetylacetone, methyl propyl ketone, methyl butyl ketone, methyl isobutyl ketone, cyclopentanone, and 2-heptanone. The alcohol-type solvent includes butanol, isobutanol, isopentanol, 4-methyl-2-pentanol, 3-methyl-2-butanol, 3-methyl-3-methoxybutanol, and diacetone alcohol. The aromatic hydrocarbon solvent includes toluene and xylene. Other solvents include γ-butyrolactone, N-methylpyrrolidone, N,N-dimethylformamide, N,N-dimethylacetamide and dimethyl sulfoxide.

The present disclosure provides an organosilicon-modified polyimide resin composition comprising the above organosilicon-modified polyimide and a thermal curing agent, which may be epoxy resin, hydrogen isocyanate or bisoxazoline compound. In one embodiment, based on the weight of the organosilicon-modified polyimide, the amount of the thermal curing agent is 5~12% of the weight of the organosilicon-modified polyimide. The organosilicon-modified polyimide resin composition may further comprise heat dispersing particles and phosphor.

Light Transmittance

The factors affecting the light transmittance of the organosilicon-modified polyimide resin composition at least include the type of the main material, the type of the modifier (thermal curing agent), the type and content of the heat dispersing particles, and the siloxane content. Light transmittance refers to the transmittance of the light near the main light-emitting wavelength range of the LED chip. For example, blue LED chip has a main light-emitting wavelength of around 450 nm, then the composition or the polyimide should have low enough or even no absorption to the light having a wavelength around 450 nm, so as to ensure that most or even all the light can pass through the composition or the polyimide. In addition, when the light emitted by the LED chip passes through the interface of two materials, the closer the refractive indexes of the two materials, the higher the light output efficiency. In order to be close to the refractive index of the material (such as die bonding glue) contacting with the filament substrate (or base layer), the organosilicon-modified polyimide composition has a refractive index of 1.4~1.7, preferably 1.4~1.55. In order to use the organosilicon-modified polyimide resin composition as substrate in the filament, the organosilicon-modified polyimide resin composition is required to have good light transmittance at the peak wavelength of InGaN of the blue-excited white LED. In order to obtain a good transmittance, the raw materials for synthesizing the organosilicon-modified polyimide, the thermal curing agent and the heat dispersing particles can be adjusted. Because the phosphor in the organosilicon-modified polyimide resin composition may have certain effect on the transmittance test, the organosilicon-modified polyimide resin composition used for the transmittance test does not comprise phosphor. Such an organosilicon-modified polyimide resin composition has a transmittance of 86~93%, preferably 88~91%, or preferably 89~92%, or preferably 90~93%.

In the reaction of anhydride and diamine to produce polyimide, the anhydride and the diamine may vary. In other words, the polyimides produced from different anhydrides and different diamines may have different light transmittances. The aliphatic organosilicon-modified polyimide resin composition comprises the aliphatic organosilicon-modified polyimide and the thermal curing agent, while the fluorinated aromatic organosilicon-modified polyimide resin composition comprises the fluorinated aromatic organosilicon-modified polyimide and the thermal curing agent. Since the aliphatic organosilicon-modified polyimide has an alicyclic structure, the aliphatic organosilicon-modified polyimide resin composition has a relatively high light transmittance. In addition, the fluorinated aromatic, semi-aliphatic and full aliphatic polyimides all have good light transmittance in respect of the blue LED chips. The fluorinated aromatic organosilicon-modified polyimide is synthesized from a siloxane-type diamine, an aromatic diamine comprising a fluoro (F) group (or referred to as fluorinated aromatic diamine) and an aromatic dianhydride comprising a fluoro (F) group (or referred to as fluorinated aromatic anhydride). In other words, both $Ar^1$ and $Ar^2$ comprise a fluoro (F) group. The semi-aliphatic and full aliphatic organosilicon-modified polyimides are synthesized from a dianhydride, a siloxane-type diamine and at least one diamine not comprising an aromatic structure (e.g. a benzene ring) (or referred to as aliphatic diamine), or from a diamine (one of the diamine is siloxane-type diamine) and at least one dianhydride not comprising an aromatic structure (e.g. a benzene ring) (or referred to as aliphatic anhydride). In other words, at least one of $Ar^1$ and $Ar^2$ has an alicyclic hydrocarbon structure.

Although blue LED chips have a main light-emitting wavelength of 450 nm, they may still emit a minor light having a shorter wavelength of around 400 nm, due to the difference in the conditions during the manufacture of the chips and the effect of the environment. The fluorinated aromatic, semi-aliphatic and full aliphatic polyimides have different absorptions to the light having a shorter wavelength of 400 nm. The fluorinated aromatic polyimide has an absorbance of about 20% to the light having a shorter wavelength of around 400 nm, i.e. the light transmittance of the light having a wavelength of 400 nm is about 80% after passing through the fluorinated aromatic polyimide. The semi-aliphatic and full aliphatic polyimides have even lower absorbance to the light having a shorter wavelength of 400 nm than the fluorinated aromatic polyimide, which is only 12%. Accordingly, in an embodiment, if the LED chips used in the LED filament have a uniform quality, and emit less blue light having a shorter wavelength, the fluorinated aromatic organosilicon-modified polyimide may be used to produce the filament substrate or the light-conversion layer.

In another embodiment, if the LED chips used in the LED filament have different qualities, and emit more blue light having a shorter wavelength, the semi-aliphatic or full aliphatic organosilicon-modified polyimides may be used to produce the filament substrate or the light-conversion layer.

Adding different thermal curing agents imposes different effects on the light transmittance of the organosilicon-modified polyimide. Table 1-1 shows the effect of the addition of different thermal curing agents on the light transmittance of the full aliphatic organosilicon-modified polyimide. At the main light-emitting wavelength of 450 nm for the blue LED chip, the addition of different thermal curing agents renders no significant difference to the light transmittance of the full aliphatic organosilicon-modified polyimide; while at a short wavelength of 380 nm, the addition of different thermal curing agents does affect the light transmittance of the full aliphatic organosilicon-modified polyimide. The organosilicon-modified polyimide itself has a poorer transmittance to the light having a short wavelength (380 nm) than to the light having a long wavelength (450 nm). However, the extent of the difference varies with the addition of different thermal curing agents. For example, when the thermal curing agent KF105 is added to the full aliphatic organosilicon-modified polyimide, the extent of the reduction in the light transmittance is less. In comparison, when the thermal curing agent 2021p is added to the full aliphatic organosilicon-modified polyimide, the extent of the reduction in the light transmittance is more. Accordingly, in an embodiment, if the LED chips used in the LED filament have a uniform quality, and emit less blue light having a short wavelength, the thermal curing agent BPA or the thermal curing agent 2021p may be added. In comparison, in an embodiment, if the LED chips used in the LED filament have different qualities, and emit more blue light having a short wavelength, the thermal curing agent KF105 may be used. Both Table 1-1 and Table 1-2 show the results obtained in the transmittance test using Shimadzu UV-Vis Spectrometer UV-1800. The light transmittances at wavelengths 380 nm, 410 nm and 450 nm are tested based on the light emission of white LEDs.

Even when the same thermal curing agent is added, different added amount thereof will have different effects on the light transmittance. Table 1-2 shows that when the added amount of the thermal curing agent BPA to the full aliphatic organosilicon-modified polyimide is increased from 4% to 8%, the light transmittance increases. However, when the added amount is further increased to 12%, the light transmittance keeps almost constant. It is shown that the light transmittance increases with the increase of the added amount of the thermal curing agent, but after the light transmittance increases to certain degree, adding more thermal curing agent will have limited effect on the light transmittance.

Different heat dispersing particles would have different transmittances. If heat dispersing particles with low light transmittance or low light reflection are used, the light transmittance of the organosilicon-modified polyimide resin composition will be lower. The heat dispersing particles in the organosilicon-modified polyimide resin composition of the present disclosure are preferably selected to be transparent powders or particles with high light transmittance or high light reflection. Since the soft filament for the LED is mainly for the light emission, the filament substrate should have good light transmittance. In addition, when two or more types of heat dispersing particles are mixed, particles with high light transmittance and those with low light transmittance can be used in combination, wherein the proportion of particles with high light transmittance is higher than that of particles with low light transmittance. In an embodiment, for example, the weight ratio of particles with high light transmittance to particles with low light transmittance is 3~5:1.

Different siloxane content also affects the light transmittance. As can be seen from Table 2, when the siloxane content is only 37 wt %, the light transmittance is only 85%. When the siloxane content is increase to above 45%, the light transmittance exceeds 94%.

TABLE 1-1

| Organosilicon-Modified Polyimides | Thermal Curing Agent | | Light Transmittance (%) | | | Mechanical Strength | | |
|---|---|---|---|---|---|---|---|---|
| | Types | Amount (%) | 380 nm | 410 nm | 450 nm | Film Thickness (μm) | Elongation (%) | Tensile Strength (MPa) |
| Full Aliphatic | BPA | 8.0 | 87.1 | 89.1 | 90.6 | 44 | 24.4 | 10.5 |
| Full Aliphatic | X22-163 | 8.0 | 86.6 | 88.6 | 90.2 | 44 | 43.4 | 8.0 |
| Full Aliphatic | KF105 | 8.0 | 87.2 | 88.9 | 90.4 | 44 | 72.6 | 7.1 |
| Full Aliphatic | EHPE3150 | 8.0 | 87.1 | 88.9 | 90.5 | 44 | 40.9 | 13.1 |
| Full Aliphatic | 2021p | 8.0 | 86.1 | 88.1 | 90.1 | 44 | 61.3 | 12.9 |

TABLE 1-2

| Organosilicon-Modified Polyimide | Thermal Curing Agent | | Light Transmittance (%) | | | Mechanical Strength | | |
|---|---|---|---|---|---|---|---|---|
| | Type | Amount (%) | 380 nm | 410 nm | 450 nm | Film Thickness (mm) | Elongation (%) | Tensile Strength (MPa) |
| Full Aliphatic | BPA | 4.0 | 86.2 | 88.4 | 89.7 | 44 | 22.5 | 9.8 |
| Full Aliphatic | | 8.0 | 87.1 | 89.1 | 90.6 | 44 | 24.4 | 10.5 |
| Full Aliphatic | | 12.0 | 87.3 | 88.9 | 90.5 | 44 | 20.1 | 9.0 |

TABLE 2

| Organosilicon-Modified Polyimide | Siloxane Content (wt %) | Thermal Curing Agent | Tg (° C.) | Tensile Strength (MPa) | Elastic Modulus (GPa) | Elongation at Break (%) | Transmittance | Chemical Resistance | Resistance to Thermochromism |
|---|---|---|---|---|---|---|---|---|---|
| 1 | 37 | BPA | 158 | 33.2 | 1.7 | 10 | 85 | Δ | 83 |
| 2 | 41 | BPA | 142 | 38.0 | 1.4 | 12 | 92 | ○ | 90 |
| 3 | 45 | BPA | 145 | 24.2 | 1.1 | 15 | 97 | Δ | 90 |
| 4 | 64 | BPA | 30 | 8.9 | 0.04 | 232 | 94 | ○ | 92 |
| 5 | 73 | BPA | 0 | 1.8 | 0.001 | 291 | 96 | ○ | 95 |

Heat Resistance

The factors affecting the heat resistance of the organosilicon-modified polyimide resin composition include at least the type of the main material, the siloxane content, and the type and content of the modifier (thermal curing agent).

All the organosilicon-modified polyimide resin composition synthesized from fluorinated aromatic, semi-aliphatic and, full aliphatic organosilicon-modified polyimide have superior heat resistance, and are suitable for producing the filament substrate or the light-conversion layer. Detailed results from the accelerated heat resistance and aging tests (300° C.×1 hr) show that the fluorinated aromatic organosilicon-modified polyimide has better heat resistance than the aliphatic organosilicon-modified polyimide. Accordingly, in an embodiment, if a high power, high brightness LED chip is used as the LED filament, the fluorinated aromatic organosilicon-modified polyimide may be used to produce the filament substrate or the light-conversion layer.

The siloxane content in the organosilicon-modified polyimide will affect the resistance to thermochromism of the organosilicon-modified polyimide resin composition. The resistance to thermochromism refers to the transmittance determined at 460 nm after placing the sample at 200° C. for 24 hours. As can be seen from Table 2, when the siloxane content is only 37 wt %, the light transmittance after 24 hours at 200° C. is only 83%. As the siloxane content is increased, the light transmittance after 24 hours at 200° C. increases gradually. When the siloxane content is 73 wt %, the light transmittance after 24 hours at 200° C. is still as high as 95%. Accordingly, increasing the siloxane content can effectively increase the resistance to thermochromism of the organosilicon-modified polyimide.

Figure 6:
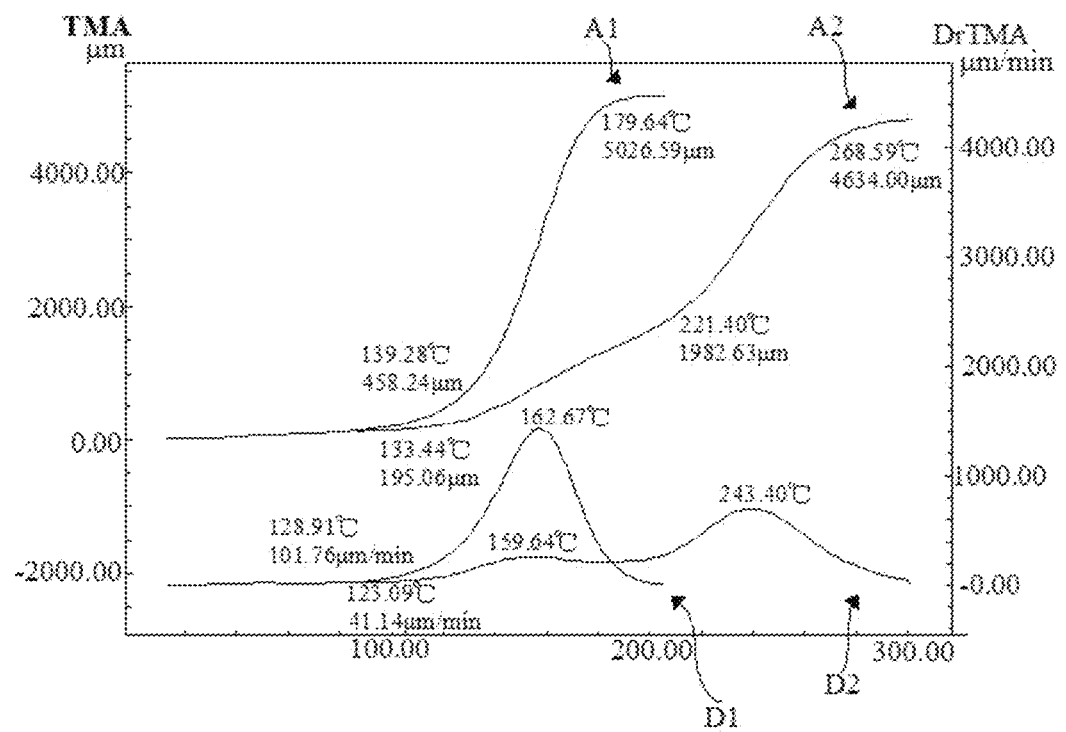
FIG. 6 shows the TMA analysis of the polyimide before and after adding the thermal curing agent.

Adding a thermal curing agent can lead to increased heat resistance and glass transition temperature. As shown in FIGS. 6, A1 and A2 represent the curves before and after adding the thermal curing agent, respectively; and the curves D1 and D2 represent the values after differential computation on curves A1 and A2, respectively, representing the extent of the change of curves A1 and A2. As can be seen from the analysis results from TMA (thermomechanical analysis) shown in FIG. 6, the addition of the thermal curing agent leads to a trend that the thermal deformation slows down. Accordingly, adding a thermal curing agent can lead to increase of the heat resistance.

In the cross-linking reaction between the organosilicon-modified polyimide and the thermal curing agent, the thermal curing agent should have an organic group which is capable of reacting with the functional group having active hydrogen in the polyimide. The amount and type of the thermal curing agent have certain effects on chromism, mechanical property and refractive index of the substrate. Accordingly, a thermal curing agent with good heat resistance and transmittance can be selected. Examples of the thermal curing agent include epoxy resin, isocyanate, bismaleimide, and bisoxazoline compounds. The epoxy resin may be bisphenol A epoxy resin, such as BPA; or siloxane-type epoxy resin, such as KF105, X22-163, and X22-163A; or alicylic epoxy resin, such as 3,4-epoxycyclohexylmethyl3,4-epoxycyclohexanecarboxylate (2021P), EHPE-3150, and EHPE3150CE. Through the bridging reaction by the epoxy resin, a three dimensional bridge structure is formed between the organosilicon-modified polyimide and the epoxy resin, increasing the structural strength of the adhesive itself. In an embodiment, the amount of the thermal curing agent may be determined according to the molar amount of the thermal curing agent reacting with the functional group having active hydrogen in the organosilicon-modified polyimide. In an embodiment, the molar amount of the functional group having active hydrogen reacting with the thermal curing agent is equal to that of the thermal curing agent. For example, when the molar amount of the functional group having active hydrogen reacting with the thermal curing agent is 1 mol, the molar amount of the thermal curing agent is 1 mol.

Thermal Conductivity

The factors affecting the thermal conductivity of the organosilicon-modified polyimide resin composition include at least the type and content of the phosphor, the type and content of the heat dispersing particles and the addition and the type of the coupling agent. In addition, the particle size and the particle size distribution of the heat dispersing particles would also affect the thermal conductivity.

The organosilicon-modified polyimide resin composition may also comprise phosphor for obtaining the desired light-emitting properties. The phosphor can convert the wavelength of the light emitted from the light-emitting semiconductor. For example, yellow phosphor can convert blue light to yellow light, and red phosphor can convert blue light to red light. Examples of yellow phosphor include transparent phosphor such as $(Ba,Sr,Ca)_2SiO_4$:Eu, and $(Sr,Ba)_2SiO_4$:Eu (barium orthosilicate (BOS)); silicate-type phosphor having a silicate structure such as $Y_3Al_5O_{12}$:Ce(YAG(yttrium.aluminum.garnet):Ce), and $Tb_3Al_3O_{12}$:Ce(YAG(terbium.aluminum.garnet):Ce); and oxynitride phosphor such as Ca-α-SiAlON. Examples of red phosphor include nitride phosphor, such as $CaAlSiN_3$:Eu, and $CaSiN_2$:Eu. Examples of green phosphor include rare earth-halide phosphor, and silicate phosphor. The ratio of the phosphor in the organosilicon-modified polyimide resin composition may be determined arbitrarily according to the desired light-emitting property. In addition, since the phosphor have a thermal conductivity which is significantly higher than that of the organosilicon-modified polyimide resin, the thermal conductivity of the organosilicon-modified polyimide resin composition as a whole will increase as the ratio of the phosphor in the organosilicon-modified polyimide resin composition increases. Accordingly, in an embodiment, as long as the light-emitting property is fulfilled, the content of the phosphor can be suitably increased to increase the thermal conductivity of the organosilicon-modified polyimide resin composition, which is beneficial to the heat dissipation of the filament substrate or the light-conversion layer. Furthermore, when the organosilicon-modified polyimide resin composition is used as the filament substrate, the content, shape and particle size of the phosphor in the organosilicon-modified polyimide resin composition also have certain effect on the mechanical property (such as the elastic modulus, elongation, tensile strength) and the warpage extent of the substrate. In order to render superior mechanical property and thermal conductivity as well as small warpage extent to the substrate, the phosphor included in the organosilicon-modified polyimide resin composition are particulate, and the shape thereof may be sphere, plate or needle, preferably sphere. The maximum average length of the phosphor (the average particle size when they are spherical) is above 0.1 μm, preferably over 1 μm, further preferably 1~100 μm, and more preferably 1~50 μm. The content of phosphor is no less than 0.05 times, preferably no less than 0.1 times, and no more than 8 times, preferably no more than 7 times, the weight of the organosilicon-modified polyimide. For example, when the weight of the organosilicon-modified polyimide is 100 parts in weight, the content of the phosphor is no less than 5 parts in weight, preferably no less than 10 parts in weight, and no more than 800 parts in weight, preferably no more than 700 parts in weight. When the content of the phosphor in the organosilicon-modified polyimide resin composition exceeds 800 parts in weight, the mechanical property of the organosilicon-modified polyimide resin composition may not achieve the strength as required for a filament substrate, resulting in the increase of the defective rate of the product. In an embodiment, two kinds of phosphor are added at the same time. For example, when red phosphor and green phosphor are added at the same time, the added ratio of red phosphor to green phosphor is 1:5~8, preferably 1:6~7. In another embodiment, red phosphor and yellow phosphor are added at the same time, wherein the added ratio of red phosphor to yellow phosphor is 1:5~8, preferably 1:6~7. In another embodiment, three or more kinds of phosphor are added at the same time.

The main purposes of adding the heat dispersing particles are to increase the thermal conductivity of the organosilicon-modified polyimide resin composition, to maintain the color temperature of the light emission of the LED chip, and to prolong the service life of the LED chip. Examples of the heat dispersing particles include silica, alumina, magnesia, magnesium carbonate, aluminum nitride, boron nitride and diamond. Considering the dispersity, silica, alumina or combination thereof is preferably. The shape of the heat dispersing particles may be sphere, block, etc., where the sphere shape encompasses shapes which are similar to sphere. In an embodiment, heat dispersing particles may be in a shape of sphere or non-sphere, to ensure the dispersity of the heat dispersing particles and the thermal conductivity of the substrate, wherein the added weight ratio of the spherical and non-spherical heat dispersing particles is 1:0.15~0.35.

Table 3-1 shows the relationship between the content of the heat dispersing particles and the thermal conductivity of the organosilicon-modified polyimide resin composition. As the content of the heat dispersing particles increases, the thermal conductivity of the organosilicon-modified polyimide resin composition increases. However, when the content of the heat dispersing particles in the organosilicon-modified polyimide resin composition exceeds 1200 parts in weight, the mechanical property of the organosilicon-modified polyimide resin composition may not achieve the strength as required for a filament substrate, resulting in the increase of the defective rate of the product. In an embodiment, high content of heat dispersing particles with high light transmittance or high reflectivity (such as $SiO_2$, $Al_2O_3$) may be added, which, in addition to maintaining the transmittance of the organosilicon-modified polyimide resin composition, increases the heat dissipation of the organosilicon-modified polyimide resin composition. The heat conductivities shown in Tables 3-1 and 3-2 were measured by a thermal conductivity meter DRL-III manufactured by Xiangtan city instruments Co., Ltd. under the following test conditions: heating temperature: 90° C.; cooling temperature: 20° C.; load: 350N, after cutting the resultant organosilicon-modified polyimide resin composition into test pieces having a film thickness of 300 μm and a diameter of 30 mm.

TABLE 3-1

| Weight Ratio [wt %] | 0.0% | 37.9% | 59.8% | 69.8% | 77.6% | 83.9% | 89.0% |
| Volume Ratio [vol %] | 0.0% | 15.0% | 30.0% | 40.0% | 50.0% | 60.0% | 70.0% |
| Thermal Conductivity [W/m * K] | 0.17 | 0.20 | 0.38 | 0.54 | 0.61 | 0.74 | 0.81 |

TABLE 3-2

| Specification | 1 | 2 | 3 | 4 | 5 | 6 | 7 |
| --- | --- | --- | --- | --- | --- | --- | --- |
| Average Particle Size [μm] | 2.7 | 6.6 | 9.0 | 9.6 | 13 | 4.1 | 12 |
| Particle Size Distribution [μm] | 1~7 | 1~20 | 1~30 | 0.2~30 | 0.2~110 | 0.1~20 | 0.1~100 |
| Thermal Conductivity [W/m * K] | 1.65 | 1.48 | 1.52 | 1.86 | 1.68 | 1.87 | 2.10 |

Figure 7:
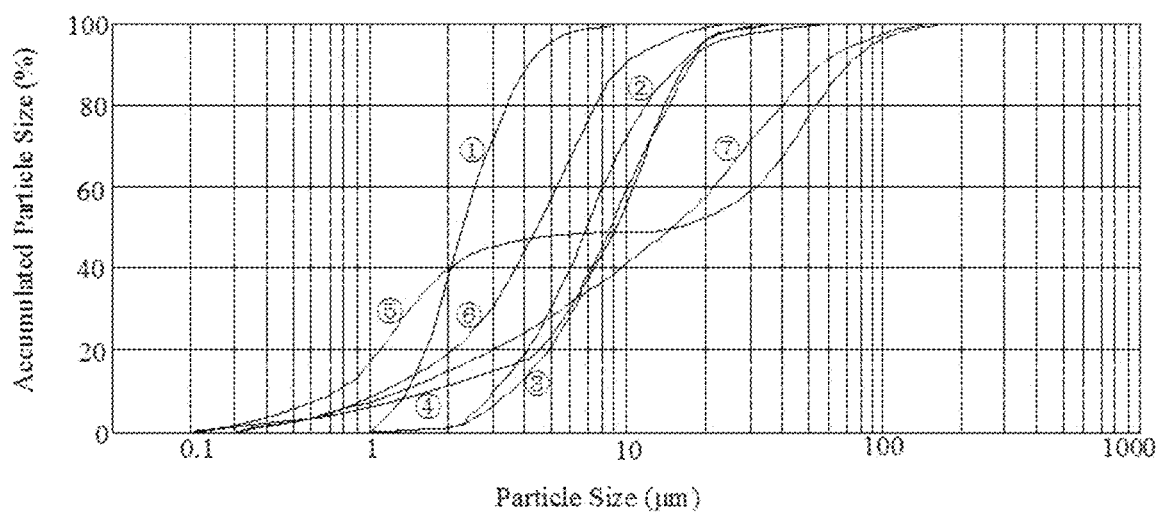
FIG. 7 shows the particle size distributions of the heat dispersing particles with different specifications.

For the effects of the particle size and the particle size distribution of the heat dispersing particles on the thermal conductivity of the organosilicon-modified polyimide resin composition, see both Table 3-2 and FIG. 7. Table 3-2 and FIG. 7 show seven heat dispersing particles with different specifications added into the organosilicon-modified polyimide resin composition in the same ratio and their effects on the thermal conductivity. The particle size of the heat dispersing particles suitable to be added to the organosilicon-modified polyimide resin composition can be roughly classified as small particle size (less than 1 μm), medium particle size (1-30 μm) and large particle size (above 30 μm).

Comparing specifications 1, 2 and 3, wherein only heat dispersing particles with medium particle size but different average particle sizes are added, when only heat dispersing particles with medium particle size are added, the average particle size of the heat dispersing particles does not significantly affect the thermal conductivity of the organosilicon-modified polyimide resin composition. Comparing specifications 3 and 4, wherein the average particle sizes are similar, the specification 4 comprising small particle size and medium particle size obviously exhibits higher thermal conductivity than specification 3 comprising only medium particle size. Comparing specifications 4 and 6, which comprise heat dispersing particles with both small particle size and medium particle size, although the average particle sizes of the heat dispersing particles are different, they have no significant effect on the thermal conductivity of the organosilicon-modified polyimide resin composition. Comparing specifications 4 and 7, specification 7, which comprises heat dispersing particles with large particle size in addition to small particle size and medium particle size, exhibits the most excellent thermal conductivity. Comparing specifications 5 and 7, which both comprise heat dispersing particles with large, medium and small particle sizes and have similar average particle sizes, the thermal conductivity of specification 7 is significant superior to that of specification 5 due to the difference in the particle size distribution. See FIG. 7 for the particle size distribution of specification 7, the curve is smooth, and the difference in the slope is small, showing that specification 7 not only comprises each particle size, but also have moderate proportions of each particle size, and the particle size is normally distributed. For example, the small particle size represents about 10%, the medium particle size represents about 60%, and the large particle size represents about 30%. In contrast, the curve for specification 5 has two regions with large slopes, which locate in the region of particle size 1-2 µm and particle size 30-70 µm, respectively, indicating that most of the particle size in specification 5 is distributed in particle size 1-2 µm and particle size 30-70 µm, and only small amount of heat dispersing particles with particle size 3-20 µm are present, i.e. exhibiting a two-sided distribution.

Accordingly, the extent of the particle size distribution of the heat dispersing particles affecting the thermal conductivity is greater than that of the average particle size of the heat dispersing particles. When large, medium and small particle sizes of the heat dispersing particles are added, and the small particle size represents about 5-20%, the medium particle size represents about 50-70%, and large particle size represents about 20-40%, the organosilicon-modified polyimide resin will have optimum thermal conductivity. That is because when large, medium and small particle sizes are present, there would be denser packing and contacting each other of heat dispersing particles in a same volume, so as to form an effective heat dissipating route.

In an embodiment, for example, alumina with a particle size distribution of 0.1~100 µm and an average particle size of 12 µm or with a particle size distribution of 0.1~20 µm and an average particle size of 4.1 µm is used, wherein the particle size distribution is the range of the particle size of alumina. In another embodiment, considering the smoothness of the substrate, the average particle size may be selected as 1/5~2/5, preferably 1/5~1/3 of the thickness of the substrate. The amount of the heat dispersing particles may be 1~12 times the weight (amount) of the organosilicon-modified polyimide. For example, if the amount of the organosilicon-modified polyimide is 100 parts in weight, the amount of the heat dispersing particles may be 100~1200 parts in weight, preferably 400~900 parts in weight. Two different heat dispersing particles such as silica and alumina may be added at the same time, wherein the weight ratio of alumina to silica may be 0.4~25:1, preferably 1~10:1.

In the synthesis of the organosilicon-modified polyimide resin composition, a coupling agent such as a silicone coupling agent may be added to improve the adhesion between the solid material (such as the phosphor and/or the heat dispersing particles) and the adhesive material (such as the organosilicon-modified polyimide), and to improve the dispersion uniformity of the whole solid materials, and to further improve the heat dissipation and the mechanical strength of the light-conversion layer. The coupling agent may also be titanate coupling agent, preferably epoxy titanate coupling agent. The amount of the coupling agent is related to the amount of the heat dispersing particles and the specific surface area thereof. The amount of the coupling agent=(the amount of the heat dispersing particles*the specific surface area of the heat dispersing particles)/the minimum coating area of the coupling agent. For example, when an epoxy titanate coupling agent is used, the amount of the coupling agent=(the amount of the heat dispersing particles*the specific surface area of the heat dispersing particles)/331.5.

In other specific embodiments of the present invention, in order to further improve the properties of the organosilicon-modified polyimide resin composition in the synthesis process, an additive such as a defoaming agent, a leveling agent or an adhesive may be selectively added in the process of synthesizing the organosilicon-modified polyimide resin composition, as long as it does not affect light resistance, mechanical strength, heat resistance and chromism of the product. The defoaming agent is used to eliminate the foams produced in printing, coating and curing. For example, acrylic acid or silicone surfactants may be used as the defoaming agent. The leveling agent is used to eliminate the bumps in the film surface produced in printing and coating. Specifically, adding preferably 0.01~2 wt % of a surfactant component can inhibit foams. The coating film can be smoothened by using acrylic acid or silicone leveling agents, preferably non-ionic surfactants free of ionic impurities. Examples of the adhesive include imidazole compounds, thiazole compounds, triazole compounds, organoaluminum compounds, organotitanium compounds and silane coupling agents. Preferably, the amount of these additives is no more than 10% of the weight of the organosilicon-modified polyimide. When the mixed amount of the additive exceeds 10 wt %, the physical properties of the resultant coating film tend to decline, and it even leads to deterioration of the light resistance due to the presence of the volatile components.

Mechanical Strength

The factors affecting the mechanical strength of the organosilicon-modified polyimide resin composition include at least the type of the main material, the siloxane content, the type of the modifier (thermal curing agent), the phosphor and the content of the heat dispersing particles.

Different organosilicon-modified polyimide resins have different properties. Table 4 lists the main properties of the fluorinated aromatic, semi-aliphatic and full aliphatic organosilicon-modified polyimide, respectively, with a siloxane content of about 45% (wt %). The fluorinated aromatic has the best resistance to thermo chromism. The full aliphatic has the best light transmittance. The fluorinated aromatic has both high tensile strength and high elastic modulus. The conditions for testing the mechanical strengths shown in Table 4~6: the organosilicon-modified polyimide resin composition has a thickness of 50 µm and a width of 10 mm, and the tensile strength of the film is determined according to ISO527-3:1995 standard with a drawing speed of 10 mm/min.

TABLE 4

| Organosilicon-Modified Polyimide | Siloxane Content (wt %) | Thermal Curing Agent | Tensile Strength (MPa) | Elastic Modulus (GPa) | Elongation at Break (%) | Transmittance | Resistance to Thermochromism |
|---|---|---|---|---|---|---|---|
| Fluorinated Aromatic | 44 | X22-163 | 22.4 | 1.0 | 83 | 96 | 95 |
| Semi-Aliphatic | 44 | X22-163 | 20.4 | 0.9 | 30 | 96 | 91 |
| Full Aliphatic | 47 | X22-163 | 19.8 | 0.8 | 14 | 98 | 88 |

TABLE 5

| Siloxane Content (wt %) | Addition of Phosphor, Alumina | Thermal Curing Agent | Tg (° C.) | Tensile Strength (MPa) | Elastic Modulus (GPa) | Elongation at Break (%) | Transmittance | Chemical Resistance | Resistance to Thermochromism |
|---|---|---|---|---|---|---|---|---|---|
| 37 | x | BPA | 158 | 33.2 | 1.7 | 10 | 85 | Δ | 83 |
| 37 | o | BPA | — | 26.3 | 5.1 | 0.7 | — | — | — |
| 41 | x | BPA | 142 | 38.0 | 1.4 | 12 | 92 | o | 90 |
| 41 | o | BPA | — | 19.8 | 4.8 | 0.8 | — | — | — |
| 45 | x | BPA | 145 | 24.2 | 1.1 | 15 | 97 | Δ | 90 |
| 45 | o | BPA | — | 21.5 | 4.2 | 0.9 | — | — | — |
| 64 | x | BPA | 30 | 8.9 | 0.04 | 232 | 94 | o | 92 |
| 64 | o | BPA | — | 12.3 | 3.1 | 1.6 | — | — | — |
| 73 | x | BPA | 0 | 1.8 | 0.001 | 291 | 96 | o | 95 |
| 73 | o | BPA | — | 9.6 | 2.5 | 2 | — | — | — |

TABLE 6

| Organosilicon-Modified Polyimide | Thermal Curing Agent | | Transmittance (%) | | | | Mechanical Strength | |
|---|---|---|---|---|---|---|---|---|
| | Type | Amount (%) | 380 nm | 410 nm | 450 nm | Film Thickness (μm) | Elongation (%) | Tensile Strength (MPa) |
| Full Aliphatic | BPA | 8.0 | 87.1 | 89.1 | 90.6 | 44 | 24.4 | 10.5 |
| Full Aliphatic | X22-163 | 8.0 | 86.6 | 88.6 | 90.2 | 40 | 43.4 | 8.0 |
| Full Aliphatic | KF105 | 12.0 | 87.5 | 89.2 | 90.8 | 43 | 80.8 | 7.5 |
| Full Aliphatic | EHPE3150 | 7.5 | 87.1 | 88.9 | 90.5 | 44 | 40.9 | 13.1 |
| Full Aliphatic | 2021p | 5.5 | 86.1 | 88.1 | 90.1 | 44 | 64.0 | 12.5 |

In the manufacture of the filament, the LED chip and the electrodes are first fixed on the filament substrate formed by the organosilicon-modified polyimide resin composition with a die bonding glue, followed by a wiring procedure, in which electric connections are established between adjacent LED chips and between the LED chip and the electrode with wires. To ensure the quality of die bonding and wiring, and to improve the product quality, the filament substrate should have a certain level of elastic modulus to resist the pressing force in the die bonding and wiring processes. Accordingly, the filament substrate should have an elastic modulus more than 2.0 GPa, preferably 2~6 GPa, more preferably 4~6 GPa. Table 5 shows the effects of different siloxane contents and the presence of particles (phosphor and alumina) on the elastic modulus of the organosilicon-modified polyimide resin composition. Where no fluorescent powder or alumina particle is added, the elastic modulus of the organosilicon-modified polyimide resin composition is always less than 2.0 GPa, and as the siloxane content increases, the elastic modulus tends to decline, i.e. the organosilicon-modified polyimide resin composition tends to soften. However, where phosphor and alumina particles are added, the elastic modulus of the organosilicon-modified polyimide resin composition may be significantly increased, and is always higher than 2.0 GPa. Accordingly, the increase in the siloxane content may lead to softening of the organosilicon-modified polyimide resin composition, which is advantageous for adding more fillers, such as more phosphor or heat dispersing particles. In order for the substrate to have superior elastic modulus and thermal conductivity, appropriate particle size distribution and mixing ratio may be selected so that the average particle size is within the range from 0.1 μm to 100 μm or from 1 μm to 50 μm.

In order for the LED filament to have good bending properties, the filament substrate should have an elongation at break of more than 0.5%, preferably 1~5%, most preferably 1.5~5%. As shown in Table 5, where no fluorescent powder or alumina particle is added, the organosilicon-modified polyimide resin composition has excellent elongation at break, and as the siloxane content increases, the elongation at break increases and the elastic modulus decreases, thereby reducing the occurrence of warpage. In contrast, where phosphor and alumina particles are added, the organosilicon-modified polyimide resin composition exhibits decreased elongation at break and increased elastic modulus, thereby increasing the occurrence of warpage.

By adding a thermal curing agent, not only the heat resistance and the glass transition temperature of the organosilicon-modified polyimide resin are increased, the mechanical properties, such as tensile strength, elastic modulus and elongation at break, of the organosilicon-modified polyimide are also increased. Adding different thermal curing agents may lead to different levels of improvement. Table 6 shows the tensile strength and the elongation at break of the organosilicon-modified polyimide resin composition after the addition of different thermal curing agents. For the full aliphatic organosilicon-modified polyimide, the addition of the thermal curing agent EHPE3150 leads to good tensile strength, while the addition of the thermal curing agent KF105 leads to good elongation.

TABLE 7

Specific Information of BPA

| Product Name | Viscosity at 25° C. (mPa · s) | Color (G) | Content of Hydrolysable Chlorine (mg/kg) | Equivalent of Epoxy (g/mol) | Hue APHA |
|---|---|---|---|---|---|
| BPA | 11000~15000 | ≤1 | ≤300 | 184~194 | ≤30 |

TABLE 8

Specific Information of 2021P

| Product Name | Viscosity at 25° C. (mPa · s) | Specific Gravity (25/25° C.) | Melting Point (° C.) | Boiling Point (° C./4 hPa) | Water Content (%) | Equivalent of Epoxy (g/mol) | Hue APHA |
|---|---|---|---|---|---|---|---|
| 2021P | 250 | 1.17 | −20 | 188 | 0.01 | 130 | 10 |

TABLE 9

Specific Information of EHPE3150 and EHPE3150CE

| Product Name | Viscosity at 25° C. (mPa · s) | Appearance | Softening Point | Equivalent of Epoxy (g/mol) | Hue APHA |
|---|---|---|---|---|---|
| EHPE3150 | — | Transparent Plate Solid | 75 | 177 | 20 (in 25% acetone solution) |
| EHPE3150CE | 50,000 | Light Yellow Transparent Liquid | — | 151 | 60 |

TABLE 10

Specific Information of PAME, KF8010, X22-161A, X22-161B, NH15D, X22-163, X22-163A and KF-105

| Product Name | Viscosity at 25° C. (mm2/s) | Specific Gravity at 25° C. | Refractive Index at 25° C. | Equivalent of Functional Group |
|---|---|---|---|---|
| PAME | 4 | 0.90 | 1.448 | 130 g/mol |
| KF8010 | 12 | 1.00 | 1.418 | 430 g/mol |
| X22-161A | 25 | 0.97 | 1.411 | 800 g/mol |
| X22-161B | 55 | 0.97 | 1.408 | 1500 g/mol |
| NH15D | 13 | 0.95 | 1.403 | 1.6~2.1 g/mmol |
| X22-163 | 15 | 1.00 | 1.450 | 200 g/mol |
| X22-163A | 30 | 0.98 | 1.413 | 1000 g/mol |
| KF-105 | 15 | 0.99 | 1.422 | 490 g/mol |

The organosilicon-modified polyimide resin composition of the present embodiment may be used in a form of film or as a substrate together with a support to which it adheres. The film forming process comprises three steps: (a) coating step: spreading the above organosilicon-modified polyimide resin composition on a peelable body by coating to form a film; (b) heating and drying step: heating and drying the film together with the peelable body to remove the solvent from the film; and (c) peeling step: peeling the film from the peelable body after the drying is completed to give the organosilicon-modified polyimide resin composition in a form of film. The above peelable body may be a centrifugal film or other materials which do not undergo chemical reaction with the organosilicon-modified polyimide resin composition, e.g., PET centrifugal film.

The organosilicon-modified polyimide resin composition may be adhered to a support to give an assembly film, which may be used as the substrate. The process of forming the assembly film comprises two steps: (a) coating step: spreading the above organosilicon-modified polyimide resin composition on a support by coating to from an assembly film; and (b) heating and drying step: heating and drying the assembly film to remove the solvent from the film.

In the coating step, roll-to-roll coating devices such as roller coater, mold coating machine and blade coating machine, or simple coating means such as printing, inkjeting, dispensing and spraying may be used.

The drying method in the above heating and drying step may be drying in vacuum, drying by heating, or the like. The heating may be achieved by a heat source such as an electric heater or a heating media to produce heat energy and indirect convection, or by infrared heat radiation emitted from a heat source.

A film (composite film) with high thermal conductivity can be obtained from the above organosilicon-modified polyimide resin composition by coating and then drying and curing, so as to achieve any one or combination of the following properties: superior light transmittance, chemical resistance, heat resistance, thermal conductivity, film mechanical property and light resistance. The temperature and time in the drying and curing step may be suitably selected according to the solvent and the coated film thickness of the organosilicon-modified polyimide resin composition. The weight change of the organosilicon-modified polyimide resin composition before and after the drying and curing as well as the change in the peaks in the IR spectrum representing the functional groups in the thermal curing agent can be used to determine whether the drying and curing are completed. For example, when an epoxy resin is used as the thermal curing agent, whether the difference in the weight of the organosilicon-modified polyimide resin composition before and after the drying and curing is equal to the weight of the added solvent as well as the increase or decrease of the epoxy peak before and after the drying and curing are used to determine whether the drying and curing are completed.

Figure 8A:
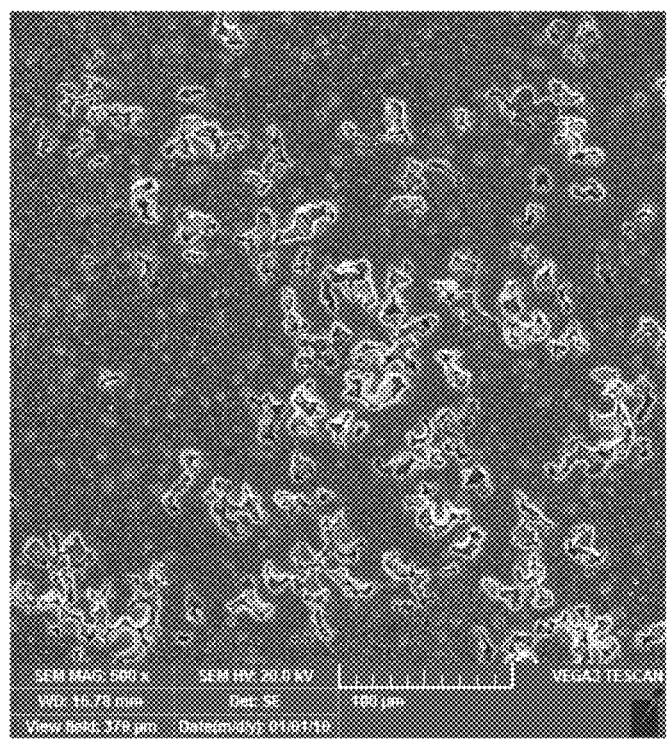
FIG. 8A shows the SEM image of an organosilicon-modified polyimide resin composition composite film (substrate)
Figure 8B:
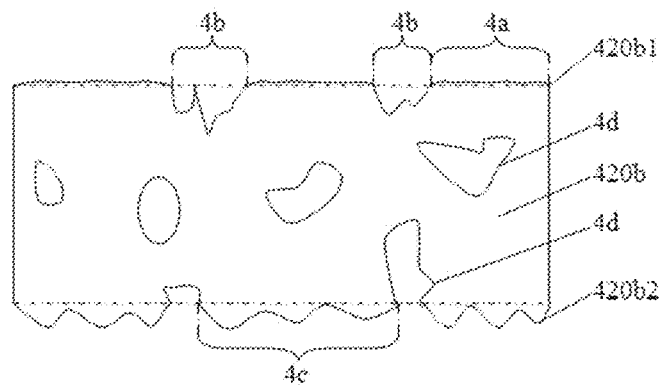
FIG. 8B shows the cross-sectional scheme of an organosilicon-modified polyimide resin composition composite film (substrate) according to an embodiment of the present invention.
Figure 8C:
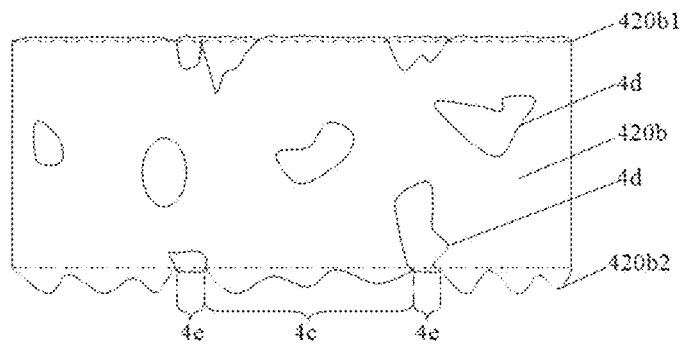
FIG. 8C shows the cross-sectional scheme of an organosilicon-modified polyimide resin composition composite film (substrate) according to another embodiment of the present disclosure.

In an embodiment, the amidation is carried out in a nitrogen atmosphere, or vacuum defoaming is employed in the synthesis of the organosilicon-modified polyimide resin composition, or both, so that the volume percentage of the cells in the organosilicon-modified polyimide resin composition composite film is 5~20%, preferably 5~10%. As shown in FIG. 8B, the organosilicon-modified polyimide resin composition composite film is used as the substrate for the LED soft filament. The substrate 420*b* has an upper surface 420*b*1 and an opposite lower surface 420*b*2. FIG. 8A shows the surface morphology of the substrate after gold is scattered on the surface thereof as observed with vega3 electron microscope from Tescan Corporation. As can be seen from FIG. 8B and the SEM image of the substrate surface shown in FIG. 8A, there is a cell 4*d* in the substrate, wherein the cell 4*d* represents 5~20% by volume, preferably 5~10% by volume, of the substrate 420*b*, and the cross section of the cell 4*d* is irregular. FIG. 8B shows the cross-sectional scheme of the substrate 420*b*, wherein the dotted line is the baseline. The upper surface 420*b*1 of the substrate comprises a first area 4*a* and a second area 4*b*, wherein the second area 4*b* comprises a cell 4*d*, and the first area 4*a* has a surface roughness which is less than that of the second area 4*b*. The light emitted by the LED chip passes through the cell in the second area and is scattered, so that the light emission is more uniform. The lower surface 420*b*2 of the substrate comprises a third area 4*c*, which has a surface roughness which is higher than that of the first area 4*a*. When the LED chip is positioned in the first area 4*a*, the smoothness of the first area 4*a* is favorable for subsequent bonding and wiring. When the LED chip is positioned in the second area 4*b* or the third area 4*c*, the area of contact between the die bonding glue and substrate is large, which improves the bonding strength between the die bonding glue and substrate. Therefore, by positioning the LED chip on the upper surface 420*b*1, bonding and wiring as well as the bonding strength between the die bonding glue and substrate can be ensured at the same time. When the organosilicon-modified polyimide resin composition is used as the substrate of the LED soft filament, the light emitted by the LED chip is scattered by the cell in the substrate, so that the light emission is more uniform, and glare can be further improved at the same time. In an embodiment, the surface of the substrate 420*b* may be treated with a silicone resin or a titanate coupling agent, preferably a silicone resin comprising methanol or a titanate coupling agent comprising methanol, or a silicone resin comprising isopropanol. The cross section of the treated substrate is shown in FIG. 8C. The upper surface 420*b*1 of the substrate has relatively uniform surface roughness. The lower surface 420*b*2 of the substrate comprises a third area 4*c* and a fourth area 4*e*, wherein the third area 4*c* has a surface roughness which is higher than that of the fourth area 4*e*. The surface roughness of the upper surface 420*b*1 of the substrate may be equal to that of the fourth area 4*e*. The surface of the substrate 420*b* may be treated so that a material with a high reactivity and a high strength can partially enter the cell 4*d*, so as to improve the strength of the substrate.

When the organosilicon-modified polyimide resin composition is prepared by vacuum defoaming, the vacuum used in the vacuum defoaming may be −0.5~−0.09 MPa, preferably ~0.2~−0.09 MPa. When the total weight of the raw materials used in the preparation of the organosilicon-modified polyimide resin composition is less than or equal to 250 g, the revolution speed is 1200~2000 rpm, the rotation speed is 1200~2000 rpm, and time for vacuum defoaming is 3~8 min. This not only maintains certain amount of cells in the film to improve the uniformity of light emission, but also keeps good mechanical properties. The vacuum may be suitably adjusted according to the total weight of the raw materials used in the preparation of the organosilicon-modified polyimide resin composition. Normally, when the total weight is higher, the vacuum may be reduced, while the stirring time and the stirring speed may be suitably increased.

According to the present disclosure, a resin having superior transmittance, chemical resistance, resistance to thermochromism, thermal conductivity, film mechanical property and light resistance as required for a LED soft filament substrate can be obtained. In addition, a resin film having a high thermal conductivity can be formed by simple coating methods such as printing, inkjeting, and dispensing.

When the organosilicon-modified polyimide resin composition composite film is used as the filament substrate (or base layer), the LED chip is a hexahedral luminous body. In the production of the LED filament, at least two sides of the LED chip are coated by a top layer. When the prior art LED filament is lit up, non-uniform color temperatures in the top layer and the base layer would occur, or the base layer would give a granular sense. Accordingly, as a filament substrate, the composite film is required to have superior transparency. In other embodiments, sulfonyl group, non-coplanar structure, meta-substituted diamine, or the like may be introduced into the backbone of the organosilicon-modified polyimide to improve the transparency of the organosilicon-modified polyimide resin composition. In addition, in order for the bulb employing said filament to achieve omnidirectional illumination, the composite film as the substrate should have certain flexibility. Therefore, flexible structures such as ether (such as (4,4'-bis(4-amino-2-trifluoromethylphenoxy)diphenyl ether), carbonyl, methylene may be introduced into the backbone of the organosilicon-modified polyimide. In other embodiments, a diamine or dianhydride comprising a pyridine ring may be employed, in which the rigid structure of the pyridine ring can improve the mechanical properties of the composite film. Meanwhile, by using it together with a strong polar group such as —F, the composite film may have superior light transmittance. Examples of the anhydride comprising a pyridine ring include 2,6-bis(3',4'-dicarboxyphenyl)-4-(3",5"-bistrifluoromethylphenyl)pyridine dianhydride.

The LED filament structure in the aforementioned embodiments is mainly applicable to the LED light bulb product, so that the LED light bulb can achieve the omnidirectional light illuminating effect through the flexible bending characteristics of the single LED filament. The specific embodiment in which the aforementioned LED filament applied to the LED light bulb is further explained below.

Figure 9A:
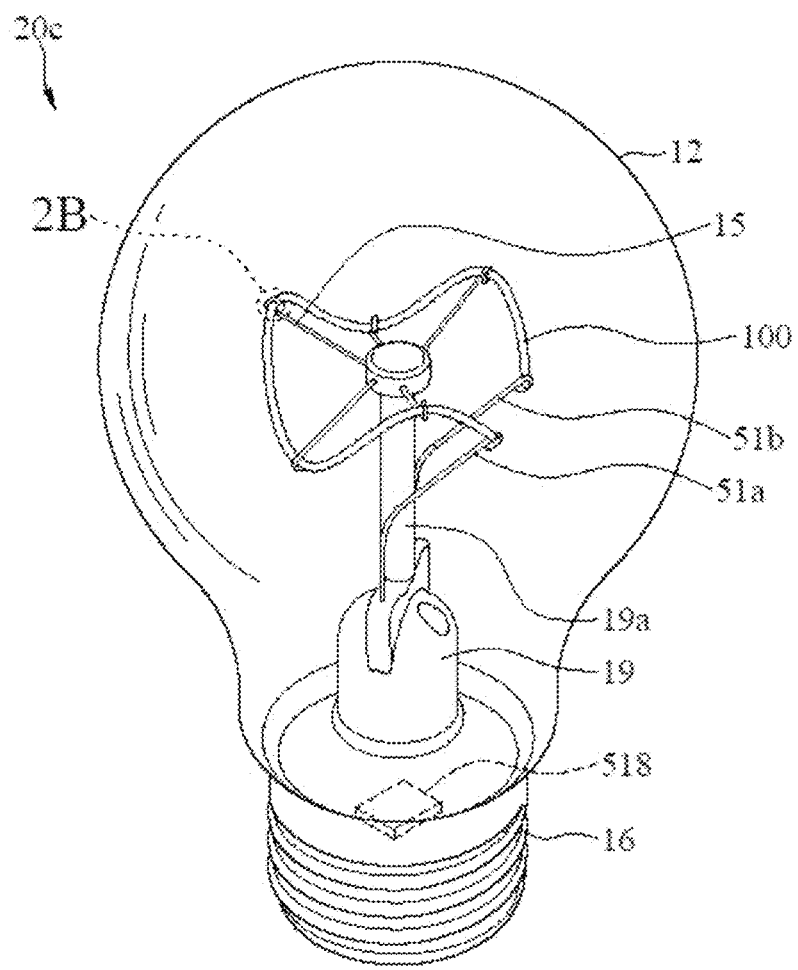
FIG. 9A illustrates a perspective view of an LED light bulb according to the third embodiment of the instant disclosure.

Please refer to FIG. 9A. FIG. 9A illustrates a perspective view of an LED light bulb according to the third embodiment of the present disclosure. According to the third embodiment, the LED light bulb 20*c* comprises a lamp housing 12, a bulb base 16 connected with the lamp housing 12, two conductive supports 51*a*, 51*b* disposed in the lamp housing 12, a driving circuit 518 electrically connected with both the conductive supports 51*a*, 51*b* and the bulb base 16, a stem 19, supporting arms 15 and a single LED filament 100.

The lamp housing 12 is a material which is preferably light transmissive or thermally conductive, such as, glass or plastic, but not limited thereto. In implementation, the lamp housing 12 may be doped with a golden yellow material or its surface coated with a yellow film to absorb a portion of the blue light emitted by the LED chip to reduce the color temperature of the light emitted by the LED light bulb 20*c*. In other embodiments of the present invention, the lamp housing 12 includes a layer of luminescent material (not shown), which may be formed on the inner surface or the outer surface of the lamp housing 12 according to design requirements or process feasibility, or even integrated in the material of the lamp housing 12. The luminescent material layer comprises low reabsorption semiconductor nanocrystals (hereinafter referred to as quantum dots), the quantum dots comprises a core, a protective shell and a light absorbing shell, and the light absorbing shell is disposed between the core and the protective shell. The core emits the emissive light with emission wavelength, and the light absorbing shell emits the excited light with excitation wavelength. The emission wavelength is longer than the excitation wavelength, and the protective shell provides the stability of the light.

The core is a semiconductor nanocrystalline material, typically the combination of at least of one metal and at least one non-metal. The core is prepared by combining a coation precursor(s) with an anion precursor(s). The metal for the core is most preferably selected from Zn, Cd, Hg, Ga, In, Ti, Pb or a rare earth. The non-metal is most preferably selected from O, S, Se, P, As or Te. The cationic precursor ion may include all transition metals and rare earth elements, and the anionic precursor ions may be choosen from O, S, Se, Te, N, P, As, F, CL, and Br. Furthermore, cationic precursors may include elements or compounds, such as elements, covalent compounds, or ionic compounds, including but are not limited to, oxides, hydroxides, coordination compounds, or metal salts, which serves as a source for the electropositive element or elements in the resulting nanocrystal core or shell materials.

The cationic precursor solution may include a metal oxide, a metal halide, a metal nitride, a metal ammonia complex, a metal amine, a metal amide, a metal imide, a metal carboxylate, a metal acetylacetonate, a metal dithiolate, a metal carbonyl, a metal cyanide, a metal isocyanide, a metal nitrile, a metal peroxide, a metal hydroxide, a metal hydride, a metal ether complex, a metal diether complex, a metal triether compound, a metal carbonate, a metal nitrate, a metal nitrite, a metal sulfate, a metal alkoxide, a metal siloxide, a metal thiolate, a metal dithiolate, a metal disulfide, a metal carbamate, a metal dialky carbamate, a metal pyridine complex, a metal dipyridine complex, a metal phenanthroline complex, a metal terpyridine complex, a metal diamine complex, a metal triamine complex, a metal diimine, a metal pyridine diimine, a metal pyrazollborate, a metal bis(pyrazole)borate, a metal tris(pyrazole)borate, a metal nitrosyl, a metal thiocarbamate, metal diazabutadiene, a metal dithiocarbamate, a metal dialkylacetamide, a metal dialkylformamide, a metal formamidinate, a metal phosphine complex, a metal arsine complex, a metal diphosphine complex, a metal diarsine complex, a metal oxalate, a metal imidazole, a metal pyrazolate, a metal Schiff base complex, a metal porphyrin, a metal phthalocyanine, a metal subphthalocyanine, a metal picolinate, a metal piperidine complex, a metal pyrazolyl, a metal salicylaldehyde, a metal ethylenediamine, a metal triflate compound or any combination thereof. Preferably, the cationic precursor solution may include a metal oxide, a metal carbonate, a metal bicarbonate, a metal sulfate, a metal sulfite, a metal phosphate, a metal phosphite, a metal halide, a metal carboxylate, a metal hydroxide, a metal alkoxide, a metal thiolate, a metal amide, a metal imide, a metal alkyl, a metal aryl, a metal coordination complex, a metal solvate, a metal salt or a combination thereof. Most preferably, the cationic precursor is a metal oxide or metal salt precursor and may be selected from zinc stearate, zinc myristate, zinc acetate, and manganese stearate.

Anionic precursors may also include elements, covalent compounds, or ionic compounds, which are used as one or more electronegative elements in the resulting nanocrystals. These definitions expect to be able to prepare ternary compounds, quaternary compounds and even more complex species using the methods disclosed in the present invention, in which case more than one cationic precursor and/or more than one anion precursor can be used. When two or more cationic elements are used during a given monolayer growth, if the other part of the nanocrystalline contains only a single cationic, the resulting nanocrystals have a cationic alloy at the specified single layer. The same method can be used to prepare nanocrystals with anionic alloys.

The above method is applicable to the core/shell nanocrystals prepared using a series of cationic precursor compounds of core and shell materials, for example, precursors of Group II metals (eg, Zn, Cd or Hg), precursors of Group III metals (eg, Al, Ga or In), a precursor of a Group IV metal (for example, Ge, Sn or Pb), or a transition metal (for example, Ti, Zr, Hf, V, Nb, Ta, Cr, Mo, W, Mn, Tc), Re, Fe, Ru, Os, Co, Rh, Ir, Ni, Pd, Pt, Cu, Ag, Au, etc.).

The components of the light absorbing shell may be the same or different from the composition of the core. Typically, the light absorbing shell material has the same lattice structure as the material selected for the core. For example, if CdSe is used as the emission region material, the absorption region material may be CdS. The light absorbing shell material is chosen to provide good absorption characteristics and can depend on the light source. For example, CdS can be a good choice for the absorption region when the excitation comes from a typical blue LED (within the wavelength range between 440 and 470 nm) solid state illumination. For example, if the excitation originates from a purple LED to produce a red LED by frequency down-conversion, then ZnSe or $ZnSe_xS_{1-x}$ (where x is greater than or equal to 0 and less than or equal to 1) is a preferred choice for the absorption region. As another example, if one wishes to obtain near-infrared emission from a quantum dot for bio-medical applications (700-1000 nm) by using a red light source, then CdSe and InP often work as the absorption region material.

The protected area (wide bandgap semiconductor or insulator) at the outermost outer shell of the quantum dot provides the desired chemical and optical stability to the quantum dots. In general, a protective shell (also known as a protected area) neither effectively absorbs light nor emits directional photons within the preferred excitation window described above. This is because it has a wide band gap. For example, ZnS and GaN are examples of protective shell materials. Metal oxides can also be utilized. In certain embodiments, an organic polymer can be used as a protective shell. The thickness of the protective shell is typically in the range between 1 and 20 monolayers. Moreover, the thickness can also be increased as needed, but this also increases production costs.

A light absorbing shell includes a plurality of mono layers that form a compositional gradient. For example, the light absorbing shell can include three components varying in a ratio of 1:0:1 in a mono layer located closest to the core to a ratio 0:1:1 in a mono layer located closest to the protective shell. By way of example, three useful components are Cd, Zn, and S and for instance, a mono layer closest to the core may have a component CdS (ratio 1:0:1), a mono layer closest to the protective shell may have a component corresponding to ZnS (Ratio 0:1:1), and the intermediate mono layer between the core and the protective shell may have a component corresponding to $ZnSe_xS_{1-x}$ having a ratio (X):

(1-X):1, and wherein X greater than or equal to 0 and less than or equal to 1. In this case, X is larger for a mono layer closer to the core than a mono layer that closer to the protective shell. In another embodiment, the transition shell consists of three components, the ratio from the single layer closest to the core to the single layer closest to the protective shell: 0.9:0.1:1, 0.8:0.2:1, 0.6:0.4:1, 0.4:0.6:1, and 0.2:0.8:1. Other combinations of Cd, Zn, S, and Se alloys can also be used as transition shells instead of $ZnSe_xS_{1-x}$ as long as they have suitable lattice matching parameters. In one embodiment, a suitable transition shell includes one shell having Cd, Zn, and S components and the following layers listed from the layer closest to the light absorbing shell to the layer closest to the protective shell: $Cd_{0.9}Zn_{0.1}S$, $Cd_{0.8}Zn_{0.2}S$, $Cd_{0.6}Zn_{0.4}S$, $Cd_{0.4}Zn_{0.6}S$, $Cd_{0.2}Zn_{0.8}S$.

The LED filament 100 shown in FIG. 9A is bent to form a contour resembling to a circle while being observed from the top view of FIG. 9A. According to the embodiment of FIG. 9A, the LED filament 100 is bent to form a wave shape from side view. The shape of the LED filament 100 is novel and makes the illumination more uniform. In comparison with a LED bulb having multiple LED filaments, single LED filament 100 has less connecting spots. In implementation, single LED filament 100 has only two connecting spots such that the probability of defect soldering or defect mechanical pressing is decreased.

The stem 19 has a stand 19a extending to the center of the bulb shell 12. The stand 19a supports the supporting arms 15. The first end of each of the supporting arms 15 is connected with the stand 19a while the second end of each of the supporting arms 15 is connected with the LED filament 100.

Figure 9B:
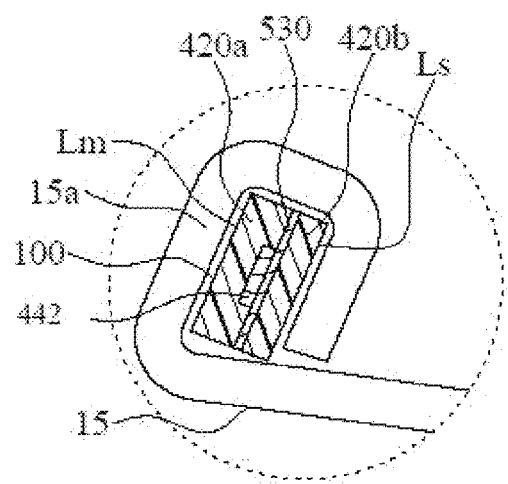
FIG. 9B illustrates an enlarged cross-sectional view of the dashed-line circle of FIG. 9A.

Please refer to FIG. 9B which illustrates an enlarged cross-sectional view of the dashed-line circle of FIG. 9A. The second end of each of the supporting arms 15 has a clamping portion 15a which clamps the body of the LED filament 100. The clamping portion 15a may, but not limited to, clamp at either the wave crest or the wave trough. Alternatively, the clamping portion 15a may clamp at the portion between the wave crest and the wave trough. The shape of the clamping portion 15a may be tightly fitted with the outer shape of the cross-section of the LED filament 100. The dimension of the inner shape (through hole) of the clamping portion 15a may be a little bit smaller than the outer shape of the cross-section of the LED filament 100. During manufacturing process, the LED filament 100 may be passed through the inner shape of the clamping portion 15a to form a tight fit. Alternatively, the clamping portion 15a may be formed by a bending process. Specifically, the LED filament 100 may be placed on the second end of the supporting arm 15 and a clamping tooling is used to bend the second end into the clamping portion to clamp the LED filament 100.

The supporting arms 15 may be, but not limited to, made of carbon steel spring to provide with adequate rigidity and flexibility so that the shock to the LED light bulb caused by external vibrations is absorbed and the LED filament 100 is not easily to be deformed. Since the stand 19a extending to the center of the bulb shell 12 and the supporting arms 15 are connected to a portion of the stand 19a near the top thereof, the position of the LED filaments 100 is at the level close to the center of the bulb shell 12. Accordingly, the illumination characteristics of the LED light bulb 20c are close to that of the traditional light bulb including illumination brightness. The illumination uniformity of LED light bulb 20c is better. In the embodiment, at least a half of the LED filaments 100 is around a center axle of the LED light bulb 20c. The center axle is coaxial with the axle of the stand 19a.

In the embodiment, the first end of the supporting arm 15 is connected with the stand 19a of the stem 19. The clamping portion of the second end of the supporting arm 15 is connected with the outer insulation surface of the LED filaments 100 such that the supporting arms 15 are not used as connections for electrical power transmission. In an embodiment where the stem 19 is made of glass, the stem 19 would not be cracked or exploded because of the thermal expansion of the supporting arms 15 of the LED light bulb 20c. Additionally, there may be no stand in an LED light bulb. The supporting arm 15 may be fixed to the stem or the bulb shell directly to eliminate the negative effect to illumination caused by the stand.

The supporting arm 15 is thus non-conductive to avoid a risk that the glass stem 19 may crack due to the thermal expansion and contraction of the metal filament in the supporting arm 15 under the circumstances that the supporting arm 15 is conductive and generates heat when current passes through the supporting arm 15.

In different embodiments, the second end of the supporting arm 15 may be directly inserted inside the LED filament 100 and become an auxiliary piece in the LED filament 100, which can enhance the mechanical strength of the LED filament 100. Relative embodiments are described later.

The inner shape (the hole shape) of the clamping portion 15a fits the outer shape of the cross section of the LED filament 100; therefore, based upon a proper design, the cross section of the LED filament 100 may be oriented to face towards a predetermined orientation. For example, as shown in FIG. 9B, the LED filament 100 comprises a top layer 420a, LED chips 104, and a base layer 420b. The LED chips 104 are aligned in line along the axial direction (or an elongated direction) of the LED filament 100 and are disposed between the top layer 420a and the base layer 420b. The top layer 420a of the LED filament 100 is oriented to face towards ten o'clock in FIG. 9B. A lighting face of the whole LED filament 100 may be oriented to face towards the same orientation substantially to ensure that the lighting face of the LED filament 100 is visually identical. The LED filament 100 comprises a main lighting face Lm and a subordinate lighting face Ls corresponding to the LED chips. If the LED chips in the LED filament 100 are wire bonded and are aligned in line, a face of the top layer 420a away from the base layer 420b is the main lighting face Lm, and a face of the base layer 420b away from the top layer 420a is the subordinate lighting face Ls. The main lighting face Lm and the subordinate lighting face Ls are opposite to each other. When the LED filament 100 emits light, the main lighting face Lm is the face through which the largest amount of light rays passes, and the subordinate lighting face Ls is the face through which the second largest amount of light rays passes. In the embodiment, there is, but is not limited to, a conductive foil 530 formed between the top layer 420a and the base layer 420b, which is utilized for electrical connection between the LED chips. In the embodiment, the LED filament 100 wriggles with twists and turns while the main lighting face Lm is always towards outside. That is to say, any portion of the main lighting face Lm is towards the bulb shell 12 or the bulb base 16 and is away from the stem 19 at any angle, and the subordinate lighting face Ls is always towards the stem 19 or towards the top of the stem 19 (the subordinate lighting face Ls is always towards inside).

The LED filament 100 shown in FIG. 9A is curved to form a circular shape in a top view while the LED filament is curved to form a wave shape in a side view. The wave shaped structure is not only novel in appearance but also guarantees that the LED filament 100 illuminates evenly. In the meantime, the single LED filament 100, comparing to multiple LED filaments, requires less joint points (e.g., pressing points, fusing points, or welding points) for being connected to the conductive supports 51a, 51b. In practice, the single LED filament 100 (as shown in FIG. 9A) requires only two joint points respectively formed on the two conductive electrodes, which effectively lowers the risk of fault welding and simplifies the process of connection comparing to the mechanically connection in the tightly pressing manner.

Figure 9C:
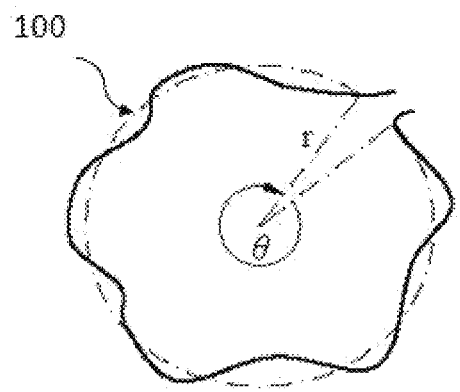
FIG. 9C is a projection of a top view of an LED filament of the LED light bulb of FIG. 9A.

Please refer to FIG. 9C. FIG. 9C is a projection of a top view of an LED filament of the LED light bulb 20c of FIG. 9A. As shown in FIG. 9C, in an embodiment, the LED filament may be curved to form a wave shape resembling to a circle observed in a top view to surround the center of the light bulb or the stem. In different embodiments, the LED filament observed in the top view can form a quasi-circle or a quasi U shape.

As shown in FIG. 9B and FIG. 9C, the LED filament 100 surrounds with the wave shape resembling to a circle and has a quasi-symmetric structure in the top view, and the lighting face of the LED filament 100 is also symmetric, e.g., the main lighting face Lm in the top view may faces outwardly; therefore, the LED filament 100 may generate an effect of an omnidirectional light due to a symmetry characteristic with respect to the quasi-symmetric structure of the LED filament 100 and the arrangement of the lighting face of the LED filament 100 in the top view. Whereby, the LED light bulb 20c as a whole may generate an effect of an omnidirectional light close to a 360 degrees illumination. Additionally, the two joint points may be close to each other such that the conductive supports 51a, 51b are substantially below the LED filament 100. Visually, the conductive supports 51a, 51b keeps a low profile and is integrated with the LED filament 100 to show an elegance curvature.

Figure 10A:
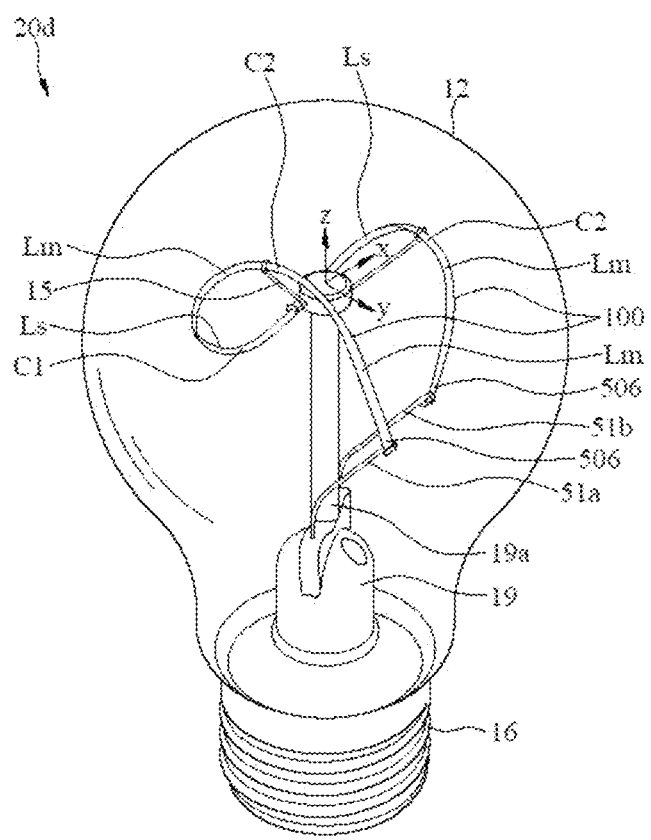
FIG. 10A is a perspective view of an LED light bulb according to an embodiment of the present invention.
Figure 10B:
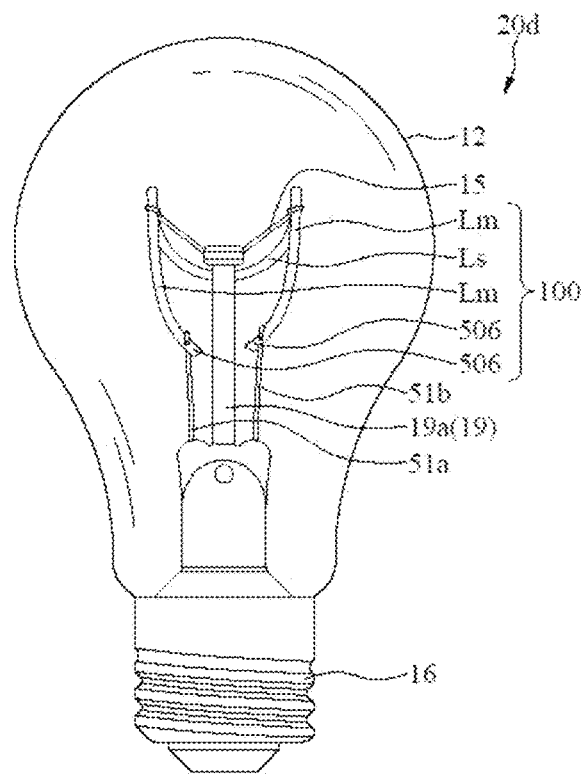
FIG. 10B is a front view of an LED light bulb of FIG. 10A.

Please refer to FIG. 10A and FIG. 10B. FIG. 10A is a perspective view of an LED light bulb according to an embodiment of the present invention. FIG. 10B is a front view (or a side view) of an LED light bulb of FIG. 10A. The LED light bulb 20d shown in FIG. 10A and FIG. 10B is analogous to the LED light bulb 20c shown in FIG. 9A. As shown in FIG. 10A and FIG. 10B, the LED light bulb 20d comprises a bulb shell 12, a bulb base 16 connected to the bulb shell 12, two conductive supports 51a, 51b disposed in the bulb shell 12, supporting arms 15, a stem 19, and one single LED filament 100. The stem 19 comprises a stem bottom and a stem top opposite to each other. The stem bottom is connected to the bulb base 16. The stem top extends to inside of the blub shell 12 (e.g., extending to the center of the bulb shell 12) along an elongated direction of the stem 19. For example, the stem top may be substantially located at a center of the inside of the bulb shell 12. In the embodiment, the stem 19 comprises the stand 19a. Herein the stand 19a is deemed as a part of the whole stem 19 and thus the top of the stem 19 is the same as the top of the stand 19a. The two conductive supports 51a, 51b are connected to the stem 19. The LED filament 100 comprises a filament body and two conductive electrodes 506. The two conductive electrodes 506 are at two opposite ends of the filament body. The filament body is the part of the LED filament 100 without the conductive electrodes 506. The two conductive electrodes 506 are respectively connected to the two conductive supports 51a, 51b. The filament body is around the stem 19. An end of the supporting arm 15 is connected to the stem 19 and another end of the supporting arm 15 is connected to the filament body.

Figure 10C:
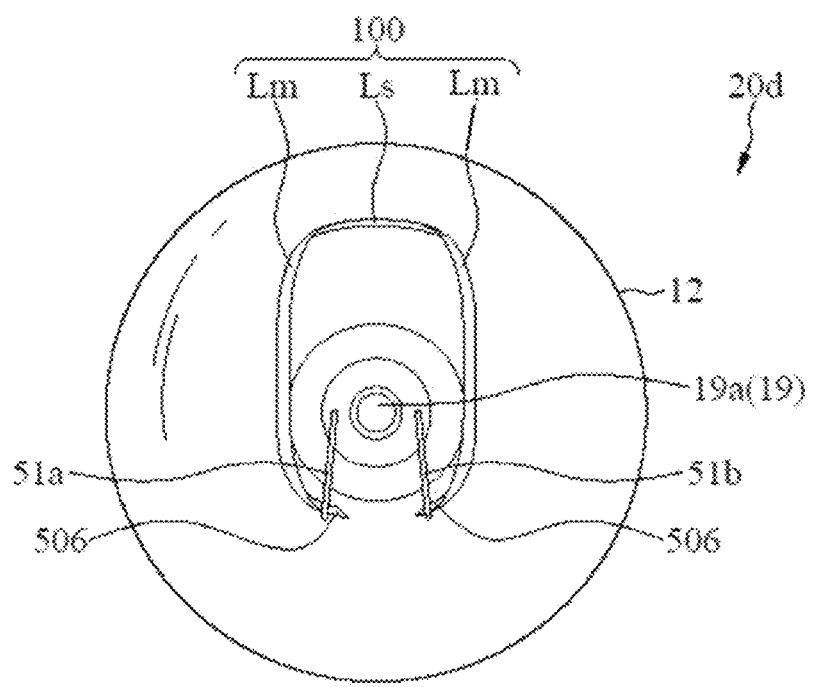
FIG. 10C is a top view of the LED light bulb of FIG. 10A.

Please refer to FIG. 10C. FIG. 10C is a top view of the LED light bulb 20d of FIG. 10A. As shown in FIG. 10B and FIG. 10C, the filament body comprises a main lighting face Lm and a subordinate lighting face Ls. Any portion of the main lighting face Lm is towards the bulb shell 12 or the bulb base 16 at any angle, and any portion of the subordinate lighting face Ls is towards the stem 19 or towards the top of the stem 19, i.e., the subordinate lighting face Ls is towards inside of the LED light bulb 20d or towards the center of the bulb shell 12. In other words, when a user observes the LED light bulb 20d from outside, the user would see the main lighting face Lm of the LED filament 100d at any angle. Based upon the configuration, the effect of illumination is better.

According to different embodiments, the LED filament 100 in different LED light bulbs (e.g., 20c, or 20d) may be formed with different shapes or curves while all of the LED filaments 100 are configured to have symmetry characteristic. The symmetry characteristic is beneficial of creating an even, wide distribution of light rays, so that the LED light bulb is capable of generating an omnidirectional light effect. The symmetry characteristic of the LED filament 100 is discussed below.

The definition of the symmetry characteristic of the LED filament 100 may be based on four quadrants defined in a top view of an LED light bulb. The four quadrants may be defined in a top view of an LED light bulb (e.g., the LED light bulb 20c shown in FIG. 9A), and the origin of the four quadrants may be defined as a center of a stem/stand of the LED light bulb in the top view (e.g., a center of the top of the stand 19a shown in FIG. 9A). The LED filament of the LED light bulb (e.g., the LED filaments 100 shown in FIG. 9A) in the top view may be presented as an annular structure, shape or, contour. The LED filament presented in the four quadrants in the top view may be symmetric.

For example, the brightness presented by a portion of the LED filament in the first quadrant in the top view is symmetric with that presented by a portion of the LED filament in the second quadrant, in the third quadrant, or in the fourth quadrant in the top view while the LED filament operates. In some embodiments, the structure of a portion of the LED filament in the first quadrant in the top view is symmetric with that of a portion of the LED filament in the second quadrant, in the third quadrant, or in the fourth quadrant in the top view. In addition, an emitting direction of a portion of the LED filament in the first quadrant in the top view is symmetric with that of a portion of the LED filament in the second quadrant, in the third quadrant, or in the fourth quadrant in the top view.

In another embodiment, an arrangement of LED chips in a portion of the LED filament in the first quadrant (e.g., a density variation of the LED chips in the portion of the LED filament in the first quadrant) in the top view is symmetric with an arrangement of LED chips in a portion of the LED filament in the second quadrant, in the third quadrant, or in the fourth quadrant in the top view.

In another embodiment, a power configuration of LED chips with different power in a portion of the LED filament in the first quadrant in the top view is symmetric with a power configuration of LED chips with different power in a portion of the LED filament in the second quadrant, in the third quadrant, or in the fourth quadrant in the top view.

In another embodiment, refractive indexes of segments of a portion of the LED filament in the first quadrant in the top view are symmetric with refractive indexes of segments of a portion of the LED filament in the second quadrant, in the third quadrant, or in the fourth quadrant in the top view while the segments may be defined by distinct refractive indexes.

In another embodiment, surface roughness of segments of a portion of the LED filament in the first quadrant in the top view are symmetric with surface roughness of segments of a portion of the LED filament in the second quadrant, in the third quadrant, or in the fourth quadrant in the top view while the segments may be defined by distinct surface roughness.

The LED filament presented in the four quadrants in the top view may be in point symmetry (e.g., being symmetric with the origin of the four quadrants) or in line symmetry (e.g., being symmetric with one of the two axis the four quadrants).

A tolerance (a permissible error) of the symmetric structure of the LED filament in the four quadrants in the top view may be up to 20%-50%. For example, in a case that the structure of a portion of the LED filament in the first quadrant is symmetric with that of a portion of the LED filament in the second quadrant, a designated point on portion of the LED filament in the first quadrant is defined as a first position, a symmetric point to the designated point on portion of the LED filament in the second quadrant is defined as a second position, and the first position and the second position may be exactly symmetric or be symmetric with 20%-50% difference.

In addition, a length of a portion of the LED filament in one of the four quadrants in the top view is substantially equal to that of a portion of the LED filament in another one of the four quadrants in the top view. The lengths of portions of the LED filament in different quadrants in the top view may also have 20%-50% difference.

The definition of the symmetry characteristic of the LED filament 100 may be based on four quadrants defined in a side view, in a front view, or in a rear view of an LED light bulb. In the embodiments, the side view may include a front view or a rear view of the LED light bulb. The four quadrants may be defined in a side view of an LED light bulb (e.g., the LED light bulb 20c shown in FIG. 9A). In such case, an elongated direction of a stand (or a stem) from the bulb base 16 towards a top of the bulb shell 12 away from the bulb base 16 may be defined as the Y-axis, and the X-axis may cross a middle of the stand (e.g., the stand 19a of the LED light bulb 20c shown in FIG. 9A) while the origin of the four quadrants may be defined as the middle of the stand. In different embodiment, the X-axis may cross the stand at any point, e.g., the X-axis may cross the stand at the top of the stand, at the bottom of the stand, or at a point with a certain height (e.g., ⅔ height) of the stand.

In addition, portions of the LED filament presented in the first quadrant and the second quadrant (the upper quadrants) in the side view may be symmetric (e.g., in line symmetry with the Y-axis) in brightness, and portions of the LED filament presented in the third quadrant and the fourth quadrant (the lower quadrants) in the side view may be symmetric (e.g., in line symmetry with the Y-axis) in brightness; however, the brightness of the portions of the LED filament presented in the upper quadrants in the side view may be asymmetric with that of the portions of the LED filament presented in the lower quadrants in the side view.

In some embodiments, portions of the LED filament presented in the first quadrant and the second quadrant (the upper quadrants) in the side view may be symmetric (e.g., in line symmetry with the Y-axis) in structure; portions of the LED filament presented in the third quadrant and the fourth quadrant (the lower quadrants) in the side view may be symmetric (e.g., in line symmetry with the Y-axis) in structure. In addition, an emitting direction of a portion of the LED filament in the first quadrant in the side view is symmetric with that of a portion of the LED filament in the second quadrant in the side view, and an emitting direction of a portion of the LED filament in the third quadrant in the side view is symmetric with that of a portion of the LED filament in the fourth quadrant in the side view.

In another embodiment, an arrangement of LED chips in a portion of the LED filament in the first quadrant in the side view is symmetric with an arrangement of LED chips in a portion of the LED filament in the second quadrant in the side view, and an arrangement of LED chips in a portion of the LED filament in the third quadrant in the side view is symmetric with an arrangement of LED chips in a portion of the LED filament in the fourth quadrant in the side view.

In another embodiment, a power configuration of LED chips with different power in a portion of the LED filament in the first quadrant in the side view is symmetric with a power configuration of LED chips with different power in a portion of the LED filament in the second quadrant in the side view, and a power configuration of LED chips with different power in a portion of the LED filament in the third quadrant in the side view is symmetric with a power configuration of LED chips with different power in a portion of the LED filament in the fourth quadrant in the side view.

In another embodiment, refractive indexes of segments of a portion of the LED filament in the first quadrant in the side view are symmetric with refractive indexes of segments of a portion of the LED filament in the second quadrant in the side view, and refractive indexes of segments of a portion of the LED filament in the third quadrant in the side view are symmetric with refractive indexes of segments of a portion of the LED filament in the fourth quadrant in the side view while the segments may be defined by distinct refractive indexes.

In another embodiment, surface roughness of segments of a portion of the LED filament in the first quadrant in the side view are symmetric with surface roughness of segments of a portion of the LED filament in the second quadrant in the side view, and surface roughness of segments of a portion of the LED filament in the third quadrant in the side view are symmetric with surface roughness of segments of a portion of the LED filament in the fourth quadrant in the side view while the segments may be defined by distinct surface roughness.

Additionally, the portions of the LED filament presented in the upper quadrants in the side view may be asymmetric with the portions of the LED filament presented in the lower quadrants in the side view in brightness. In some embodiments, the portion of the LED filament presented in the first quadrant and the fourth quadrant in the side view is asymmetric in structure, in length, in emitting direction, in arrangement of LED chips, in power configuration of LED chips with different power, in refractive index, or in surface roughness, and the portion of the LED filament presented in the second quadrant and the third quadrant in the side view is asymmetric in structure, in length, in emitting direction, in arrangement of LED chips, in power configuration of LED chips with different power, in refractive index, or in surface roughness. In order to fulfill the illumination purpose and the requirement of omnidirectional lamps, light rays emitted from the upper quadrants (the portion away from the bulb base 16) in the side view should be greater than those emitted from the lower quadrants (the portion close to the bulb base 16). Therefore, the asymmetric characteristic of the LED filament of the LED light bulb between the upper quadrants and the lower quadrants in the side view may contribute to the omnidirectional requirement by concentrating the light rays in the upper quadrants.

A tolerance (a permissible error) of the symmetric structure of the LED filament in the first quadrant and the second quadrant in the side view may be 20%-50%. For example, a designated point on portion of the LED filament in the first quadrant is defined as a first position, a symmetric point to the designated point on portion of the LED filament in the second quadrant is defined as a second position, and the first position and the second position may be exactly symmetric or be symmetric with 20%-50% difference.

In addition, a length of a portion of the LED filament in the first quadrant in the side view is substantially equal to that of a portion of the LED filament in the second quadrant in the side view. A length of a portion of the LED filament in the third quadrant in the side view is substantially equal to that of a portion of the LED filament in the fourth quadrant in the side view. However, the length of the portion of the LED filament in the first quadrant or the second quadrant in the side view is different from the length of the portion of the LED filament in the third quadrant or the fourth quadrant in the side view. In some embodiment, the length of the portion of the LED filament in the third quadrant or the fourth quadrant in the side view may be less than that of the portion of the LED filament in the first quadrant or the second quadrant in the side view. The lengths of portions of the LED filament in the first and the second quadrants or in the third and the fourth quadrants in the side view may also have 20%-50% difference.

Figure 10D:
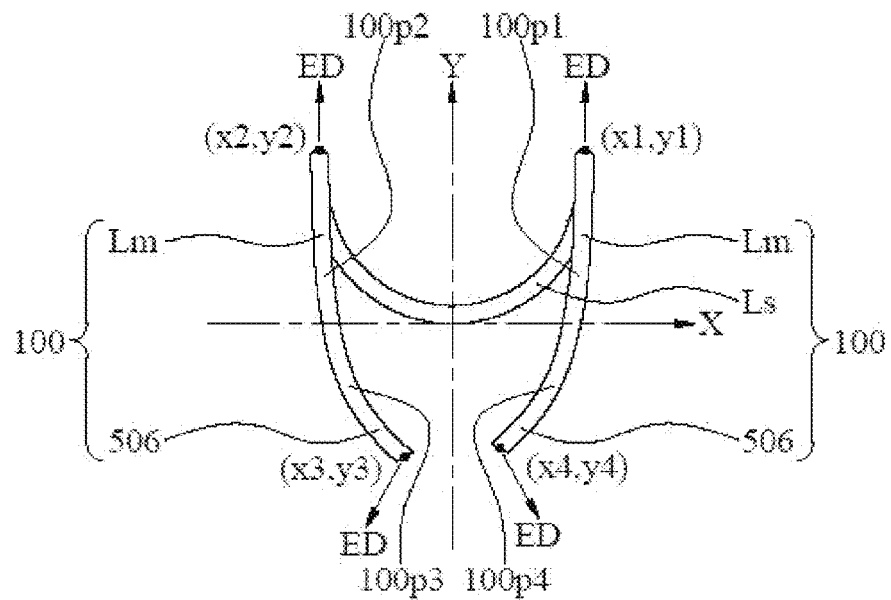
FIG. 10D is the LED filament shown in FIG. 10B presented in two dimensional coordinate system defining four quadrants.

Please refer to FIG. 10D. FIG. 10D is the LED filament 100 shown in FIG. 10B presented in two dimensional coordinate system defining four quadrants. The LED filament 100 in FIG. 10D is the same as that in FIG. 10B, which is a front view (or a side view) of the LED light bulb 20*d* shown in FIG. 10A. As shown in FIG. 10B and FIG. 10D, the Y-axis is aligned with the stand 19*a* of the stem (i.e., being along the elongated direction of the stand 19*a*), and the X-axis crosses the stand 19*a* (i.e., being perpendicular to the elongated direction of the stand 19*a*). As shown in FIG. 10D, the LED filament 100 in the side view can be divided into a first portion 100*p*1, a second portion 100*p*2, a third portion 100*p*3, and a fourth portion 100*p*4 by the X-axis and the Y-axis. The first portion 100*p*1 of the LED filament 100 is the portion presented in the first quadrant in the side view. The second portion 100*p*2 of the LED filament 100 is the portion presented in the second quadrant in the side view. The third portion 100*p*3 of the LED filament 100 is the portion presented in the third quadrant in the side view. The fourth portion 100*p*4 of the LED filament 100 is the portion presented in the fourth quadrant in the side view.

As shown in FIG. 10D, the LED filament 100 is in line symmetry. The LED filament 100 is symmetric with the Y-axis in the side view. That is to say, the geometric shape of the first portion 100*p*1 and the fourth portion 100*p*4 are symmetric with that of the second portion 100*p*2 and the third portion 100*p*3. Specifically, the first portion 100*p*1 is symmetric to the second portion 100*p*2 in the side view. Particularly, the first portion 100*p*1 and the second portion 100*p*2 are symmetric in structure in the side view with respect to the Y-axis. In addition, the third portion 100*p*3 is symmetric to the fourth portion 100*p*4 in the side view. Particularly, the third portion 100*p*3 and the fourth portion 100*p*4 are symmetric in structure in the side view with respect to the Y-axis.

In the embodiment, as shown in FIG. 10D, the first portion 100*p*1 and the second portion 100*p*2 presented in the upper quadrants (i.e., the first quadrant and the second quadrant) in the side view are asymmetric with the third portion 100*p*3 and the fourth portion 100*p*4 presented in the lower quadrants (i.e., the third quadrant and the fourth quadrant) in the side view. In particular, the first portion 100*p*1 and the fourth portion 100*p*4 in the side view are asymmetric, and the second portion 100*p*2 and the third portion 100*p*3 in the side view are asymmetric. According to an asymmetry characteristic of the structure of the filament 100 in the upper quadrants and the lower quadrants in FIG. 10D, light rays emitted from the upper quadrants to pass through the upper bulb shell 12 (the portion away from the bulb base 16) would be greater than those emitted from the lower quadrants to pass through the lower bulb shell 12 (the portion close to the bulb base 16) in order to fulfill the illumination purpose and the requirement of omnidirectional lamps.

Based upon symmetry characteristic of LED filament 100, the structures of the two symmetric portions of the LED filament 100 in the side view (the first portion 100*p*1 and the second portion 100*p*2 or the third portion 100*p*3 and the fourth portion 100*p*4) may be exactly symmetric or be symmetric with a tolerance in structure. The tolerance (or a permissible error) between the structures of the two symmetric portions of the LED filament 100 in the side view may be 20%-50% or less.

The tolerance can be defined as a difference in coordinates, i.e., x-coordinate or y-coordinate. For example, if there is a designated point on the first portion 100*p*1 of the LED filament 100 in the first quadrant and a symmetric point on the second portion 100*p*2 of the LED filament 100 in the second quadrant symmetric to the designated point with respect to the Y-axis, the absolute value of y-coordinate or the x-coordinate of the designated point may be equal to the absolute value of y-coordinate or the x-coordinate of the symmetric point or may have 20% difference comparing to the absolute value of y-coordinate or the x-coordinate of the symmetric point.

For example, as shown in FIG. 10D, a designated point (x1, y1) on the first portion 100*p*1 of the LED filament 100 in the first quadrant is defined as a first position, and a symmetric point (x2, y2) on the second portion 100*p*2 of the LED filament 100 in the second quadrant is defined as a second position. The second position of the symmetric point (x2, y2) is symmetric to the first position of the designated point (x1, y1) with respect to the Y-axis. The first position and the second position may be exactly symmetric or be symmetric with 20%-50% difference. In the embodiment, the first portion 100*p*1 and the second portion 100*p*2 are exactly symmetric in structure. In other words, x2 of the symmetric point (x2, y2) is equal to negative x1 of the designated point (x1, y1), and y2 of the symmetric point (x2, y2) is equal to y1 of the designated point (x1, y1).

For example, as shown in FIG. 10D, a designated point (x3, y3) on the third portion 100*p*3 of the LED filament 100 in the third quadrant is defined as a third position, and a symmetric point (x4, y4) on the fourth portion 100*p*4 of the LED filament 100 in the fourth quadrant is defined as a fourth position. The fourth position of the symmetric point (x4, y4) is symmetric to the third position of the designated point (x3, y3) with respect to the Y-axis. The third position and the fourth position may be exactly symmetric or be symmetric with 20%-50% difference. In the embodiment, the third portion 100*p*3 and the fourth portion 100*p*4 are symmetric with a tolerance (e.g., a difference in coordinates being less than 20%) in structure. In other words, the absolute value of x4 of the symmetric point (x4, y4) is unequal to the absolute value of x3 of the designated point (x3, y3), and the absolute value of y4 of the symmetric point (x4, y4) is unequal to the absolute value of y3 of the designated point (x3, y3). As shown in FIG. 10D, the level of the designated point (x3, y3) is slightly lower than that of the symmetric point (x4, y4), and the designated point (x3, y3) is slightly closer to the Y-axis than the symmetric point (x4, y4) is. Accordingly, the absolute value of y4 is slightly less than that of y3, and the absolute value of x4 is slightly greater than that of x3.

As shown in FIG. 10D, a length of the first portion 100p1 of the LED filament 100 in the first quadrant in the side view is substantially equal to a length of the second portion 100p2 of the LED filament 100 in the second quadrant in the side view. In the embodiment, the length is defined along an elongated direction of the LED filament 100 in a plane view (e.g., a side view, a front view, or a top view). For example, the first portion 100p1 elongates in the first quadrant in the side view shown in FIG. 10D to form a reversed "V" shape with two ends respectively contacting the X-axis and the Y-axis, and the length of the first portion 100p1 is defined along the reversed "V" shape between the X-axis and the Y-axis.

In addition, a length of the third portion 100p3 of the LED filament 100 in the third quadrant in the side view is substantially equal to a length of fourth portion 100p4 of the LED filament 100 in the fourth quadrant in the side view. Since the third portion 100p3 and the fourth portion 100p4 are symmetric with respect to the Y-axis with a tolerance in structure, there may be a slightly difference between the length of the third portion 100p3 and the length of fourth portion 100p4. The difference may be 20%-50% or less.

As shown in FIG. 10D, an emitting direction of a designated point of the first portion 100p1 and an emitting direction of a symmetric point of the second portion 100p2 symmetric to the designated point are symmetric in direction in the side view with respect to the Y-axis. In the embodiment, the emitting direction may be defined as a direction towards which the LED chips face. Since the LED chips face the main lighting face Lm, the emitting direction may also be defined as the normal direction of the main lighting face Lm. For example, the designated point (x1, y1) of the first portion 100p1 has an emitting direction ED which is upwardly in FIG. 10D, and the symmetric point (x2, y2) of the second portion 100p2 has an emitting direction ED which is upwardly in FIG. 10D. The emitting direction ED of the designated point (x1, y1) and the emitting direction ED of the symmetric point (x2, y2) are symmetric with respect to the Y-axis. In addition, the designated point (x3, y3) of the third portion 100p3 has an emitting direction ED towards a lower-left direction in FIG. 10D, and the symmetric point (x4, y4) of the fourth portion 100p4 has an emitting direction ED towards a lower-right direction in FIG. 10D. The emitting direction ED of the designated point (x3, y3) and the emitting direction ED of the symmetric point (x4, y4) are symmetric with respect to the Y-axis.

Figure 10E:
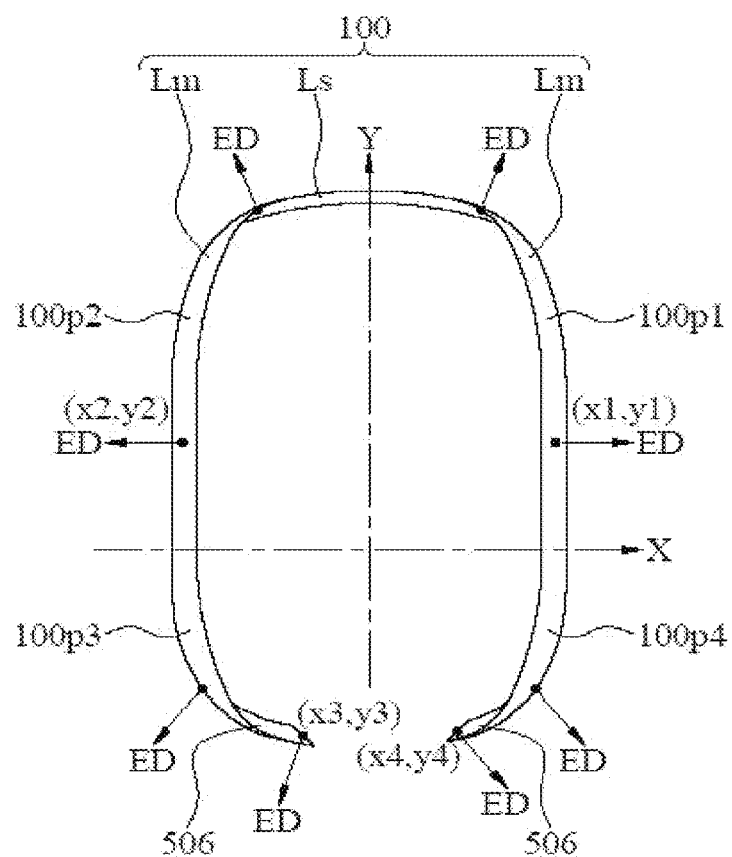
FIG. 10E is the LED filament shown in FIG. 10C presented in two dimensional coordinate system defining four quadrants.

Please refer to FIG. 10E. FIG. 10E is the LED filament 100 shown in FIG. 10C presented in two dimensional coordinate system defining four quadrants. The LED filament 100 in FIG. 10E is the same as that in FIG. 10C, which is a top view of the LED light bulb 20d shown in FIG. 10A. As shown in FIG. 10C and FIG. 10E, the origin of the four quadrants is defined as a center of a stand 19a of the LED light bulb 20d in the top view (e.g., a center of the top of the stand 19a shown in FIG. 10A). In the embodiment, the Y-axis is vertical, and the X-axis is horizontal in FIG. 10E. As shown in FIG. 10E, the LED filament 100 in the top view can be divided into a first portion 100p1, a second portion 100p2, a third portion 100p3, and a fourth portion 100p4 by the X-axis and the Y-axis. The first portion 100p1 of the LED filament 100 is the portion presented in the first quadrant in the top view. The second portion 100p2 of the LED filament 100 is the portion presented in the second quadrant in the top view. The third portion 100p3 of the LED filament 100 is the portion presented in the third quadrant in the top view. The fourth portion 100p4 of the LED filament 100 is the portion presented in the fourth quadrant in the top view.

In some embodiments, the LED filament 100 in the top view may be symmetric in point symmetry (being symmetric with the origin of the four quadrants) or in line symmetry (being symmetric with one of the two axis the four quadrants). In the embodiment, as shown in FIG. 10E, the LED filament 100 in the top view is in line symmetry. In particular, the LED filament 100 in the top view is symmetric with the Y-axis. That is to say, the geometric shape of the first portion 100p1 and the fourth portion 100p4 are symmetric with that of the second portion 100p2 and the third portion 100p3. Specifically, the first portion 100p1 is symmetric to the second portion 100p2 in the top view. Particularly, the first portion 100p1 and the second portion 100p2 are symmetric in structure in the top view with respect to the Y-axis. In addition, the third portion 100p3 is symmetric to the fourth portion 100p4 in the top view. Particularly, the third portion 100p3 and the fourth portion 100p4 are symmetric in structure in the top view with respect to the Y-axis.

Based upon symmetry characteristic of LED filament 100, the structures of the two symmetric portions of the LED filament 100 in the top view (the first portion 100p1 and the second portion 100p2 or the third portion 100p3 and the fourth portion 100p4) may be exactly symmetric or be symmetric with a tolerance in structure. The tolerance (or a permissible error) between the structures of the two symmetric portions of the LED filament 100 in the top view may be 20%-50% or less.

For example, as shown in FIG. 10E, a designated point (x1, y1) on the first portion 100p1 of the LED filament 100 in the first quadrant is defined as a first position, and a symmetric point (x2, y2) on the second portion 100p2 of the LED filament 100 in the second quadrant is defined as a second position. The second position of the symmetric point (x2, y2) is symmetric to the first position of the designated point (x1, y1) with respect to the Y-axis. The first position and the second position may be exactly symmetric or be symmetric with 20%-50% difference. In the embodiment, the first portion 100p1 and the second portion 100p2 are exactly symmetric in structure. In other words, x2 of the symmetric point (x2, y2) is equal to negative x1 of the designated point (x1, y1), and y2 of the symmetric point (x2, y2) is equal to y1 of the designated point (x1, y1).

For example, as shown in FIG. 10E, a designated point (x3, y3) on the third portion 100p3 of the LED filament 100 in the third quadrant is defined as a third position, and a symmetric point (x4, y4) on the fourth portion 100p4 of the LED filament 100 in the fourth quadrant is defined as a fourth position. The fourth position of the symmetric point (x4, y4) is symmetric to the third position of the designated point (x3, y3) with respect to the Y-axis. The third position and the fourth position may be exactly symmetric or be symmetric with 20%-50% difference. In the embodiment, the third portion 100p3 and the fourth portion 100p4 are symmetric with a tolerance (e.g., a difference in coordinates being less than 20%) in structure. In other words, x4 of the symmetric point (x4, y4) is unequal to negative x3 of the designated point (x3, y3), and y4 of the symmetric point (x4, y4) is unequal to y3 of the designated point (x3, y3). As shown in FIG. 10E, the level of the designated point (x3, y3) is slightly lower than that of the symmetric point (x4, y4), and the designated point (x3, y3) is slightly closer to the Y-axis than the symmetric point (x4, y4) is. Accordingly, the absolute value of y4 is slightly less than that of y3, and the absolute value of x4 is slightly greater than that of x3.

As shown in FIG. 10E, a length of the first portion 100p1 of the LED filament 100 in the first quadrant in the top view is substantially equal to a length of the second portion 100p2 of the LED filament 100 in the second quadrant in the top view. In the embodiment, the length is defined along an elongated direction of the LED filament 100 in a plane view (e.g., a top view, a front view, or a top view). For example, the second portion 100p2 elongates in the second quadrant in the top view shown in FIG. 10E to form a reversed "L" shape with two ends respectively contacting the X-axis and the Y-axis, and the length of the second portion 100p2 is defined along the reversed "L" shape.

In addition, a length of the third portion 100p3 of the LED filament 100 in the third quadrant in the top view is substantially equal to a length of fourth portion 100p4 of the LED filament 100 in the fourth quadrant in the top view. Since the third portion 100p3 and the fourth portion 100p4 are symmetric with respect to the Y-axis with a tolerance in structure, there may be a slightly difference between the length of the third portion 100p3 and the length of fourth portion 100p4. The difference may be 20%-50% or less.

As shown in FIG. 10E, an emitting direction of a designated point of the first portion 100p1 and an emitting direction of a symmetric point of the second portion 100p2 symmetric to the designated point are symmetric in direction in the top view with respect to the Y-axis. In the embodiment, the emitting direction may be defined as a direction towards which the LED chips face. Since the LED chips face the main lighting face Lm, the emitting direction may also be defined as the normal direction of the main lighting face Lm. For example, the designated point (x1, y1) of the first portion 100p1 has an emitting direction ED towards right in FIG. 10E, and the symmetric point (x2, y2) of the second portion 100p2 has an emitting direction ED towards left in FIG. 10E. The emitting direction ED of the designated point (x1, y1) and the emitting direction ED of the symmetric point (x2, y2) are symmetric with respect to the Y-axis. In addition, the designated point (x3, y3) of the third portion 100p3 has an emitting direction ED towards a lower-left direction in FIG. 10E, and the symmetric point (x4, y4) of the fourth portion 100p4 has an emitting direction ED towards a lower-right direction in FIG. 10E. The emitting direction ED of the designated point (x3, y3) and the emitting direction ED of the symmetric point (x4, y4) are symmetric with respect to the Y-axis. In addition, an emitting direction ED of any designated point of the first portion 100p1 and an emitting direction ED of a corresponding symmetric point of the second portion 100p2 symmetric to the designated point are symmetric in direction in the top view with respect to the Y-axis. An emitting direction ED of any designated point of the third portion 100p3 and an emitting direction ED of a corresponding symmetric point of the fourth portion 100p4 symmetric to the designated point are symmetric in direction in the top view with respect to the Y-axis.

Definition of the omni-directional light depends on regions and varies over time. Depending on different institutions and countries, LED light bulbs which claim omnidirectional light may need to meet different standards. For example, page 24 of the ENERGY STAR Program Requirements for Lamps (bulbs)—Eligibility Criteria Version 1.0 defines that an omnidirectional lamp in base-on position has to emit at least 5% of total flux (lm) in 135° to 180° zone, that 90% of measured intensity values may vary by no more than 25% from the average of all measured values in all planes, and that luminous intensity (cd) is measured within each vertical plane at a 5° vertical angle increment (maximum) from 0° to 135°. Japanese JEL 801 requires luminous flux of an LED lamp within a 120 degrees zone about a light axis shall not be less than 70% of total flux. Because the above embodiment possesses a symmetrical arrangement of LED filament, an LED light bulb with the LED filament is able to meet various standards of omni-directional lamps.

Figure 11A:
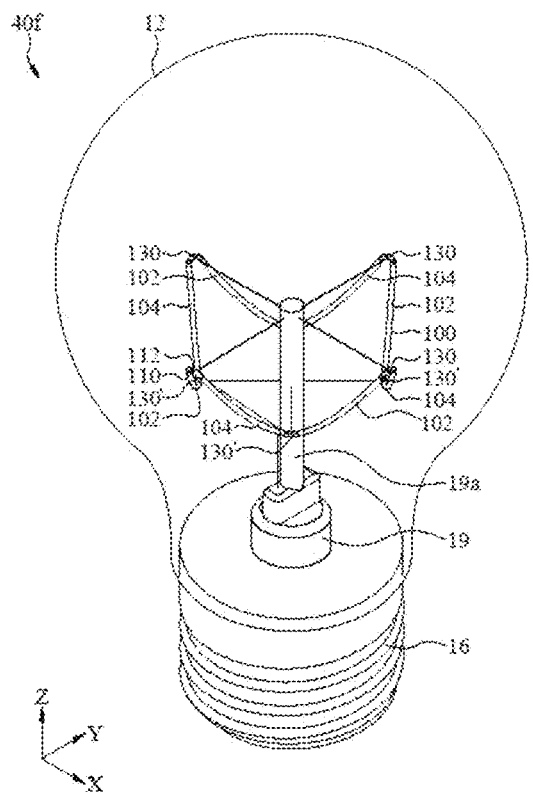
FIGS. 11A to 11D are respectively a perspective view, a side view, another side view and a top view of an LED light bulb in accordance with an embodiment of the present invention.
Figure 11B:
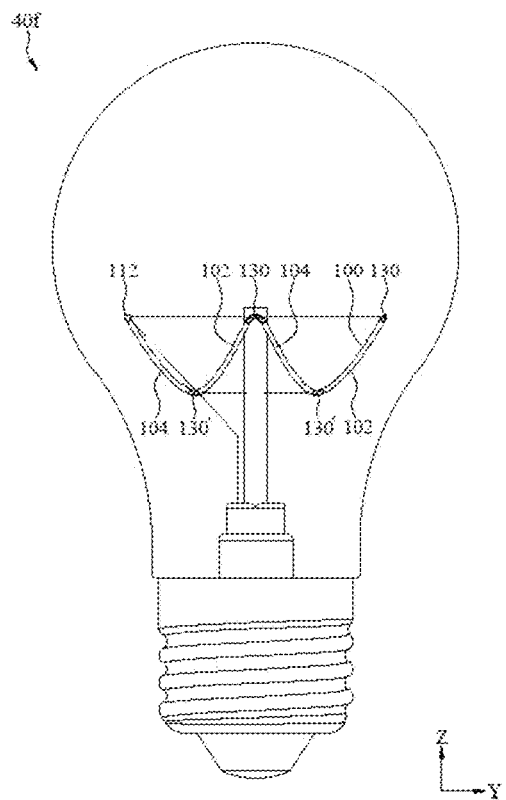
Figure 11C:
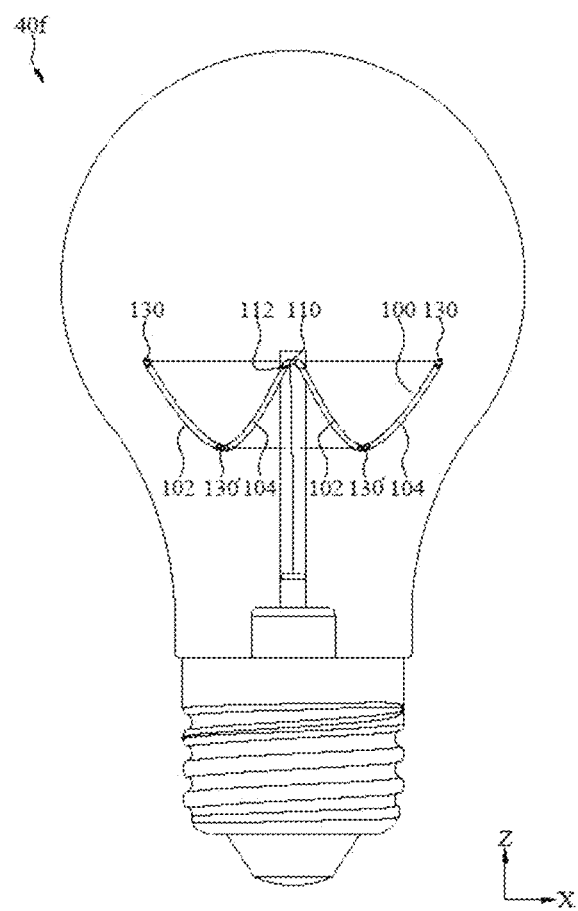
Figure 11D:
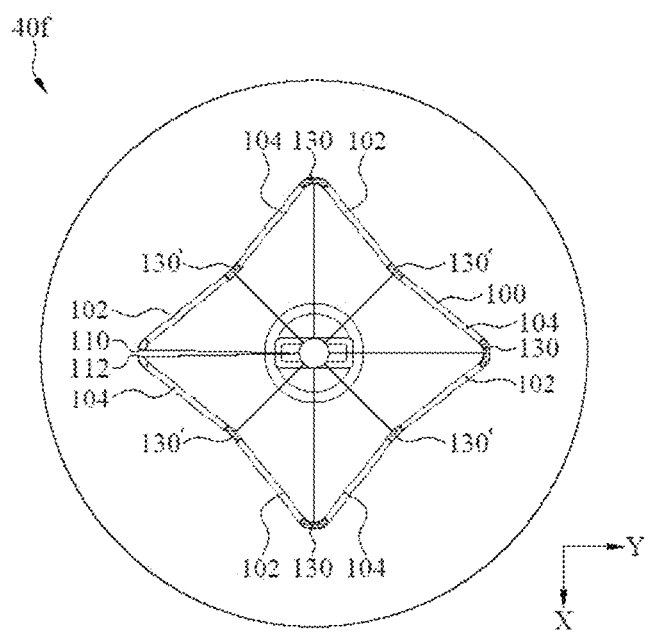

Referring to FIGS. 11A to 11D, FIG. 11A is a perspective diagram of an LED light bulb 40f according to an embodiment of the present invention, and FIGS. 11B to 11D are respectively side view, another side view, and top view of the FIG. 11A. In the present embodiment, the LED light bulb 40f includes a lamp housing 12, a bulb base 16 connected to the lamp housing 12, a stem 19, a stand 19a, and a single LED filament 100. The LED filament 100 includes two conductive electrodes 110, 112 disposed at two ends, a plurality of LED sections 102, 104 and a plurality of first and second conductive sections 130, 130'. Moreover, the LED light bulb 40f and the single LED filament 100 disposed in the LED light bulb 40f can refer to related descriptions of the previous embodiments, wherein the same or similar components and the connection relationship between components is no longer detailed.

As shown in FIGS. 11A to FIG. 11D, the LED filament 100 comprises three first conductive sections 130 and four second conductive sections 130', and eight LED sections 102, 104, and every two adjacent LED sections 102, 104 are connected by the bending first or second conductive sections 130, 130'. Therefore, the single LED filament 100 in the LED light bulb 40f can be bent severer because of the first and second conductive sections 130, 130', and the curling change in bending is more significant. Moreover, the LED filament 100 can be defined as having a plurality of sections, each of the sections is connected between the first and second conductive sections 130, 130', and each LED section 102, 104 is formed into a respective sections. In the present embodiment, the LED filament 100 is bent into eight sections by three conductive sections 130 and four second conductive sections 130', wherein the eight LED sections 102, 104 are respectively the eight sections.

Referring to FIG. 11A, FIG. 11B and FIG. 11C, in the present embodiment, the height of the upper three first conductive sections 130 may be greater than the height of the lower four second conductive sections 130' in the Z direction. The height of the six LED sections 102, 104 is between the upper first conductive section 130 and the lower second conductive section 130' in the Z direction. The other two LED sections 102, 104 extend upward from the corresponding second conductive section 130' in the Z direction, and the height of the conductive electrodes 110, 112 is approximately equal to the height of the upper second conductive section 130' in the Z direction. As shown in FIG. 11B and FIG. 11C of the present embodiment, the projections of the opposite LED sections 102, 104 are overlapped each other when the LED filament 100 is projected on the YZ plane (referring to FIG. 11B) or the XZ plane (referring to FIG. 11C). In the embodiment as shown in FIG. 11D, when the LED filament 100 is projected on the XY plane, all the projections of the first and second conductive sections 130, 130' are located in one side of a straight line connecting between the conductive electrodes 110, 112.

Figure 12:
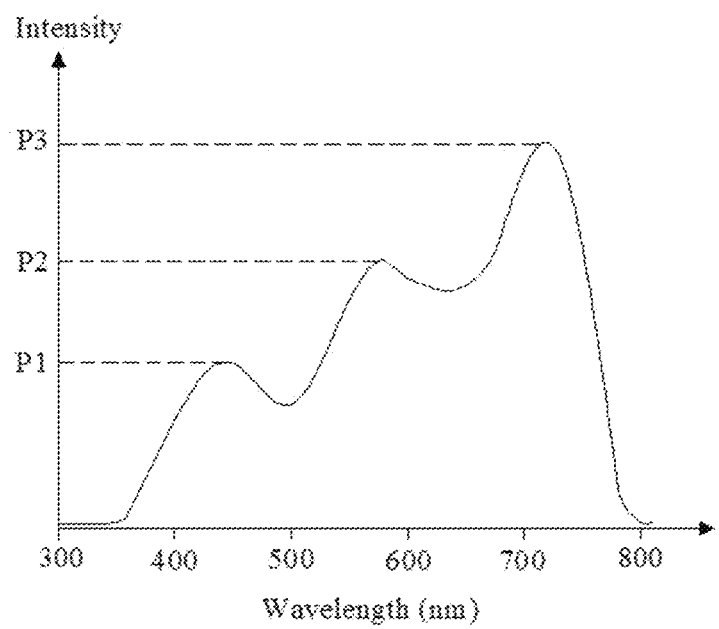
FIG. 12 is a schematic view showing the light emission spectrum of an LED light bulb in accordance with an embodiment of the present invention.
Figure 13:
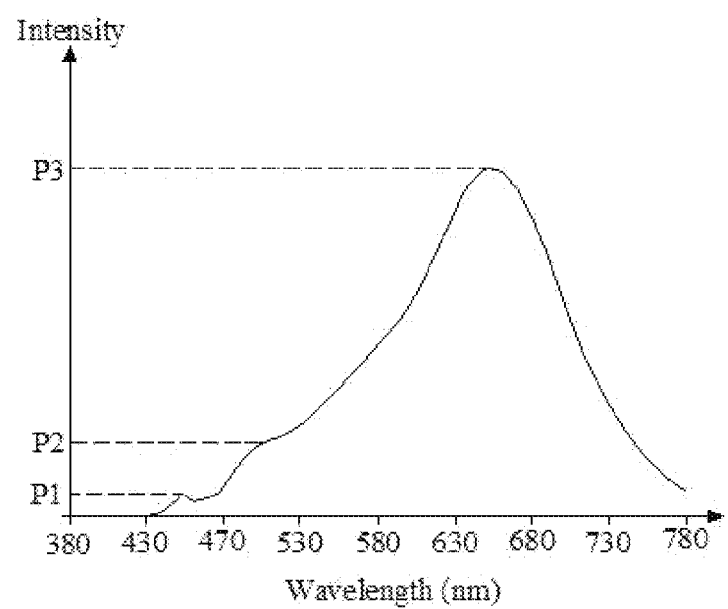
FIG. 13 is a schematic view showing the light emission spectrum of an LED light bulb in accordance with another embodiment of the present invention.

Referring to FIG. 12, which is a schematic diagram of the light emission spectrum of an LED light bulb according to an embodiment of the present invention. In the present embodiment, the LED light bulb may be any of the LED light bulbs disclosed in the previous embodiments, and any one of the LED light bulbs disclosed in the previous embodiments is provided. The light emitted by the LED light bulb is measured by a spectrometer to obtain a spectrum diagram as shown in FIG. 12. From the spectrum diagram, the spectral distribution of the LED light bulb is mainly between the wavelength ranges of about 400 nm to 800 nm. Moreover, there are three peaks of intensity values P1, P2, P3 in wavelength ranges corresponding to the light emitted by the LED light bulb. The wavelength of the intensity value P1 is between about 430 nm and 480 nm, the wavelength of the intensity value P2 is between about 580 nm and 620 nm, and the wavelength of the intensity value P3 is between about 680 nm and 750 nm. The light intensity of the peak P1 is less than that of the peak P2, and the light intensity of the peak P2 is less than the light intensity of the peak P3. As shown in FIG. 12, such a spectral distribution is close to the spectral distribution of a conventional incandescent filament lamp and also close to the spectral distribution of natural light. In accordance with an embodiment of the present invention, a schematic diagram of the light emission spectrum of a single LED filament is shown in FIG. 13. From the spectrum diagram, it can be seen that the spectral distribution of the LED light bulb is mainly between the wavelength range of about 400 nm to 800 nm, and there are three peaks of intensity values P1, P2, P3 in that wavelength range. The wavelength of the intensity value P1 is between about 430 nm and 480 nm, the wavelength of the intensity value P2 is between about 480 nm and 530 nm, and the wavelength of the intensity value peak P3 is between about 630 nm and 680 nm. Such a spectral distribution is close to the spectral distribution of a conventional incandescent filament lamp and also close to the spectral distribution of natural light.

The meaning of the term "a single LED filament" and "a single strip LED filament" as used in the present invention is mainly composed of the aforementioned conductive section, the LED section, the connection between thereof, the light conversion layer (including the consecutive top layer or the bottom layer, with continuous formation to cover or support all the components), and two conductive electrodes electrically connected to the conductive brackets of the LED light bulb disposing at both ends of the LED filament, which is the single LED filament structure referred to in the present invention.

Figure 14A:
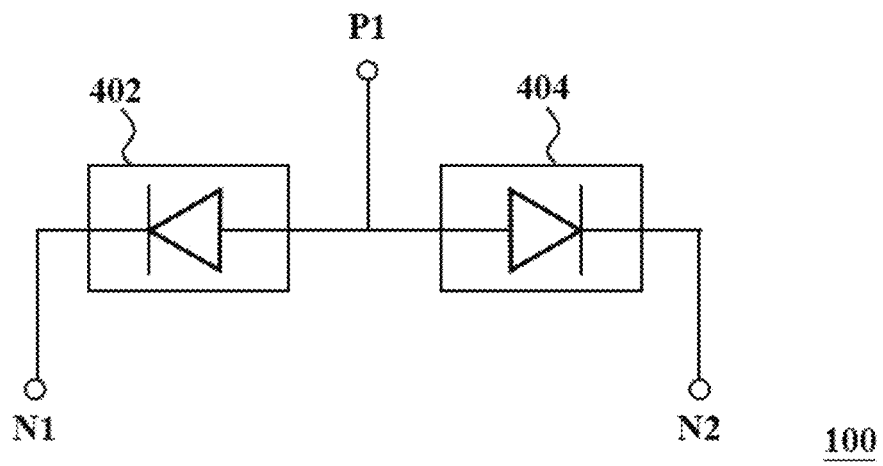
FIGS. 14A to 14C are schematic circuit diagrams of an LED filament in accordance with an embodiment of the present invention.

In some embodiments, LED filament 100 may have multiple LED sections. At least part or all of LED chips on a single LED section are electrically connected in series. Different LED sections are electrically connected in parallel. Anode and cathode of each LED section may serve as a positive electrode and negative electrodes of the LED filament, respectively. The negative electrodes separately connect with two or more of the conductive supports (e.g., conductive supports 51a, 51b in FIG. 9A) and finally connect to a power module (such as power module 518 in FIG. 9A). As shown in FIG. 14A, which is a schematic circuit diagram of the LED filament according to some embodiments of the present invention, LED filament 100 in this embodiment has two LED sections 402, 404. Each LED section 402, 404 includes one or more LED chips. LED chips in a single LED section are electrically connected in series. Two LED sections 402, 404 have respective current paths after they have been electrically electrically connected (i.e. in parallel). In detail, in this embodiment, anodes of LED sections 402, 404 are electrically connected together to serve as a positive electrode P1 of LED filament 100. Cathodes of LED section 402 and 404 serve as a first negative electrode N1 and a second negative electrode N2, respectively. Positive electrode P1, first negative electrode N1 and second negative electrode N2 are separately electrically connected to the power module through conductive supports such as conductive supports 51a, 51b and power module 518 shown in FIG. 9A.

Figure 14B:
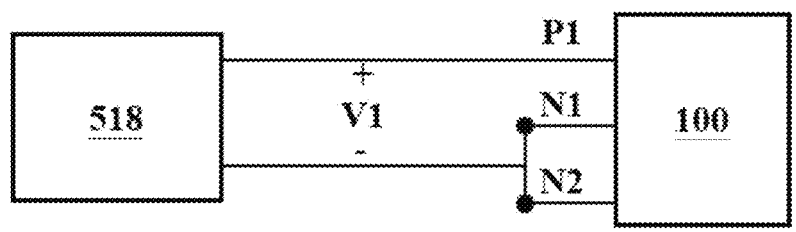
Figure 14C:
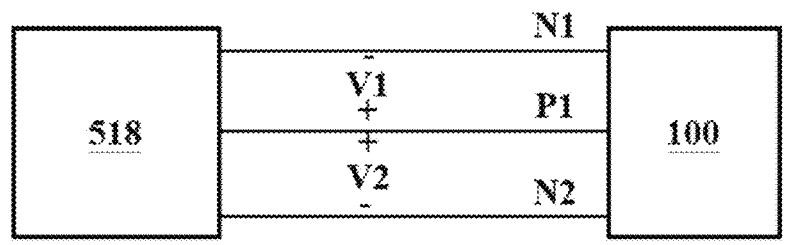

In more detail, the connection relationship between positive electrode P1, first negative electrode N1 and second negative electrode N2 may be shown as FIG. 14B or FIG. 14C, in which FIGS. 14B and 14C are two schematic views of electrical connections of the LED filament according to some embodiments of the present invention. Please refer to FIG. 14B first. In this embodiment, positive electrode P1 of LED filament 100 is electrically electrically connected to a first output terminal (also called "positive output terminal) of power module 518. First and second negative electrodes N1, N2 of LED filament 100 are electrically electrically connected together and then jointly electrically connected to a second output terminal (also called "negative output terminal") of power module 518. Further refer to FIG. 14A, under the electrical relationship shown in FIG. 14B, LED sections 402, 404 can be deemed as being electrically connected to the output terminals of power module 518 in parallel. Thus, all LED sections 402, 404 are driven by driving voltage V1 between the first and second output terminals. Under a precondition of LED sections 402, 404 having identical or similar chips number and arrangement, the driving current from power module 518 will evenly dividedly flow to each of LED sections 402, 404. As a result, LED sections 402, 404 can present approximately even intensity and/or color temperature.

Please further refer to FIG. 14C. In this embodiment, positive electrode P1 of LED filament 100 is electrically connected to the first output terminal of power module 518, first negative electrode N1 of LED filament 100 is electrically connected to the second output terminal (also called "first negative output terminal") of power module 518, and he second negative electrode N2 of LED filament 100 is electrically connected to the third output terminal (also called "second negative output terminal") of power module 518. Driving voltage V1 is formed between the first output terminal and the second output terminal of power module 518, and another driving voltage V2 is formed between the first output terminal and the third output terminal of power module 518. Referring to FIG. 14A together, under the electrical relationship shown in FIG. 14C, LED section 402 is electrically connected between the first output terminal and the second output terminal, and LED section 404 is electrically connected between the first output terminal and the third output terminal. As a result, LED sections 402 and 404 can be deemed as being driven by driving voltages V1, and V2, respectively. In such an arrangement, the driving currents provided by power module 518 to LED sections 402, 404 can be independently controlled by adjusting output voltages V1 and V2, so as to make LED sections 402, 404 separately generate corresponding intensity and/or color temperature. In other words, dimming the different LED sections individually on a single LED filament can be implemented by design and control of the power module based on the arrangement of FIG. 14C.

In some embodiments, the second and third output terminals of power module 518 can be electrically connected together through a resistor, and either of the second and third output terminals of the power module 518 is electrically connected to a ground terminal. By this arrangement, negative output terminals with different levels can be obtained to generate two different driving voltages V1 and V2. In some embodiments, levels of the second and third output terminals can be controlled by a circuit. The present invention is not limited thereto.

Figure 15A:
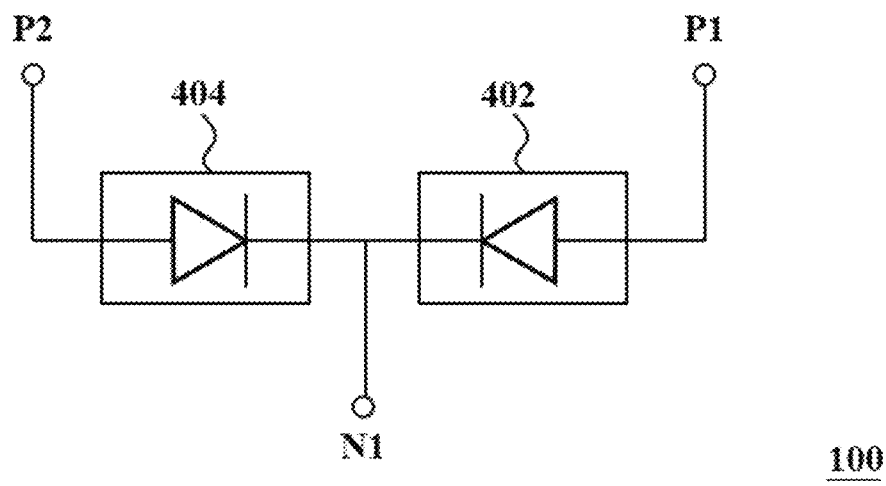
FIGS. 15A to 15C are schematic circuit diagrams of an LED filament in accordance with another embodiment of the present invention.

FIG. 15A is a schematic circuit diagram of the LED filament according to some embodiments of the present invention. In this embodiment, LED filament 100, which is similar to the one shown in FIG. 14A, has two LED sections 402, 404, and thus the details of the LED sections 402, 404 will not be repeated herein. A main difference between this embodiment and the embodiment shown in FIG. 14A is that cathodes of LED sections 402, 404 of this embodiment are electrically connected together to serve as negative electrode N1 of the LED filament, and anodes of LED sections 402, 404 serve as first positive electrode P1 and second positive electrode P2 of LED filament 100, respectively. Negative electrode N1, first positive electrode P1 and second positive electrode P2 of LED filament 100 are electrically connected to the power module through conductive supports, such as conductive supports 51a, 51b and power module 518 shown in FIG. 9A.

Figure 15B:
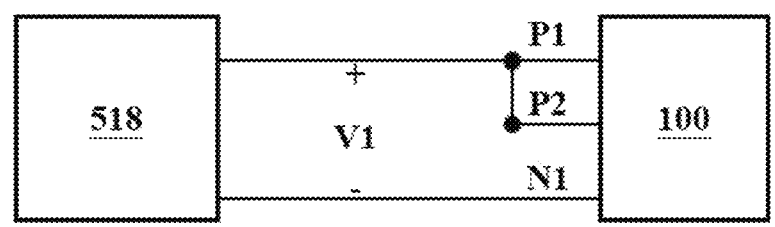
Figure 15C:
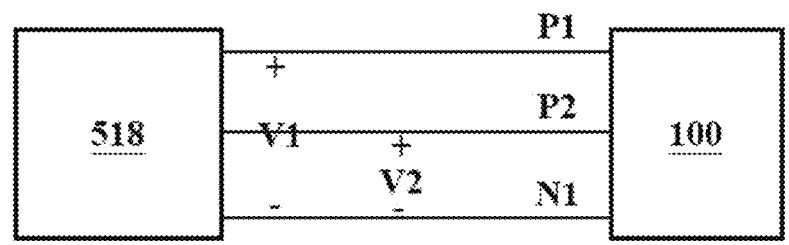

The electrical relationship between negative electrode N1, first positive electrode P1 and second positive electrode P2 of LED filament 100 and the power module may be shown in FIG. 15B or 15C. FIGS. 15B and 15C are two schematic views of electrical connections of the LED filament according to two different embodiments. Please refer to FIG. 15B first. In this embodiment, a first positive electrode P1 and a second positive electrode P2 of LED filament 100 are electrically electrically connected together and jointly electrically connected to a first output terminal (also called "positive output terminal) of power module 518. Negative electrode N1 of LED filament 100 is electrically electrically connected to a second output terminal (also called "negative output terminal") of power module 518. Further refer to FIG. 15A, under the electrical relationship shown in FIG. 15B, LED sections 402, 404 can be deemed as being electrically connected to the output terminals of power module 518 in parallel. Thus, all LED sections 402, 404 are driven by driving voltage V1 between the first and second output terminals. Under a precondition of LED sections 402, 404 having identical or similar chips number and arrangement, the driving current from power module 518 will evenly dividedly flow to each of LED sections 402, 404. As a result, LED sections 402, 404 can present approximately even intensity and/or color temperature. This arrangement is equivalent to that of the embodiment shown in FIG. 14B.

Please further refer to FIG. 15C. In this embodiment, positive electrode P1 of LED filament 100 is electrically connected to the first output terminal of power module 518, second positive electrode P2 of LED filament 100 is electrically connected to the second output terminal (also called "second positive output terminal") of power module 518, and negative electrode N1 of LED filament 100 is electrically connected to the third output terminal (also called "negative output terminal") of power module 518. Driving voltage V1 is formed between the first output terminal and the third output terminal of power module 518, and another driving voltage V2 is formed between the second output terminal and the third output terminal of power module 518. Please further refer to FIG. 15A. Under the electrical relationship shown in FIG. 15C, LED section 402 is electrically connected between the first output terminal and the third output terminal, and LED section 404 is electrically connected between the second output terminal and the third output terminal. As a result, LED sections 402 and 404 can be deemed as being driven by driving voltages V1, and V2, respectively. In such an arrangement, the driving currents provided by power module 518 to LED sections 402, 404 can be independently controlled by adjusting output voltages V2, V2 so as to make LED sections 402, 404 separately generate corresponding intensity and/or color temperature. In other words, in the arrangement of FIG. 15C, a dimming function can be implemented to a single LED filament by design and control of the power module.

The various embodiments of the present invention described above may be arbitrarily combined and transformed without being mutually exclusive, and are not limited to a specific embodiment. For example, some features as described in the embodiment shown in FIG. C although not described in the embodiment shown in FIG. A, those features may be included in the embodiment of FIG. A. That is, those skilled in the art can applies some features of the FIG. A to the embodiment shown in the FIG. C without additional creativity. Or alternatively, although the invention has illustrated various creation schemes by taking the LED light bulb as an example, it is obvious that these designs can be applied to other shapes or types of light bulb without additional creativity, such as LED candle bulbs, and the like.

The invention has been described above in terms of the embodiments, and it should be understood by those skilled in the art that the present invention is not intended to limit the scope of the invention. It should be noted that variations and permutations equivalent to those of the embodiments are intended to be within the scope of the present invention. Therefore, the scope of the invention is defined by the scope of the appended claims.

What is claimed is:
1. An LED light bulb, consisting of:
a lamp housing doped with a golden yellow material and its surface coated with a yellow film;
a bulb base connected to the lamp housing;
a stem connected to the bulb base and located in the lamp housing, the stem comprises a stand extending to the center of the lamp housing;
a single flexible LED filament, disposed in the lamp housing, wherein the flexible LED filament before bending in an xy coordinates are defined as X, Y, where the X-axis is parallel with the length direction of the flexible LED filament, and the flexible LED filament comprising:
a plurality of LED sections, disposed substantially at the same position in the Y direction, each of the LED sections comprising at least one LED chip;
a plurality of conductive sections comprising a conductor, located between the adjacent two LED sections, and the conductor is electrically connected with LED sections through a first wire;
two conductive electrodes, disposed corresponding to the LED sections and electrically connected to the LED sections through a second wire; and
a light conversion layer comprising a top layer and a base layer, coated on at least two sides of the LED chip and the conductive electrodes, and a portion of each of the conductive electrodes is not coated with the light conversion layer, the top layer and the base layer are disposed on the opposing surface of the LED chip, where the top layer have upper surface and lower surface opposite to the upper surface of the top layer, and the lower surface of the top layer is contacted with the base layer;

a plurality of supporting arms, each of the supporting arms comprising a first end and a second end opposite to the first end of the supporting arms, the first end of each of the supporting arms is connected with the stand while the second end of each of the supporting arms is connected with the flexible LED filament;

two conductive supports, disposed in the lamp housing and connected with both the stem and the flexible LED filament; and a driving circuit, electrically connected with two conductive supports;

wherein the base layer of the light conversion layer is formed from organosilicon-modified polyimide resin composition comprising an organosilicon-modified polyimide and a thermal curing agent, wherein the organosilicon-modified polyimide comprises a repeating unit represented by the following general Formula (I):

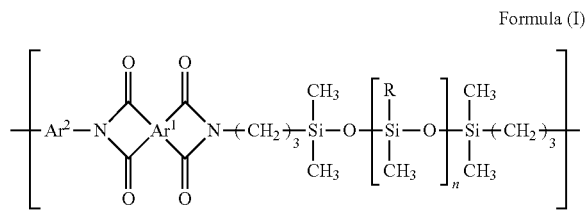

Formula (I)

wherein $Ar^1$ is a tetra-valent organic group having a benzene ring or an alicyclic hydrocarbon structure, $Ar^2$ is a di-valent organic group having a monocyclic alicyclic hydrocarbon structure, R is each independently methyl or phenyl, n is 1~5;

wherein the organosilicon-modified polyimide has a number average molecular weight of 5000~100000;

wherein the thermal curing agent is selected from the group consisting of epoxy resin, isocyanate and bisoxazoline compounds; and wherein a spectral distribution of the light bulb is between wavelength range of about 400 nm to 800 nm, and three peak wavelengths P1, P2, P3 are appeared in the wavelength ranges corresponding to light emitted by the light bulb, the wavelength of the peak P1 is between 430 nm and 480 nm, the wavelength of the peak P2 is between 580 nm and 620 nm, and the wavelength of the peak P3 is between 680 nm and 750 nm, and wherein a light intensity of the peak P1 is less than that of the peak P2, and the light intensity of the peak P2 is less than that of the peak P3.

2. The LED light bulb according to claim 1, wherein the first wire is perpendicular to the X direction.

3. The LED light bulb according to claim 2, wherein the second wire is parallel with the X direction.

4. The LED light bulb according to claim 3, wherein the shape of the conductors is Z-shape.

5. The LED light bulb according to claim 4, wherein the circumferential surface of a semicircle centered on a point located on the light emitting surface of the LED chips substantially overlaps with the upper surface of the top layer.

6. The LED light bulb according to claim 5, wherein the light emitted by the LED chip passes through the interfaces A, B, C, D, E and F respectively in the light bulb, where the interface A is the interface between p-GaN gate of the LED chip and the top layer of the light conversion layer, the interface B is the interface between the top layer of the light conversion layer and the gas in the bulb shell, the interface C is the interface between Base of the LED chip and paste adjacent to the base layer of the light conversion layer, the interface D is the interface between the paste and the base layer of the light conversion layer, the interface E is the interface between the base layer of the light conversion layer and the gas in the bulb shell, and the interface F is the interface between the base layer of the light conversion layer and the top layer of the light conversion layer, and the absolute value of the refractive index difference between the two substances in any interface is less than 1.0.

7. The LED light bulb according to claim 6, wherein the absolute value of the refractive index difference between the two substances in any one of the two interfaces of D and F is less than 0.5.

8. The LED light bulb according to claim 7, wherein the absolute value of the refractive index difference between the two substances in any one of the two interfaces of D and F is less than 0.2.

9. The LED light bulb according to claim 8, wherein $Ar^1$ is a tetra-valent organic group having a monocyclic alicyclic hydrocarbon structure or a bridged-ring alicyclic hydrocarbon structure.

10. The LED light bulb according to claim 9, wherein $Ar^2$ is a di-valent organic group comprising a functional group having active hydrogen, where the functional group having active hydrogen is any one of hydroxyl, amino, carboxy and mercapto.

11. The LED light bulb according to claim 10, wherein $Ar^1$ is derived from a dianhydride, and $Ar^2$ is derived from a diamine.

12. The LED light bulb according to claim 11, wherein the organosilicon-modified polyimide resin composition further comprises an additive selected from the group consisting of fluorescent powders, heat dispersing particles and a coupling agent.

13. The LED light bulb according to claim 12, wherein the base layer comprise an upper surface where the LED chips is positioned on and a lower surface opposite to the upper surface of the base layer, the lower surface of the base layer has a third area and a fourth area, where the surface roughness of the third area of the lower surface is higher than that of the fourth area with a cell.

14. The LED light bulb according to claim 13, wherein the surface roughness of the upper surface of the base layer is equal to the fourth area of the lower surface.

15. The LED light bulb according to claim 14, wherein the organosilicon-modified polyimide is full aliphatic organosilicon-modified polyimide and the thermal curing agent is BPA, when the amount of the BPA is 4~12% of the weight of the organosilicon-modified polyimide, the light transmittance of the full aliphatic organosilicon-modified polyimide at wavelengths 380 nm, 410 nm and 450 nm is respectively 86.2%~87.3%, 88.4%~88.9% and 89.7%~90.5%.

16. The LED light bulb according to claim 15, wherein the amount of the thermal curing agent is 5~12% of the weight of the organosilicon-modified polyimide.

17. The LED light bulb according to claim 16, wherein points of the flexible LED filament in an xyz coordinates are defined as X, Y, and Z, an x-y plane of the xyz coordinates is perpendicular to the height direction of the light bulb, a z-axis of xyz coordinates is parallel with the stem, where the conductive sections comprising three first conductive sections and four second conductive section, the height of the two LED sections is between the first conductive section and the second conductive section in the Z direction.

18. The LED light bulb according to claim 17, wherein the height of the three first conductive sections is greater than the height of the four second conductive sections in the Z direction.

19. The LED light bulb according to claim 18, wherein the height of the conductive electrodes is substantially equal to the height of the second conductive section in the Z direction.

20. The LED light bulb according to claim 19, wherein all the projections of the first and second conductive sections are located in one side of a straight line connecting between the conductive electrodes on the XY plane.

* * * * *